(12) United States Patent
Yamamoto et al.

(10) Patent No.: US 7,258,912 B2
(45) Date of Patent: Aug. 21, 2007

(54) HARD LAMINATED FILM, METHOD OF MANUFACTURING THE SAME AND FILM-FORMING DEVICE

(75) Inventors: Kenji Yamamoto, Kobe (JP); Susumu Kujime, Takasago (JP); Kazuki Takahara, Takasago (JP); Hirofumi Fujii, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 11/045,137

(22) Filed: Jan. 31, 2005

(65) Prior Publication Data

US 2005/0170162 A1    Aug. 4, 2005

(30) Foreign Application Priority Data

| Feb. 2, 2004 | (JP) | ............................. 2004-025710 |
| Feb. 2, 2004 | (JP) | ............................. 2004-025711 |
| Feb. 12, 2004 | (JP) | ............................. 2004-035474 |
| Mar. 11, 2004 | (JP) | ............................. 2004-069117 |
| Mar. 11, 2004 | (JP) | ............................. 2004-069118 |

(51) Int. Cl.
*B23B 27/14* (2006.01)

(52) U.S. Cl. ...................... 428/216; 428/212; 428/697; 428/698; 428/699; 428/704

(58) Field of Classification Search ................ 428/212, 428/697, 698, 699, 704, 469, 472, 216
See application file for complete search history.

(56) References Cited

U.S. PATENT DOCUMENTS 4,556,607 A    12/1985    Sastri (Continued)

FOREIGN PATENT DOCUMENTS

DE    102 33 222 A 1    2/2003

(Continued)

OTHER PUBLICATIONS

Kwang Ho Kim, et al. "Superhard Ti-Si-N coatings by a hybrid system of arc ion plating and sputtering techniques", Surface and Coatings Technology 298, 2002, pp. 243-248.

Primary Examiner—Archene Turner
(74) Attorney, Agent, or Firm—Oblon, Spivak, McClelland, Maier & Neustadt, P.C.

(57) ABSTRACT

A hard laminated film wherein a layer A and a layer B having specific compositions are deposited alternately so that the compositions of layer A and layer B are different. The thickness of layer A per layer is twice or more the thickness of layer B per layer, the thickness of layer B per layer is 0.5 nm or more, and the thickness of layer A per layer is 200 nm or less.

Layer A has a cubic rock-salt crystal structure such as that of Ti, Cr, Al, V nitride, carbonitride or carbide, and layer B is a hard film having a crystal structure other than cubic such as that of BN, BCN, SiN, SiC, SiCN, B—C, Cu, CuN, CuCN or metallic Cu. Alternatively, layer A has a chemical composition satisfying the following formula (1), and layer B has a chemical composition satisfying the following formula (2).

Layer A: $Cr(B_aC_bN_{1-a-b-c}O_c)$ $$0 \leq a \leq 0.15,\ 0 \leq b \leq 0.3,\ 0 \leq c \leq 0.1,\ 0.2 \leq e \leq 1.1 \quad (1)$$

Layer B: $B_{1-s-t}C_sN_t$ $$0 \leq s\ 0.25,\ (1-s-t)/t \leq 1.5 \quad (2)$$

Alternatively, Layer A has a specific atomic ratio composition of $(Ti_{1-x-y}Al_xM_y)(B_aC_bN_{1-a-b-c}O_c)$ and Layer B has one or more specific atomic ratio compositions selected from among the compositions $B_{1-x-y}C_xN_y$, $Si_{1-x-y}C_xN_y$, $C_{1-x}N_x$, $Cu_{1-y}(C_xN_{1-x})_y$. Alternatively, Layer A has one of the following Compositional Formulae 1 or 2. Formula 1: $(Ti_{1-x-y}Al_xM_y)$, $(B_aC_bN_{1-a-b-c}O_c)$, Formula 2: $(Cr_{1-\alpha}X\alpha)(B_aC_bN_{1-a-b-c}O_c)_e$ (X is one or more metal elements selected from among Ti, Zr, Hf, V, Nb, Ta, Mo, W, Al, Si. Layer B has the following compositional formula 3. Formula 3: $M(B_aC_bN_{1-a-b-c}O_c)$. M is one or more metal elements selected from among W, Mo, V, Nb.

10 Claims, 12 Drawing Sheets

U.S. PATENT DOCUMENTS

| | | |
|---|---|---|
| 5,234,561 A | 8/1993 | Randhawa et al. |
| 5,318,840 A | 6/1994 | Ikeda et al. |
| 5,503,912 A | 4/1996 | Setoyama et al. |
| 5,580,653 A | 12/1996 | Tanaka et al. |
| 5,700,551 A * | 12/1997 | Kukino et al. ............... 428/212 |
| 5,882,777 A * | 3/1999 | Kukino et al. ............... 428/216 |
| 6,232,003 B1 | 5/2001 | Ogawa et al. |
| 6,309,738 B1 * | 10/2001 | Sakurai ....................... 428/216 |
| 6,586,122 B2 | 7/2003 | Ishikawa et al. |
| 6,767,658 B2 | 7/2004 | Yamamoto et al. |
| 6,824,601 B2 * | 11/2004 | Yamamoto et al. ......... 428/698 |
| 2002/0168552 A1 | 11/2002 | Yamamoto et al. |

FOREIGN PATENT DOCUMENTS

| | | |
|---|---|---|
| EP | 0 403 552 B1 | 12/1990 |
| JP | 2004-11018 | 1/2004 |
| KR | 0157995 | 1/1999 |
| WO | WO90/02216 | 8/1990 |

* cited by examiner

LAYER B
LAYER A

BRIGHT FIELD IMAGE ×45,000

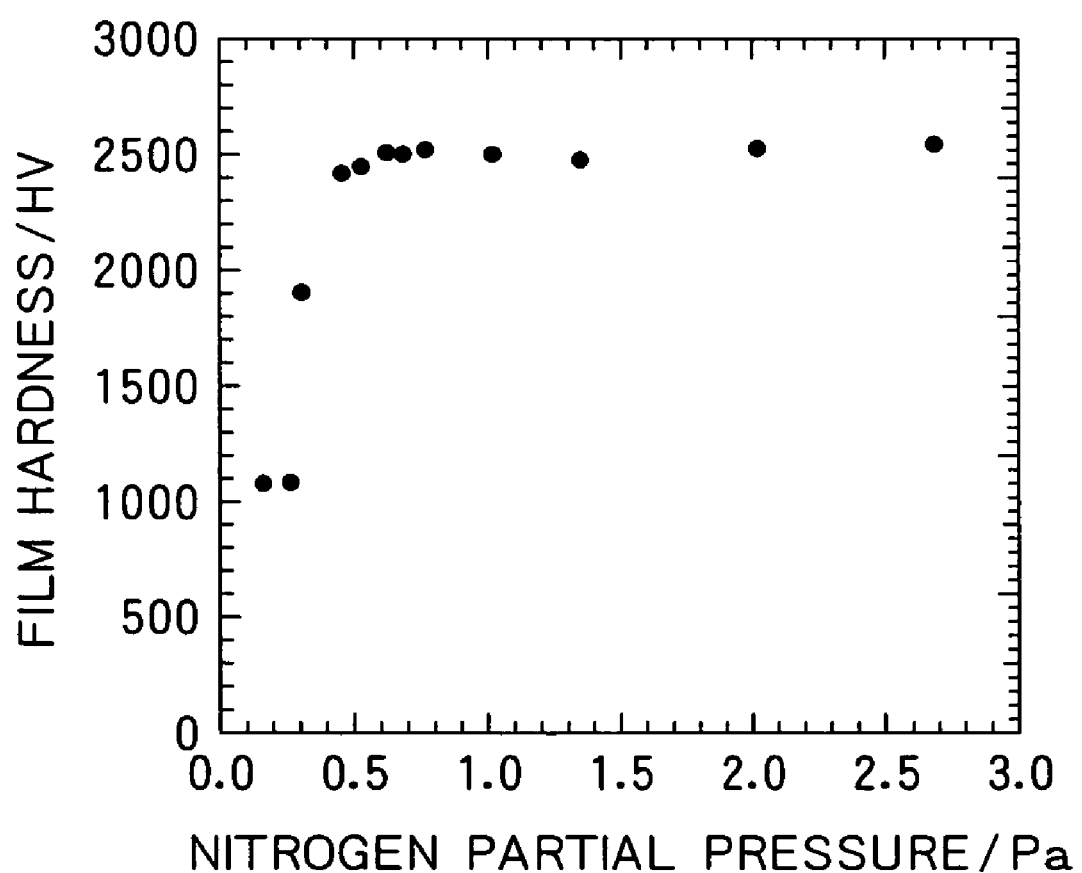

HARD LAMINATED FILM, METHOD OF MANUFACTURING THE SAME AND FILM-FORMING DEVICE

BACKGROUND OF THE INVENTION

This invention relates to a hard laminated film whereof the crystal particle size is finely controlled having superior mechanical resistance, to a hard laminated film having wear resistance formed on the surface of machining tools or sliding parts for automobiles, and to a hard laminated film having superior wear resistance and anti-oxidation properties.

This invention further relates to a composite film-forming device comprising an arc vaporization source and a sputter vaporization source which can form this hard laminated film having superior properties.

In recent years, there has been an increasing need to improve the wear resistance of super hard alloys, cutting tools having thermit or high-speed tool steel as base materials and sliding parts for automobiles, and the possibility of improving the wear resistant film used on the surface of these parts is being considered.

The wear resistant film used in the prior art comprises a hard film such as TiAlN, which is a composite nitride film of TiN or TiCN, Ti and Al, coated on this base material (part).

To attempt to improve the wear resistance of this wear-resistant film, a third element was generally added in order to increase the fineness of the crystal particles of the film and improve its properties. For example, in the case of cutting tools, it has been reported that the addition of Si or B to a TiAlN film improves wear resistance and increases hardness by increasing the fineness of crystal particles (U.S. Pat. No. 5,580,653 and U.S. Pat. No. 5,318,840). Also, it has been proposed to add B to the CrN film used in sliding parts such as the piston ring of an automobile to improve wear resistance by increasing hardness (U.S. Pat. No. 6,232,003).

Regarding addition of elements to hard films in the prior art, there is also an example of an attempt to improve properties such as hardness by adding Si by sputtering while forming a TiN film by an arc vaporization source in a device provided with both an arc and sputter vaporization source so as to form a TiSiN film (K. H. Kim et al, Surf. Coat. Technol. 298(2002) pp. 243-244,247).

In these methods for increasing the fineness of crystal particles of a wear-resistant film by adding other elements, the fineness of the crystal particles is determined by the addition amount of the element, and the film particle size can be controlled only by varying the addition amount of the element. Therefore, to manufacture films having different particle sizes, plural targets having varying element addition amounts must be produced. However, it is extremely difficult to manufacture a sample having exactly the right particle size for a particular purpose, i.e., to manufacture a film having properties designed for a particular purpose, and there are practical problems involved.

Hard films with superior hardness and wear resistance having an essentially rock-salt crystal structure have also been proposed for use in cutting tools (U.S. Pat. No. 6,767,658, U.S. Pat. No. 2002-168552). These hard film compositions are, for example, $(Ti_a, Al_b, V_c)(C_{1-d}N_d)$, wherein, $0.02 \leq a \leq 0.3$, $0.5 < b \leq 0.8$, $0.05 < c$, $0.7 \leq b+c$, $a+b+c=1$, $0.5 \leq d \leq 1$ (a, b, c are respectively the atomic ratios of Ti, Al, V, and d is the atomic ratio of N).

In general, hard films having a rock-salt structure can be measured by X-ray diffraction by the $\theta$–$2\theta$ method. For example, hard films such as ((TiAlV) (CN) have a rock-salt crystal structure, and form a composite nitride having a rock-salt structure in which Al and V replace the Ti and TiN sites in the rock-salt. In this case, the AlN in the rock-salt structure (grating constant 4.12 Å) is a high temperature, high pressure phase and a very hard substance, and if the ratio of Al in (CN)(TiAlV) is increased while maintaining the rock-salt structure, the hardness of the (TiAlV)(CN) film can be further increased.

To form a multi-layer hard film of this type, there are an devices and methods which can combine plural arc vaporization sources and sputter vaporization sources or electron beam vaporization sources to form different hard film layers on a substrate depending on the hard materials used.

Among these, a device which combines plural arc vaporization sources and sputter vaporization sources to sequentially form hard film layers on the substrate is said to have a high film-forming efficiency from the viewpoint that the film can be formed by making use of the different properties of an arc vaporization source and sputter vaporization source.

For example, concerning the relative properties of an arc vaporization source and a sputter vaporization source, the arc vaporization source forms a film more rapidly than a sputter vaporization source, but it is difficult to adjust the film-forming rate, and difficult to precisely control the thickness of the thin film layer which is formed. On the other hand, the sputter vaporization source forms a film more slowly than an arc vaporization source, but the film-forming rate can be easily adjusted, and as it can be operated even with a very extremely small input power, the thickness of the thin film which is formed can be precisely controlled.

Consequently, by using an arc vaporization source for relatively thick film layers and a sputter vaporization source for relatively thin film layers, the thickness of each film layer can be easily controlled, and the overall film-forming rate can be accelerated.

A composite film-forming device is known in the art wherein plural arc vaporization sources and sputter vaporization sources are combined in the same film-forming chamber.

For example, a method to form a hard film has been proposed wherein the arc vaporization source and sputter vaporization source are operated alternately. First, metal ion etching is performed by the arc vaporization source, then the arc vaporization source is stopped, a process gas is introduced, and the sputter vaporization source is operated (U.S. Pat. No. 5,234,561).

A device has also been proposed which combines a magnetic field applying mechanism with an arc vaporization source and sputter vaporization source (European Patent No. 0403552, U.S. Pat. No. 6,232,003). In FIG. 7 of U.S. Pat. No. 6,232,003, one of the prior art techniques which does not have a magnetic field applying mechanism, the magnetic fields of the arc vaporization source and sputter vaporization source mutually interfere with each other.

It is also known in the art that the arc vaporization source and sputter vaporization source can be operated simultaneously to form a hard film, and when a third element is added to the film, the fineness of the crystal particles of the film increases which improves wear resistance and other properties. For example, a method has been proposed wherein Si or B is added to a TiN film or a TiAlN film for cutting tools which improves wear resistance, and increases hardness due to the finer crystal particles (U.S. Pat. No. 5,580,653, U.S. Pat. No. 5,318,840, K. H. Kim et al, Surf. Coat. Technol. 298(2002) pp. 243-244, 247). A method has also been proposed wherein B is added to a CrN film used in sliding parts such as the piston ring of automobiles to improve wear resistance by increasing hardness (U.S. Pat. No. 6,232,003).

Even in a hard film having mainly a halide crystal structure, depending on the film-forming conditions, if the crystal particle size (hereafter, referred to also as crystal size) of the halide hard film is coarse, there is a limit to the improvement of wear resistance which can be obtained by increased hardness.

In the aforesaid prior art, a specific element was uniformly added during film-forming in every case, and a single layer film having a single chemical composition was thereby formed. The film formed in this way does have increased hardness and improved wear resistance due to the finer crystal particles forming the film, but if the frictional coefficient of the film surface was not sufficiently reduced, there was little improvement of wear resistance and lubricity, and due to the increased hardness, the film was more liable to damage other members, hence, further improvement was desired.

Moreover, hard films formed by these prior art methods and techniques did not have sufficient performance to satisfy the increasingly stringent demands of cutting tools and sliding parts, so enhanced wear resistance and better durability were required.

For example, if an element such as B or Si is added to the aforesaid wear-resistant film so as to increase the fineness of the crystal particles, the fineness is determined by the element addition amount, and the film particle size can be controlled only by varying the addition amount. Therefore, to manufacture films of different particle sizes, plural targets with varying element addition amounts must be prepared. It is thus very inconvenient to produce a sample having a specific particle size for a particular purpose, i.e., a film having properties designed for a particular purpose, and there is therefore a practical limit to the wear resistance enhancement of the hard film which can be obtained.

In the case of the aforesaid device, if an arc vaporization source and sputter vaporization source were operated in the same film-forming chamber, even if the arc vaporization source and sputter vaporization source were operated alternately, various problems could not be avoided, e.g., it was sometimes difficult to form a fine hard film or hard film having the desired composition depending on the hard film material and film-forming conditions, and abnormal electrical discharges sometimes occurred during the film-forming process. Consequently, there was also a limit to the wear resistance enhancement which could be obtained by increasing the hardness of the film.

For example, when forming hard nitride films such as TiN, TiCN or TiAlN, film-forming is performed in a mixed gas atmosphere of Ar and nitrogen to form the nitride. However, in the same film-forming chamber, electrons discharged from the arc vaporization source or sputter vaporization source tend to be easily attracted to the chamber walls which act as an anode in the same way as the substrate. As a result, the concentration of discharged electrons becomes sparser, collisions with the sputter gas or reactive gas decrease, and it is difficult to perform high efficiency gas ionization.

Further, in a sputter vaporization source, an inert sputter gas such as Ar (argon), Ne (neon) or Xe (xenon) is used whereas in an arc vaporization source, a reactive gas (reaction gas) such as nitrogen, methane or acetylene is used. Consequently, if arc film-forming and sputter film-forming are simultaneously performed in the same film-forming chamber, and particularly when the partial pressure of the reactive gas such as nitrogen is increased in order to improve film-forming performance, the sputter target material may react with the reaction gas depending on the sputter vaporization source material used so as to produce an insulator (insulating substance) on the target material surface. Due to this insulator, there is a high probability of an abnormal discharge (arcing) occurring in the sputter vaporization source. This also interferes with high efficiency gas ionization.

If there is interference with high efficiency gas ionization, ionic irradiation to the substrate cannot be intensified, so the fineness of the hard film layer cannot be increased, the surface becomes coarser and surface properties decline. As a result, in the prior art film-forming device, and particularly when an arc vaporization source and sputter vaporization source were operated simultaneously in the same film-forming chamber, there was a serious limitation to the enhancement of properties and performance which can be achieved by increasing film hardness.

It is therefore an object of this invention, which was conceived in view of the above problems, to provide a hard film with improved properties such as wear resistance, a hard film having superior wear resistance and lubricity to those of prior art hard films, and a hard laminated film with superior wear resistance and anti-oxidation properties by increasing the fineness of the crystal particles of a rock-salt hard film. Further, it is an object of this invention to provide a composite film-forming device and sputter vaporization source which permits a hard film having desired properties to be obtained without any problems in the film-forming process when an arc vaporization source and sputter vaporization source are operated simultaneously in the same film-forming chamber.

SUMMARY OF THE INVENTION

To achieve the aforesaid objects, the hard laminated film of the present invention comprises a layer A and a layer B of specific compositions deposited alternately, wherein the crystal structure of layer A differs from the crystal structure of layer B, the thickness of layer A per layer is two or more times that of layer B per layer, the thickness of layer B per layer is 0.5 nm or more, and the thickness of layer A per layer is 200 nm or less.

The hard laminated film of a first aspect is a fine crystalline hard film having a laminated film structure wherein a hard film layer A having a cubic rock-salt structure, and a hard film layer B having a crystal structure other than a cubic rock-salt structure, are deposited alternately.

In the first aspect, as described above, the crystal particle size of the hard film A having a cubic rock-salt crystal structure as the main phase is simply, easily and finely controlled by adopting a laminated structure wherein two layers having mutually different crystal structures are combined together.

Specifically, when the hard film layer A having a cubic rock-salt crystal structure and the hard film layer B having a crystal structure which does not have a cubic rock-salt structure are alternately and sequentially deposited (laminated) to form a film, the crystal growth of the hard film layer A which lies underneath this hard film layer B is temporarily stopped. When the hard film layer A is next deposited (laminated) on the film, new crystal growth of the hard film layer A is started above the hard film layer B. Therefore, the crystal particle size of the hard film layer A can be finely controlled.

On the other hand, if the film is formed by depositing only the hard film layer A without providing the hard film layer B, or if the film is formed by depositing hard film layers A having identical cubic rock-salt crystal structures even if they have different components, the crystal growth of the hard film layer A continues without interruption. As a result, the crystal particle size tends to be coarse.

According to the first aspect, by increasing the fineness of the crystal particles of the hard film layer A, superior properties which could not be obtained in prior art hard films, such as increased hardness and wear resistance of the hard film, can be obtained.

In a second aspect, in the hard laminated film having the aforesaid structure, the compositions of layer A and layer B are respectively the following:

Layer A: $(Cr_{1-\alpha}X_\alpha)(B_aC_bN_{1-a-b-c}O_c)_e$ wherein, X is one, two or more elements selected from a group comprising Ti, Zr, Hf, V, Nb, Ta, Mo, W, Al and Si; $0 \leq \alpha \leq 0.9$, $0 \leq a \leq 0.15$, $0 \leq b \leq 0.3$, $0 \leq c \leq 0.1$, $0.2 \leq e \leq 1.1$ ($\alpha$ is the atomic ratio of X, and a, b, c are the atomic ratios of B, C, O respectively, hereafter idem).

Layer B: $B_{1-s-t}C_sN_t$ wherein, $0 \leq s \leq 0.25$, $(1-s-t)/t \leq 1.5$ (s, t are respectively the atomic ratios of C and N, hereafter, idem).

or, $Si_{1-x-y}C_xN_y$ wherein, $0 \leq x \leq 0.25$, $0.5 \leq (1-x-y)/y \leq 1.4$ (x, y are respectively the atomic ratios of C and N, hereafter idem).

or, $C_{1-u}N_u$ wherein, $0 \leq u \leq 0.6$ (u is the atomic ratio of N, hereafter idem).

According to the second aspect, $\alpha$ may be 0.

According to the second aspect, $\alpha$ may be 0.05 or more.

According to the second aspect, layer A has a rock-salt cubic structure, and at least one of the half-value widths of the diffraction lines from the (111) plane and the (200) plane observed by an X-ray diffraction pattern obtained by the θ-2θ method using the CuKα line, may be 0.3° or more.

According to the second aspect, a hard film having superior wear resistance and lubricity to prior art hard films, and a method of manufacturing the same, can be provided by alternately depositing the hard film layer A and layer B having lubricity on the substrate surface, and controlling the growth of the crystal particles forming the layer A to increase their fineness.

In a third aspect, in the hard laminated film having the aforesaid composition, layer A has a composition corresponding to Formula 1:

$(Ti_{1-x-y}Al_xM_y)(B_aC_bN_{1-a-b-c}O_c)$ [wherein x, y, a, b, c are respectively atomic ratios, $0.4 \leq x \leq 0.8$, $0 \leq y \leq 0.6$, $0 \leq a \leq 0.15$, $0 \leq b \leq 0.3$, $0 \leq c \leq 0.1$, and M is one or more metal elements selected from among 4A, 5A, 6A and Si], and layer B has a composition corresponding to one of:

Formula 2: $B_{1-x-y}C_xN_y$ [wherein x, y are respectively atomic ratios, $0 \leq x \leq 0.25$ and $B/N \leq 1.5$], Formula 3: $Si_{1-x-y}C_xN_y$ [wherein x, y are respectively atomic ratios, $0 \leq x \leq 0.25$ and $0.5 \leq Si/N \leq 2.0$], Formula 4: $C_{1-x}N_x$ [wherein, x is an atomic ratio and $0 \leq x \leq 0.6$], Formula 5: $Cu_{1-y}(C_xN_{1-x})y$ [wherein x, y are respectively atomic ratios, $0 \leq x \leq 0.1$ and $0 \leq y \leq 0.5$].

According to the third aspect, the hard film has a laminated structure wherein layer A and layer B having specific compositions are combined and deposited alternately so that the compositions of adjacent layers are mutually different, as described above.

Moreover, in these layers which are deposited alternately, layer A has a specific composition of the (TiAlM)(BCNO) type, and layer B has a specific composition selected from one of a (BCN) type, (SiCN) type, (CN) type and Cu(CN) type.

Due to this, compared with for example a hard film having a single composition such as that of layer A or a hard laminated film comprising only layer A, wear resistance and oxidation resistance are largely improved.

In a fourth aspect, the hard laminated film has the aforesaid construction wherein layer A has a composition corresponding to one of the following formulae:

$$(Ti_{1-x-y}Al_xM_y)(B_aC_bN_{1-a-b-c}O_c) \qquad \text{Formula 1}$$

[wherein, x, y, a, b, c are respectively atomic ratios, $0.4 \leq x \leq 0.8$, $0 \leq y \leq 0.6$, $0 \leq a \leq 0.15$, $0 \leq b \leq 0.3$, $0 \leq c \leq 0.1$, and M is one or metal elements selected from among 4A, 5A, 6A and Si.

$$(Cr_{1-\alpha}X_\alpha)(B_aC_bN_{1-a-b-c}O_c)e \qquad \text{Formula 2}$$

[wherein, $\alpha$, a, b, c, e are respectively atomic ratios, $0 \leq \alpha \leq 0.9$, $0 \leq a \leq 0.15$, $0 \leq b \leq 0.3$, $0 \leq c \leq 0.1$, $0.2 \leq e \leq 1.1$, and X is one or metal elements selected from among Ti, Zr, Hf, V, Nb, Ta, Mo, W, Al, Si, and layer B has a composition corresponding to the following Formula 3:

$$M_{1-d}M1_d(B_aC_bN_{1-a-b-c}O_c) \qquad \text{Formula 3}$$

[wherein, M is one or more metal elements selected from among W, Mo, V and Nb; M1 is one or metal elements selected from among 4A, 5A, 6A, Si excluding W, Mo, V and Nb; a, b, c, d are respectively atomic ratios, and $0 \leq a \leq 0.15$, $0 \leq b \leq 0.3$, $0 \leq c \leq 0.1$, $0 \leq d \leq 0.3$].

According to the fourth aspect, compared with for example a hard film having a single composition such as that of layer A or a hard laminated film comprising only layer A, wear resistance and oxidation resistance are largely improved.

A suitable method of forming the hard laminated film of the first-fourth aspects is to form this fine crystalline film using a film-forming device comprising one or more each of an arc vaporization source comprising a magnetic field applying mechanism and a sputter vaporization source, wherein the constituent components of the hard film layer A are vaporized by the arc vaporization source and the constituent components of the hard film layer B are vaporized by the sputter vaporization source so that the hard film layers A, B are sequentially deposited alternately on the substrate.

To achieve the aforesaid objects, a composite film-forming device of a fifth aspect is a film-forming device comprising one or more each of an arc vaporization source having a magnetic field applying mechanism and a sputter vaporization source inside the same film-forming chamber, having a means for sequentially displacing the substrate on which a film is to be formed between the arc vaporization source and sputter vaporization source, the magnetic field applying mechanism being configured so that the magnetic force lines of the adjacent vaporization sources mutually interconnect.

To achieve the aforesaid object, the composite film-forming device of the present invention comprises one or more each of an arc vaporization source comprising a magnetic field applying mechanism and a sputter vaporization source inside the same film-forming chamber, having a means for sequentially displacing the substrate on which a film is to be formed between the arc vaporization source and sputter vaporization source, wherein a sputter gas is introduced in the vicinity of the sputter vaporization source and a reaction gas is introduced in the vicinity of the arc vaporization source during the film-forming process.

Further, to achieve this object, the sputter vaporization source of a sixth aspect is a sputter vaporization source used in the aforesaid composite film-forming device, wherein a material which is an electrical insulator is used outside an erosion area.

Likewise, in another variation of the sputter vaporization source according to the sixth aspect, the sputter vaporization source used in the composite film-forming device has a shield which is at a floating potential or ground potential relative to the potential of the sputter target outside the erosion area.

In the composite film-forming device according to the fifth aspect, the magnetic field applying mechanism is provided so that the magnetic force lines of the adjacent vaporization sources interconnect during the film-forming process, as described above.

Consequently, the magnetic force lines inside the same film-forming chamber are closed (closed magnetic field construction), and as described later, electrons discharged from the vaporization sources are trapped by this closed magnetic field so they are not easily attracted by the chamber which is an anode like the substrate. Thus, even if arc film-forming and sputter film-forming are simultaneously performed in the same film-forming chamber, the concentration of discharged electrons increases, collisions between the sputter gas and reactive gas increase, and high efficiency gas ionization can take place.

In the composite film-forming device according to the fifth aspect, an additional feature is that the sputter gas is introduced in the vicinity of the sputter vaporization source and the reaction gas is introduced in the vicinity of the arc vaporization source during the film-forming process. Consequently, when arc film-forming and sputter film-forming.

Are simultaneously performed in the same film-forming chamber, and particularly even when the partial pressure of the reactive gas such as nitrogen is increased during film-forming to enhance film-forming performance, problems such as the difficulty of mixing the reaction gas such as nitrogen with the sputter gas, the formation of an insulating film on the target surface due to the ionized gas mixture and abnormal electrical discharge are suppressed. Therefore, high efficiency gas ionization can be performed.

In the various embodiments or combined embodiments of the fifth aspect and sixth aspect, ion irradiation to the substrate is intensified by promoting high efficiency gas ionization, and properties are enhanced due to the increased hardness resulting from the fineness of the hard film layer. Further, abnormal events during film-forming such as abnormal electrical discharge can be suppressed.

Further, in the aforesaid two variations of the sputter vaporization source according to the sixth aspect, a voltage is prevented from acting on the non-erosion area of the sputter vaporization source, so particles which have been sputtered from the erosion area react and combine with the reaction gas such as nitrogen in the non-erosion area and do not deposit. As a result, abnormal electrical discharge due to this factor is prevented, and high efficiency gas ionization takes place.

Other and further objects, features and advantages of the invention will appear more fully from the following description.

BRIEF DESCRIPTION OF THE DRAWINGS

FIG. 12 is a descriptive diagram showing a relation between a nitrogen partial pressure and a Vickers hardness of a hard film.

DETAILED DESCRIPTION OF THE PREFERRED EMBODIMENTS

Some embodiments of this invention will now be described referring to hard film requirements.

First, a technique for controlling particle size which is common to the first-third embodiments will be described.

(Control of Crystal Particle Size of Hard Film Layer A)

Figure 2:
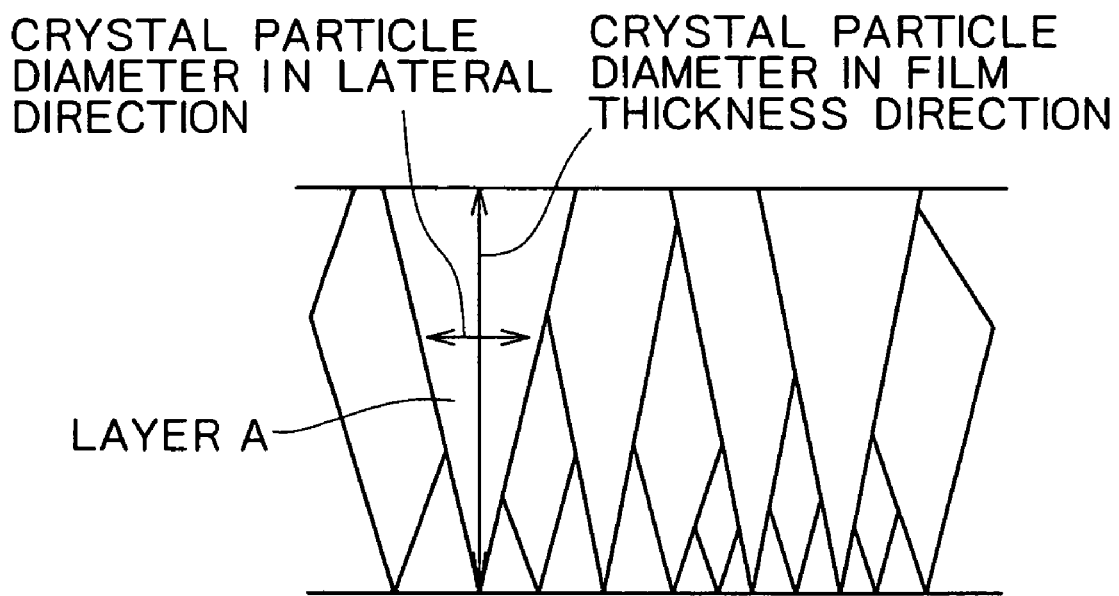
FIG. 2 is a schematic cross-sectional view of a hard film of the related art.

An ordinary hard film layer A such as TiN, CrN or TiAlN which is widely used for cutting tools or wear-resistant sliding parts formed by sputter or ion plating, as schematically shown by the film crystal growth pattern in FIG. 2, starts from a nucleus on the substrate and grows into a column, the width of this column-shaped particle increasing as it grows.

Figure 1:
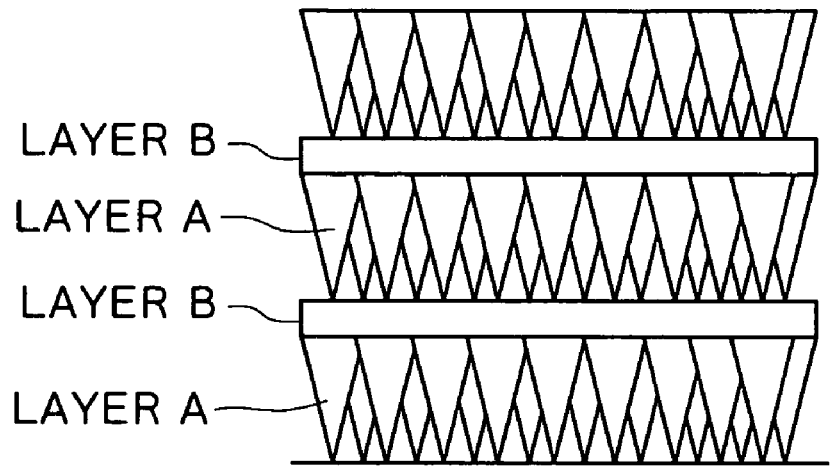
FIG. 1 is a schematic cross-sectional view of the laminated structure of a hard film according to the present invention.

On the other hand, for example in the case of the first embodiment as schematically shown by the film crystal growth pattern in FIG. 1, a film having crystals without a cubic rock-salt structure is selected as the hard film layer B, and this is deposited (formed) alternately with the hard film layer A. In this case, the growth of the hard film layers A is temporarily stopped by inserting the hard film layer B, and the hard film layers A repeatedly produce nuclei and grow out from the hard film layers B. Therefore, compared to FIG. 2, the crystal particle size is finer in the film thickness direction and the parallel direction (lateral direction) to the substrate surface. FIGS. 1 and 2 are simplified graphical representations of the results obtained by TEM observation of a hard film or laminated film cross-section at a magnification of 45000 times.

For example, if a TiAlN film is selected as the hard film layer A, a SiN film is selected as the hard film layer B, the thickness of the layer A is approximately 50 nm and the thickness of the layer B is approximately 5 nm, TEM observation of the TiAlN/SiN laminated film having the aforesaid laminated structure shows that, compared to FIG. 2, crystal particle growth in the film thickness direction is interrupted at each layer, so that the crystal particles are finer. Due to this increased fineness of critical particles, superior properties which could not be obtained with prior art hardened films can now be obtained.

According to the second embodiment, layer A is crystalline ($Cr_2N$ or CrN) and layer B is non-crystalline. By alternately depositing these two layers having different crystallinity to form a film, growth of the crystal particles of layer A in the film thickness direction is interrupted by inserting the layer B, so the crystal particle size does not exceed the thickness of layer A. As a result, compared to the case wherein crystal particle growth is not interrupted as in the aforesaid prior art, the crystal particles are finer and the film hardness is further increased.

Next, the structural requirements of a laminate of two types of hard film layer which are common to the first-fourth embodiments, will be described.

(Thickness of Hard Laminated Film)

The overall thickness of the hard laminated film of this invention depends on the application such as cutting tools or sliding parts. In general, in the case of cutting tools, it is of the order of 1-5 μm, and in the case of sliding parts it is of the order of 3-100 μm. Therefore, the film thickness may be controlled by determining the thicknesses of the layers A, B according to the following standards and then varying the number of laminated layers so that these hard laminated film thicknesses are obtained.

(Relation Between Film Thickness of Layer A and Film Thickness of Layer B)

In the hard laminated film of the present invention, the thickness of layer A is twice or more the thickness of layer B per layer. Layer A which is the main phase of the hard laminated film of the present invention basically determines the specification such as hardness, wear resistance and anti-oxidation properties required of the hard laminated film of the present invention. If layer A is less than twice the thickness of layer B, the properties of layer B become predominant in the properties of the hard laminated film, so the film no longer has the required properties. Therefore, the thickness of layer A is twice or more the thickness of layer B.

For example, in the case of the first embodiment, the hard film layer A having a cubic rock-salt structure is the main phase which basically determines wear resistance, and although the hard film layer B which has a crystal structure other than a cubic rock-salt structure may be hard, its wear resistance is poorer than that of the hard film layer A. Therefore, in order to provide a hard film with superior wear resistance, sufficient thickness must be ensured so that the properties of the hard film layer A having the cubic rock-salt structure are predominant in the hard film.

(Thickness of Layer A)

The thickness (film thickness) of layer A per layer is 200 nm or less, preferably 100 nm or less, but more preferably 50 nm or less. The thickness of layer A per layer should be less than 200 nm, and if it exceeds this upper limit so that it is thicker, the composite effect of the laminated film disappears and there is no large difference from the case wherein the layer B is not provided and only the layer A is deposited to form the film. In this case, only the properties of the layer A are manifested, and the layer B cannot supplement the properties of the layer A.

For example, in the first embodiment, if the thickness of the layer A exceeds 200 nm, the crystal particles are not much finer, there is no large difference from the case wherein the hard film layer B is not provided and only the hard film layer A is deposited to form a film, and the crystals of the hard film layer A tend to grow to coarsely before providing the hard film layer B. Therefore, the properties are equivalent to those of a hard film grown without interrupting the crystal growth of the prior art.

On the other hand, the thickness of the layer A per layer should preferably be 2 nm or more. If the thickness of the layer A is less than 2 nm, it may be impossible to ensure the properties of the layer A in the hard laminated film even if the number of laminated layers A is increased.

(Thickness of Layer B)

The thickness of the layer B per layer is 0.5 nm, but preferably 1 nm or more. The thickness of the layer B varies according to the thickness of the layer A, but if it is less than 0.5 nm, i.e., at thicknesses less than this lower limit, there is no large difference from the case wherein the layer B is not provided and only the layer A is deposited to form the film. In this case, only the properties of the layer A are manifested, and the layer B cannot supplement the properties of the layer A. For example, in the case of the first embodiment, if the thickness of the layer B is less than 0.5 nm, the layer B is too thin, and interruption of the crystal growth of layer A by layer B may not occur. In this case, the crystal particles of the hard laminated film A may not be any finer.

On the other hand, the upper limit of the thickness of the layer B per layer is preferably one half or less of the thickness of the layer A.

If the thickness of the layer B exceeds one half of the thickness of the layer A, and the layer A is thin, the properties of the hard laminated film overall are largely affected by layer B, and the properties of the layer A may not easily be manifested.

The thicknesses of layer A and layer B can be calculated as averages of the values measured respectively in 2 fields at a magnification of 500000-1500000 times by cross-sectional TEM observation.

(Laminated State of Hard Film Layer A and Hard Film Layer B)

The layers of the hard laminated film of the present invention are basically arranged so that the compositions of layer A and layer B alternate with each other, and in the case of layer A/layer B/layer A/layer B units wherein layer A alternates with layer B, it is preferable to form a laminate (multi-layer structure) wherein this unit is repeated several (plural) times. However, layer A/layer A/layer B/layer B, layer A/layer B/layer B/layer A, layer B/layer B/layer A/layer A or layer B/layer A/layer A/layer B units may also be respectively combined alternately to form the laminate. It may be noted that these laminated layers A and layers B do not necessarily have the same composition. In other words, within the scope of the present invention, the compositions of each of the layers A and the layers B may be made to differ according to the purpose, as for example in layer A1/layer B1/layer A2/layer B2. For example, in the first-third embodiments, the third hard film layer C has an identical crystal structure (e.g., a cubic rock-salt structure) to that of layer A, but a hard film layer (another substance) having different components may be selected and this hard film layer interposed, thus forming layer A/layer B/layer C units or layer B/layer A/layer B/layer C units which may then be respectively combined to form the laminate. The number of these laminated units may be selected as desired within a range of 20-1000 depending on the thickness of the hard laminated film desired.

Next, the compositions of the hard film layers A, B of the first-fourth embodiments will be described.

First Embodiment (Composition of Hard Film Layer A)

The composition formula of the hard film layer A which is the principal phase of the hard film of this invention, requires the selection of a substance having a rock-salt crystal structure, high hardness and wear resistance. This hard film having a rock-salt crystal structure may for example be a nitride, carbonitride or carbide having a cubic rock-salt structure containing Ti, Cr, Al or V such as TiN, CrN or TiAlN which are widely used in cutting tools and wear-resistant sliding parts. In addition, it may also be a compound of one or more elements selected from among 4A, 5A, 6A and Al or Si, with one or more elements selected from among B, C, N. These compounds all have a cubic rock-salt structure, high hardness and superior wear resistance. If a minute amount of 10% or less (0.1 or less in terms of atomic ratio) of oxygen is added to layer A within a range in which the rock-salt crystal structure of the hard film layer A is maintained, an oxynitride or oxycarbonitride layer of one or more elements selected from among 4A, 5A, 6A and Al or Si, or a layer containing this oxynitride or oxycarbonitride, can be produced, and this may further enhance properties which is also within the scope of the present invention.

The general formula of the compound which is applied to these hard film layers A, for one element, may be represented by $Ti(C_{1-x}N_x)$, $Cr(C_{1-x}N_x)$ or $V(C_{1-x}N_x)$ [wherein, x is a value from 0-1, hereafter idem]. For two elements, it may be represented by $TiAl(C_{1-x}N_x)$, $TiSi(C_{1-x}N_x)$, $TiCr(C_{1-x}N_x)$, $TiV(C_{1-x}N_x)$, $TiB(C_{1-x}N_x)$, $CrAl(C_{1-x}N_x)$, $CrSi(C_{1-x}N_x)$, $CrV(C_{1-x}N_x)$, $CrB(C_{1-x}N_x)$, $VAl(C_{1-x}N_x)$, $VSi(C_{1-x}N_x)$, $VB(C_{1-x}N_x)$. For three elements, it may be represented by $TiAlSi(C_{1-x}N_x)$, $TiAlCr(C_{1-x}N_x)$, $TiAlV(C_{1-x}N_x)$, $TiAlB(C_{1-x}N_x)$, $TiCrSi(C_{1-x}N_x)$, $TiCrV(C_{1-x}N_x)$, $TiCrB(C_{1-x}N_x)$, $TiVSi(C_{1-x}N_x)$, $TiVB(C_{1-x}N_x)$, $CrAlSi(C_{1-x}N_x)$, $CrAlV(C_{1-x}N_x)$, $CrAlB(C_{1-x}N_x)$, $CrSiV(C_{1-x}N_x)$, $CrSiB(C_{1-x}N_x)$, $CrVB(C_{1-x}N_x)$, $VAlSi(C_{1-x}N_x)$, $VAlB(C_{1-x}N_x)$.

For four elements, it may be represented by $TiAlSiCr(C_{1-x}N_x)$, $TiAlSiV(C_{1-x}N_x)$, $TiAlSiB(C_{1-x}N_x)$, $TiAlCrV(C_{1-x}N_x)$, $TiAlCrB(C_{1-x}N_x)$, $TiAlVB(C_{1-x}N_x)$, $TiCrSiV(C_{1-x}N_x)$, $TiCrSiB(C_{1-x}N_x)$ $TiCrVB(C_{1-x}N_x)$, $CrAlSiV(C_{1-x}N_x)$, $CrAlSiB(C_{1-x}N_x)$, $CrAlVB(C_{1-x}N_x)$, $CrSiVB(C_{1-x}N_x)$, $VAlSiB(C_{1-x}N_x)$.

Among these compounds, compounds containing one of Ti, Cr or Al have increased hardness. Examples of such compounds are TiN, TiCN, TiAlN, CrN, TiCrAlN and CrAlN. In particular, compounds containing Al have superior oxidation resistance and are especially suitable for cutting tool applications wherein this oxidation resistance is required. For machine part applications, compounds containing Cr (for example, CrN, TiCrN, CrCN) are suitable.

In general, hard films having a rock-salt crystal structure can be measured and analyzed by X-ray diffraction using the θ-2θ method. In X-ray diffraction, hard films of rock-salt structure all give high peak intensities for the (111) plane, (200) plane and (220) plane. For example, hard films such as (TiAl) (CN), have a rock-salt crystal structure, and form a composite nitride of rock-salt structure wherein Al has substituted Ti in the TiN of the rock-salt structure. In this case, the AlN (grating constant 4.12 Å) of the rock-salt structure is a high temperature, high pressure phase, and since it is a very hard substance, if the ratio of Al in (TiAl)(CN) is raised while maintaining the rock-salt structure, the hardness of the (TiAl)(CN) film can be further enhanced.

(Composition of Hard Film Layer B)

The hard film layer B is preferably selected from among (1) a compound (cubic crystals) of one or more elements selected from among 4A, 5A, 6A, Al which respectively do not have a cubic rock-salt structure, and an element selected from among B, C, N, (2) a nitride, carbonitride or carbide of one or more elements selected from among B, Si, Cu, Co, Ni, C, or (3) metallic Cu, metallic Co or metallic Ni. Among these, the group (2) is particularly preferred.

Basically, if the hard film layer B is a substance which does not have a rock-salt type cubic structure, the aforesaid particle fineness effect can be obtained. However, in the case wherein the hard film of the present invention is used at high temperature such as in cutting tools, or considering the characteristics required of sliding parts, substances in the aforesaid groups which have heat and abrasion resistance are preferred. Among these, in the above group (2), BN, BCN, SiN, SiC, SiCN, B—C which contain B or Si, Cu, CuN, CuCN or metallic Cu, are suitable.

Second Embodiment

The Inventors discovered that, by forming the layer A having a chemical composition corresponding to the following formula (1) and the layer B having a chemical composition corresponding to the following formula (2) so that the aforesaid deposition requirements are satisfied, a hard film having superior wear resistance and lubricity was obtained, and thereby arrived at the present invention.

Layer A: Cr $(B_aC_bN_{1-a-b-c}O_c)_e$ $$0 \leq a \leq 0.15,\ 0 \leq b \leq 0.3,\ 0 \leq c \leq 0.1,\ 0.2 \leq e \leq 1.1 \quad (1)$$

Layer B: $B_{1-x-t}C_sN_t$ $$0 \leq s \leq 0.25,\ (1-s-t)/t \leq 1.5 \quad (2)$$

The reason for specifying the composition of Layer A and Layer B as mentioned above, will now be described in detail.

[Composition of Layer A]

First, the reason why layer A is a Cr (B, C, N, O) film containing B, C, N, O in the proportions shown in the aforesaid formula (1), is as follows.

Layer A has chromium nitride (CrN, $Cr_2N$) of high hardness as its main component so that the film retains its wear resistance. The hardness can be further increased and the wear resistance further improved by adding C, B and O to the chromium nitride, but since excessive addition of these elements actually cause the hardness to decrease, the upper limit of a (i.e., B) is 0.15 but preferably 0.1, the upper limit of b (i.e., C) is 0.3 but preferably 0.2, and the upper limit of c (i.e., O) is 0.1 but preferably 0.07 or less.

As for the ratio e of the sum total of B, C, N, O to Cr, this is preferably within the range of 0.2-1.1, this range corresponding to the composition range in which the crystal structure of layer A is a $Cr_2N$ structure or CrN structure. The crystal structure of layer A can be verified by cross-sectional TEM and electron diffraction as described later.

[Composition of Layer B]

Next, layer B is a BN compound which functions as a solid lubricant material which confers lubricity on the film. Here, the ratio (1-s-t)/t of B and N must be 1.5 or less, but preferably 1.2 or less, in order to form the BN compound. If C is added to this BN compound, higher hardness can be attained while conferring lubricity to layer B, but excessive addition actually causes the hardness to fall and lubricity to be lost, so the upper limit of s is set to 0.25. The ratio s/(1-s-t) of C to B is preferably 0.25 or less, but more preferably 0.1 or less.

[Modification of Composition of Layer A]

As described above, layer A has high hardness and has the role of providing wear resistance, while the insertion of layer B aims to further improve properties by increasing crystal particle fineness, but if part of the Cr of Layer A is replaced by another element, the hardness of layer A can be further increased and wear resistance further enhanced.

Elements which can be recommended as the above additional element are one, two or more elements selected from a group comprising Ti, Zr, Hf, V, Nb, Ta, Mo, W, Al and Si. Among these, preferred single elements are Al, Si, W and Ti, and preferred combinations of two elements are Al and Si, Al and Ti, W and Si, and Ti and Si.

If the substitution rate α of the aforesaid additional element is too large, the proportion of original Cr will decrease too much and the hardness increase effect will be lost, therefore the substitution rate is set to 0.9 or less. The lower limit of the substitution rate α is not particularly limited, but in order to obtain a constant effect due to substitution of the aforesaid element, the substitution rate α is preferably 0.05 or more. The preferred range of the substitution rate α also varies with the type and combination of the substituting element, but 0.4-0.8 is a general guideline.

When the two elements Ti and Al are combined to replace Cr, the oxidation resistance of the film increases if Al is increased so the proportion of Al is preferably larger than that of Ti, but if the proportion of Al is too large, the film tends to become amorphous, so the proportion of Al to the total amount of Cr, Ti, and Al is preferably 0.8 or less.

When Si is contained as a substituting element, if the proportion of Si is too large, layer A tends to become amorphous, so the proportion of Si to the total amount of Cr and substituting elements is preferably 0.5 or less.

[Modification of Composition of Layer B]

Even if a SiCN or CN film is used instead of a BCN film as layer B, a film having superior wear resistance is obtained.

When a SiCN film is used for layer B, in general, a low frictional coefficient as in a BCN system film is not obtained and aggressiveness toward partner materials cannot be reduced, but as it is harder than a BCN film, the film's own wear resistance improves and it becomes suitable for cutting tools where aggressiveness toward partner materials is not a consideration. It also has superior oxidation resistance. If C is added excessively, the hardness will fall, so the upper limit of the addition rate of C is set at 0.6.

CN films are unstable at high temperature and generally cannot be used in a hot sliding environment, but as a guideline, in a sliding environment of 400° C. or less, they have comparable sliding properties to those of BCN films and can be used. A guideline for the addition rate of N is 0.6 or less, but preferably 0.4 or less.

[Crystal Particle Fineness of Layer A]

As mentioned above, layer A can assume a cubic $Cr_2N$ structure or a cubic rock-salt CrN structure depending on the ratio of Cr and the total amount of B, C, N, O, but for wear resistance a CrN structure is better, and therefore the preferred crystal structure of layer A is a cubic rock-salt structure.

The essential feature of the present invention is that, by depositing layer A and layer B with the aforesaid film thicknesses and film thickness ratios, growth of the crystal particles of layer A is interrupted by layer B, and as a result, the crystal particles become finer.

Here, the fineness of the crystal particles can be evaluated using the half-width (FWHM: Full Width Half Maximum) of the diffraction lines from the (111) and (200) planes of the cubic rock-salt structure of layer A observed on the X-ray diffraction pattern as an indicator. In general, the half-width of a diffraction line has a fixed relationship to the crystal particle size of the material being measured, and half-width increases with decrease of crystal particle size. However, it is known that the half-width of a diffraction line varies also due to other factors such as for example uneven stresses in the film, and the half-width and crystal particle size are therefore not necessarily in direct proportion.

In view of the above, the Inventors discovered, as a result of investigating the relation between half-width of the aforesaid diffraction line with film hardness or wear resistance, film properties were further improved when at least one half-width of the diffraction lines from the (111) and (200) planes was 0.3° or more. More preferably, the lower limit of the half-width is 0.4°. The upper limit of the half-width is not particularly limited, but it is effectively about 1°.

This invention estimated the half-width of a diffraction line by X-ray diffraction by the θ-2θ method using the CuKα line (40 kV-40 mA). The other conditions of the X-ray optics system were emission and scattering slits 1°, euphotic slit 0.15 mm and using a graphite monochrometer, the euphotic slit in front of the counter was 0.8°, scanning rate was 2° (continuous scan) and step width was 0.02°.

Third Embodiment (Composition of Layer A)

The composition of layer A, which is the main phase of the hard laminated film according to the third embodiment, should have high oxidizing properties in applications wherein sliding parts such as cutting tools reach a high temperature. The layer A must also have the basic properties required of the hard film, such as high hardness and wear resistance.

For this reason, the composition of layer A may be represented by:

Formula 1: $(Ti_{1-x-y}Al_xM_y)(B_aC_bN_{1-a-b-c}O_c)$ [wherein, x, y, a, b, c are respectively atomic ratios, $0.4 \leq x \leq 0.8$, $0 \leq y \leq 0.6$, $0 \leq a \leq 0.15$, $0 \leq b \leq 0.3$, $0 \leq c \leq 0.1$, and M is one or metal elements selected from among 4A, 5A, 6A, Si.

Among the compositions of layer A represented by Formula 1, $(Ti_{1-x-y}Al_xM_y)(B_aC_bN_{1-a-b-c}O_c)$ [wherein x, y, a, b, c are respectively atomic ratios $0.5 \leq x \leq 0.8$, $0.05 \leq y \leq 0.6$, $0 \leq a \leq 0.15$, $0 \leq b \leq 0.3$, $0 \leq c \leq 0.1$, and M is one or metal elements selected from among Cr, V, Si], is preferred.

In the aforesaid Formula 1, the atomic ratio of (TiAlM) and (BCNO), or in other words the atomic ratio of the metal element group and non-metal element group in the brackets is usually 1:1, but it is not necessarily limited only to this case. In Ti compounds which actually form films, due to differences in film-forming conditions, the atomic ratio of (TiAlM) and (BCNO) is of course not limited to 1:1 and may have a fluctuation width of, for example, 0.8 to 1.2. Therefore, in the aforesaid Formula 1, the atomic ratio of (TiAlM) and (BCNO), and the atomic ratio of the metal element group and non-metal element group, naturally allow a fluctuation width in the atomic ratio of the Ti compound actually forming the film.

(Ti Component)

In the composition forming the layer A, Ti nitrides, carbonitrides, boronitrides and carboboronitrides such as TiAlN, TiAlCrN, TiAlVN, TiAlNbN, TiAlBN, TiAlCrCN have properties such as high hardness and high wear resistance in hard films which make them very suitable as base components of the layer A part of the present invention.

(Al)

In contrast to the Ti component, the inclusion of Al in the aforesaid composition improves the hardness and oxidation resistance of the layer A. This effect is particularly evident when Al is contained with an atomic ratio within the range of 0.4-0.8 ($0.4 \leq x \leq 0.8$), but preferably 0.5-0.8 ($0.5 \leq x \leq 0.8$). On the other hand, if Al is included but lies outside this component range, there is no or little improvement of hardness and oxidation resistance, and there is then no reason to include Al.

(Metal Element M)

When one or more metal elements represented by M selected from among 4A, 5A, 6A, and Si is further contained in the aforesaid compositional formula, the hardness and oxidation resistance of layer A are improved. This effect is particularly evident when the metal element M is contained with an atomic ratio y of 0.6 or less ($0 \leq y \leq 0.6$). This is because when M is contained with an atomic ratio exceeding 0.6, the total content of Ti and Al which form the base becomes less than 0.4 in terms of atomic ratio, so the hardness and oxidation resistance of layer A fall.

The metal element M which demonstrates the aforesaid effect is preferably one or more metals selected from among Cr, V, Si, and a suitable content range wherein the aforesaid effect is demonstrated is 0.05-0.6 in terms of atomic ratio ($0.05 \leq y \leq 0.6$), but more preferably 0.1-0.3 ($0.1 \leq y \leq 0.3$)

(Non-Metal Element)

Among the aforesaid non-metal elements selected from among B, C, N in the composition of layer A, nitrogen (N) is necessary to form a nitride, carbonitride, boronitride or carboboronitride. The content of this nitrogen is specified by $N_{1-a-b-c}$ in the composition of layer A depending on the amount of B and C (value of a or b in the compositional formula) or the amount of O (value of c in the compositional formula).

Boron (B) is selectively included to form a boronitride and carboboronitride. However if it is included and too much is added, soft B compounds separate out which causes the hardness and oxidation resistance of layer A to decrease. For this reason, the upper limit in terms of the atomic ratio a is 0.15 ($0 \leq a \leq 0.15$), but preferably 0.1 or less ($0 \leq a \leq 0.1$).

Carbon (C) is selectively included to form carbide and carbonitride. However if it is included and too much is added, it leads to softness of layer A, and the hardness and oxidation resistance of layer A decrease. For this reason, the upper limit in terms of the atomic ratio b is 0.3 ($0 \leq b \leq 0.3$), but preferably 0.2 or less ($0 \leq b \leq 0.2$).

A small amount of oxygen (O) may be included to increase the hardness of layer A, but if it exceeds 0.1 in terms of the atomic ratio c, the proportion of oxide in the film increases and the toughness of the film is impaired. For this reason, the upper limit is 0.1 or less ($0 \leq c \leq 0.1$).

(Composition of Layer B)

Layer B basically has the role of imparting properties which layer A does not have, or of improving the properties of layer A. For this reason, according to the present invention, when it is deposited alternately with layer A, the compounds represented by the following four Compositional Formulae 1-4 are selected according to their properties and purposes.

Formula 2: $B_{1-x-y}C_xN_y$ [wherein x, y are respectively atomic ratios, $0 \leq x \leq 0.25$ and $B/N \leq 1.5$], Formula 3: $Si_{1-x-y}C_xN_y$ [wherein x, y are respectively atomic ratios, $0 \leq x \leq 0.25$ and $0.5 \leq Si/N \leq 2.0$], Formula 4: $C_{1-x}N_x$ [wherein x is an atomic ratio and $0 \leq x \leq 0.6$], Formula 5: $Cu_{1-y}(C_xN_{1-x})y$ [wherein x, y are respectively atomic ratios, $0 \leq x \leq 0.1$ and $0 \leq y \leq 0.5$].

The compounds represented by the aforesaid four formulae have different crystal structures from the compound of layer A. By depositing these compounds together with layer A, the growth of the crystal particles of layer A is interrupted, and the fineness of the crystal particles can be increased. As a result, the hardness of the hard laminated film can be considerably increased.

Among the above compounds having compositions represented by the aforesaid four formulae, if the B nitride or carbonitride compound of Formula 2, and the carbon or nitrocarbon compound of Formula 4, are deposited with layer A, lubricity which is not present in layer A can be imparted. Among these, the B compound of Formula 2 is stable at high temperature and has superior lubricity from normal temperature—high temperature. The C compound of Formula 4 has better lubricity at low temperature than the B compound of Formula 2. These formulae (composition ranges) of the B compound of Formula 2, and the C compound of Formula 4, are both composition ranges required to ensure lubricity.

In the aforesaid Formula 2 of the B compound, to ensure this lubricity, the atomic ratio x of C is 0.25 or less ($0 \leq x \leq 0.25$), but preferably 0.2 or less. In the case of a B rich compound wherein B/N in Formula 2 exceeds 1.5, lubricity is lost. Therefore, the upper limit of B/N, the ratio of B to N, is 1.5 or less (B/N≦1.5), but more preferably 1.2 or less (B/N≦1.2) In Formula 2, the atomic ratio y of the nitrogen amount is determined from the ratio of B to N in balance with the amount of C, so the range cannot be determined from y alone. In other words, if the amount of C is determined, the amounts of B and N including y are determined from B/N, so if the range of B/N is determined, there is no need to determine the range of y independently.

The Si compound of Formula 3 which is a Si nitride or carbonitride, when combined with layer A, has the effect of further increasing oxidation resistance. In Formula 3, if the amount of C (atomic ratio x) is large, there is a tendency for the film hardness to fall, so the upper limit of the atomic ratio x of C is 0.25 (0≦x≦0.25), but more preferably 0.2 (0≦x≦0.2) or less. Also, the reason why Si/N, the ratio of Si and N, is specified, is because if the Si/N ratio lies outside the specified range (0.5≦Si/N≦2.0) but more preferably 0.5≦Si/N≦1.4, the hardness remarkably declines and the hardness properties of the laminated film overall are degraded. In Formula 3, the atomic ratio y of the nitrogen amount is determined from the ratio of Si to N in balance with the amount of C, so the range cannot be determined from y alone. In other words, if the amount of C is determined, the amounts of Si and N including y are determined from Si/N, so if the range of Si/N is determined, there is no need to determine the range of y independently.

In Formula 4 of the carbon or nitrocarbon compound, if the atomic ratio x of the amount of C is too high and exceeds 0.6, lubricity declines. Therefore, the upper limit of the atomic ratio x of C is 0.6 or less (0≦x≦0.6).

If the compound of Formula 5 which is a Cu nitride or carbonitride compound is combined with layer A in the specified composition range, an increase of hardness can be obtained. Outside this composition range, e.g., if the upper limit of the atomic ratio x exceeds 0.1, or the atomic ratio y of the aforesaid $(C_xN_{1-x})_y$ exceeds 0.5, there is no increase in hardness even if it is combined with layer A. Therefore, x, y lie respectively within the ranges 0≦x≦0.1 and 0≦y≦0.5 as described above.

Fourth Embodiment (Composition of Layer A)

The composition of layer A, which is the main phase of the hard laminated film according to the fourth embodiment, should have high oxidizing properties in applications wherein sliding parts such as cutting tools reach a high temperature. The layer A must also have the basic properties required of the hard film, such as high hardness and wear resistance. For this reason, the formula of layer A is selected from Ti and Cr compounds having specific compositions.

(Ti Compound)

Among these, a Ti-containing layer A has a composition corresponding to the following Formula 1.

Formula 1: $(Ti_{1-x-y}Al_xM_y)(B_aC_bN_{1-a-b-c}O_c)$ [wherein x, y, a, b, care respectively atomic ratios, 0.4≦x≦0.8, 0≦y≦0.6, 0≦a≦0.15, 0≦b≦0.3, 0≦c≦0.1, and M is one or more metal elements selected from among 4A, 5A, 6A, Si].

In the aforesaid Formula 1, the atomic ratio of (TiAlM) and (BCNO), or in other words the atomic ratio of the metal element group and non-metal element group in the brackets is usually 1:1, but it is not necessarily limited only to this case. In Ti compounds which actually form films, due to differences in film-forming conditions, the atomic ratio of (TiAlM) and when the metal element M is contained with an atomic ratio of 0.6 or less (0≦y≦0.6). This is because when M is contained with an atomic ratio exceeding 0.6, the total content of Ti and Al which form the base becomes less than 0.4 in terms of atomic ratio, so the hardness and oxidation resistance of layer A fall.

The metal element M which demonstrates the aforesaid effect is preferably one or more metals selected from among Cr, V, Si, and a suitable content range wherein the aforesaid effect is demonstrated is 0.06-0.6 in terms of atomic ratio (0.05≦y≦0.6), but more preferably 0.1-0.3.

(Non-Metal Element)

Among the aforesaid nonmetal elements selected from B, C, N in the compositional formula of layer A, nitrogen (N) is necessary to form a nitride, carbonitride, boronitride or carboboronitride. The content of this nitrogen is specified by $N_{1-a-b-c}$ in the compositional formula of layer A depending on the amount of B and C (value of a or b in the compositional formula) or the amount of O (value of c in the compositional formula).

Boron (B) is selectively included to form a boronitride and carboboronitride. However, if it is included and too much is added, soft B compounds deposit, and the hardness and oxidation resistance of layer A decrease. For this reason, the upper limit in terms of the atomic ratio a is 0.15 (0≦a≦0.15), but preferably 0.1 or less (0≦a≦0.1).

Carbon (C) is selectively included to form a carbide and carbonitride. However, if it is included and too much is added, it leads to softness of layer A, and the hardness and oxidation resistance of layer A decrease. For this reason, the upper limit in terms of the atomic ratio b is 0.3 (0≦b≦0.3), but preferably 0.2 or less (0≦b≦0.2).

A small amount of oxygen (O) may be included to increase the hardness of layer A, but if it exceeds 0.1 in terms of the atomic ratio c, the proportion of oxide in the film increases and the toughness of the film is impaired. For this reason, the upper limit is 0.1 or less (0≦c≦0.1).

(Cr Compounds)

The Cr-containing layer A has a composition corresponding to the following Formula 2.

Formula 2: $(Cr_{1-\alpha}X_\alpha)(B_aC_bN_{1-a-b-c}O_c)_e$ [wherein, α, a, b, c, e are respectively atomic ratios, 0≦α≦0.9, 0≦a≦0.15, 0≦b≦0.3, 0≦c≦0.1, 0.2≦e≦1.1.

X is one or metal elements selected from among Ti, Zr, Hf, V, Nb, Ta, Mo, W, Al, Si.

Among the Cr-containing compositions of layer A, Cr nitrides, carbonitrides, boronitrides and carboboronitrides have properties such as high hardness and high wear resistance in hard films, as shown by the Cr compounds CrN, $Cr_2N$, CrSiN, CrAlN, CrBN, CrSiBN, and are very suitable as the base components of the layer A part of the present invention.

If this Cr composition has too little Cr, as compared to a Ti composition, hardness is low. However, when used for sliding part materials, as compared to a Ti composition, it is less aggressive to partner materials and is therefore suitable for sliding part materials. Even if there is too little Cr, high hardness can be obtained depending on the addition element, so it is suitable also for cutting tools.

(Addition Element X)

The addition element X to obtain high hardness is a specific metal element selected from among Ti, Zr, Hf, V, Nb, Ta, Mo, W, Al, Si. These metal elements X have a particularly large effect when they are contained with an atomic ratio a of 0.9 or less (0≦α≦0.9). This is because, when the metal element X exceeds 0.9 in terms of atomic ratio, the amount of the base Cr is less than 0.1 in terms of atomic ratio, so the hardness and oxidation resistance of layer A fall.

In particular, when used for sliding part materials, as the aggressiveness toward the partner material increases if there is too little Cr, a certain amount of Cr must be ensured. For this reason, for sliding part materials, it is convenient to ensure sufficient Cr by using an atomic ratio a of 0.5 or less, but preferably 0.3 or less. For cutting tools, it is on the other hand convenient to use an atomic ratio α of 0.5 or higher, but preferably 0.7 or more to increase hardness.

(Non-Metal Element)

The specific values and meanings of the non-metal element selected from B, C, N in the compositional formula of layer A, are identical to the aforesaid Ti compounds. However, regarding the atomic ratio e in $(B_aC_bN_{1-a-b-c}O_c)_e$ of Formula 3, 0.2-1.1 ($0.2 \leq e \leq 1.1$). If e is less than 0.2, the non-metal element selected from B, C, N is insufficient, and the hardness and oxidation resistance of layer A fall. On the other hand, if e exceeds 1.1, the metal element, i.e., Cr or X, is insufficient, and hardness and oxidation resistance again decline.

(Composition of Layer B)

Layer B basically has the role of imparting properties such as lubricity at high temperature which layer A does not have, or of further improving the properties of layer A such as acid resistance. These properties are manifested when layer B has a composition corresponding to the following Formula 3.

Formula 3: $M(B_aC_bN_{1-a-b-c}O_c)$ [wherein, M is one or metal elements selected from among W, Mo, V, Nb; a, b, c are respectively atomic ratios, and $0 \leq a \leq 0.15$, $0 \leq b \leq 0.3$, and $0 \leq c \leq 0.1$].

In Formula 3, the atomic ratio of M and (BCNO), or in other words the atomic ratio of the metal element M and non-metal element group in the bracket is usually 1:1, but it is not necessarily limited to 1:1, as in the case of the aforesaid Formula 1. Therefore, the atomic ratio of the metal element M and non-metal element group in the bracket is allowed to have a fluctuation width of, for example, 0.8 to 1.2.

The compound represented by the composition of Formula 3 has a different crystal structure from the aforesaid Ti or Cr compounds of specific composition. This is why the properties of layer A can be improved, e.g., why the hardness of the hard laminated film can be remarkably increased.

Specifically, the compound of layer A generally has a cubic rock-salt crystal structure, and although it also depends on the element content, a grating constant of about 0.41-0.43 nm. On the other hand, the compound containing W, Mo, V, Nb represented by the composition of Formula 3 has a comparatively large grating constant of 0.44 nm or more. Hence, when these compounds are deposited as layer B with the compounds of layer A (film-forming), a large distortion is introduced into the interface. As a result, when the film is used, even if an external distortion is applied and a crack develops in the vertical direction (thickness direction) of the film, there is a high probability that the crack in the film will be stopped in that part due to the distortion of the interface. It might thus be expected that properties such as the hardness and durability of layer A are improved, as described above.

Among the compounds represented by the composition of Formula 3, if compounds containing W, Mo, Nb are deposited together with layer A, the oxidation resistance of layer A can be improved. When compounds containing W, Mo, Nb are present alone, they start to oxidize at a temperature as low as 600-700° C. However, if they are deposited together with a layer A having twice or more the thickness of layer B, the elements W, Mo, Nb disperse in the oxide film formed by T, Al, Cr contained in layer A which increases the fineness of the oxide film and improves the oxidation resistance of the layer A as a result.

Among the compounds represented by the composition of the above Formula 3, compounds containing V do not improve the oxidation resistance of layer A, but can improve the high temperature lubricity of layer A. At high temperature, V forms soft oxides ($V_2O_5$) and these oxides improve the high temperature lubricity of layer A.

In the composition of Formula 3, when two or more of W, Mo, V, Nb are included, a suitable composition ratio required to obtain the aforesaid effect should be selected.

The value and significance of the nonmetal elements in $(B_aC_bN_{1-a-b-c}O_c)$ in the composition of Formula 3 are identical to those for layer A. Specifically, nitrogen (N) is necessary for the formation of nitrides, carbonitrides, boronitrides and carboboronitrides. As seen from the compositional formula of layer B, the amount of this nitrogen is specified by $N_{1-a-b-c}$ depending on the amount of B, C (values of a, b in the aforesaid compositional formula) and the amount of O (value of c in the aforesaid compositional formula) which are also selectively contained therein.

Boron is selectively contained to form boronitrides and carboboronitrides. However, if it is included and too much is added, soft B compounds separate out, so the hardness and oxidation resistance of layer B, and therefore layer A, decrease. Consequently, the upper limit in terms of the atomic ratio a is 0.15 ($0 \leq a \leq 0.15$), but the upper limit is preferably 0.1 or less ($0 \leq a \leq 0.1$).

Carbon (C) is selectively contained to form carbides and carbonitrides. However, if it is included and too much is added, it causes layer B and therefore layer A to become softer, so the hardness and oxidation resistance of the film decrease. Consequently, the upper limit in terms of the atomic ratio b is 0.3 ($0 \leq b \leq 0.3$), but the upper limit is preferably 0.2 or less ($0 \leq a \leq 0.2$).

Oxygen (O) is contained in minute amount as it may increase the hardness of layer B and therefore layer A, but if it exceeds 0.1 in terms of the atomic ratio c, the proportion of oxides in the film becomes large, and toughness of the film is impaired. Due to this, the upper limit is 0.1 or less ($0 \leq c \leq 0.1$).

(Substitution of Metal Element M in Layer B by Another Metal Element M1)

In the Formula 3 of layer B, the metal element M can be substituted by one or more metal elements M1 selected from among 4A, 5A, 6A, Si excluding W, Mo, V, Nb. It is understood that the metal element M1 is included to the extent that it does not interfere with the effect of the metal element M, and that by including the metal element M1, depending on its combination with the metal element M, the properties of the metal element M1 selected for layer B can be added thereto or the properties of layer B (therefore layer A or the film) can be improved.

For example, by replacing W, Mo, V as the metal element M by one of Ti, Al, Si, Cr as the metal element M1, film hardness can be improved.

In the case of this substitution, the proportion in $M_{1-b}M1_b$ is 0.3 or less in terms of the atomic ratio b ($0 \leq b \leq 0.3$). If substitution by the metal element M1 exceeds 0.3 in terms of the atomic ratio b, the effects of the metal element M, i.e., improvement of hardness and durability of the layer A by W, Mo, Nb, V, improvement of oxidation resistance by W, Mo, Nb and improvement of high temperature lubricity by Nb, are impaired.

Figure 5:
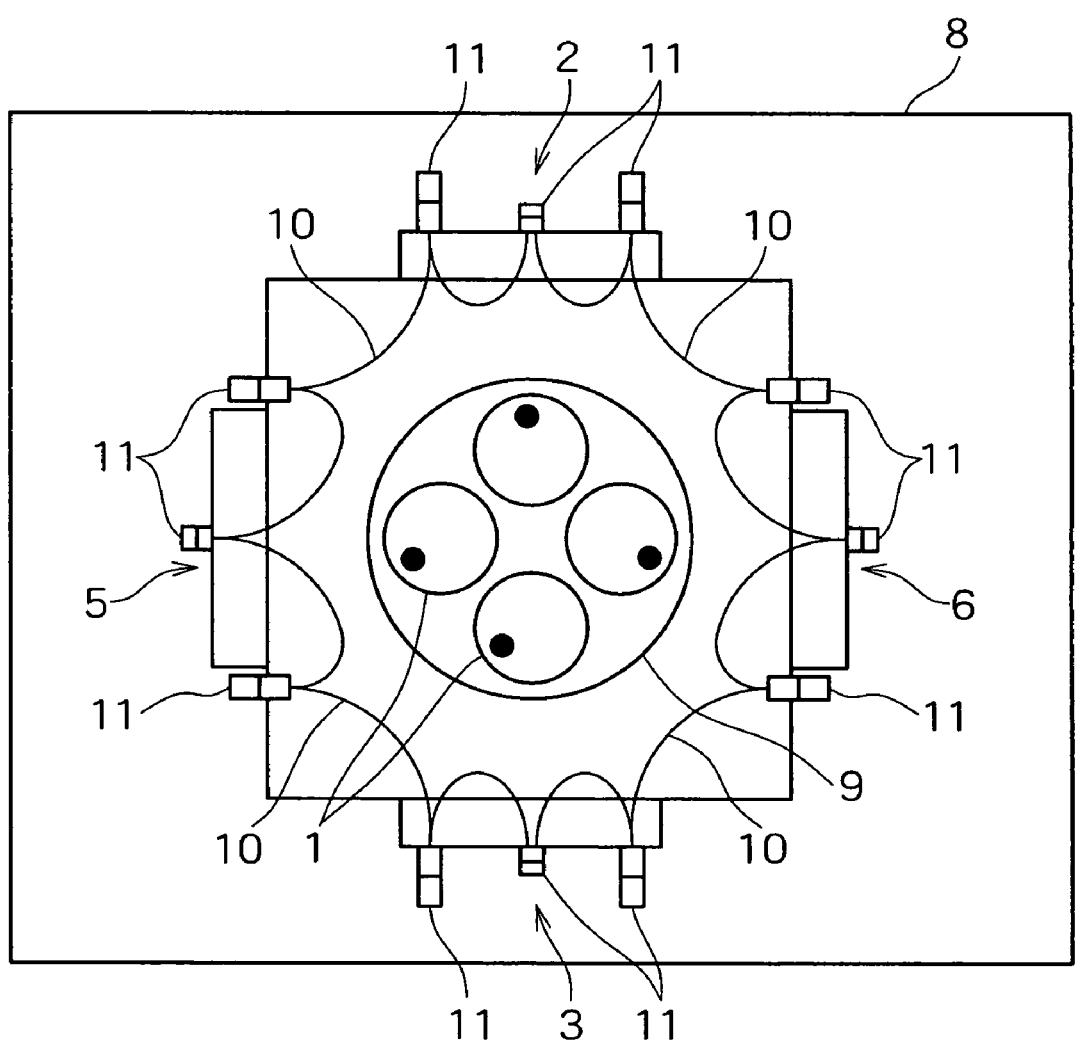
FIG. 5 is a descriptive diagram showing another aspect of a device for forming the hard film according to the present invention.
Figure 6:
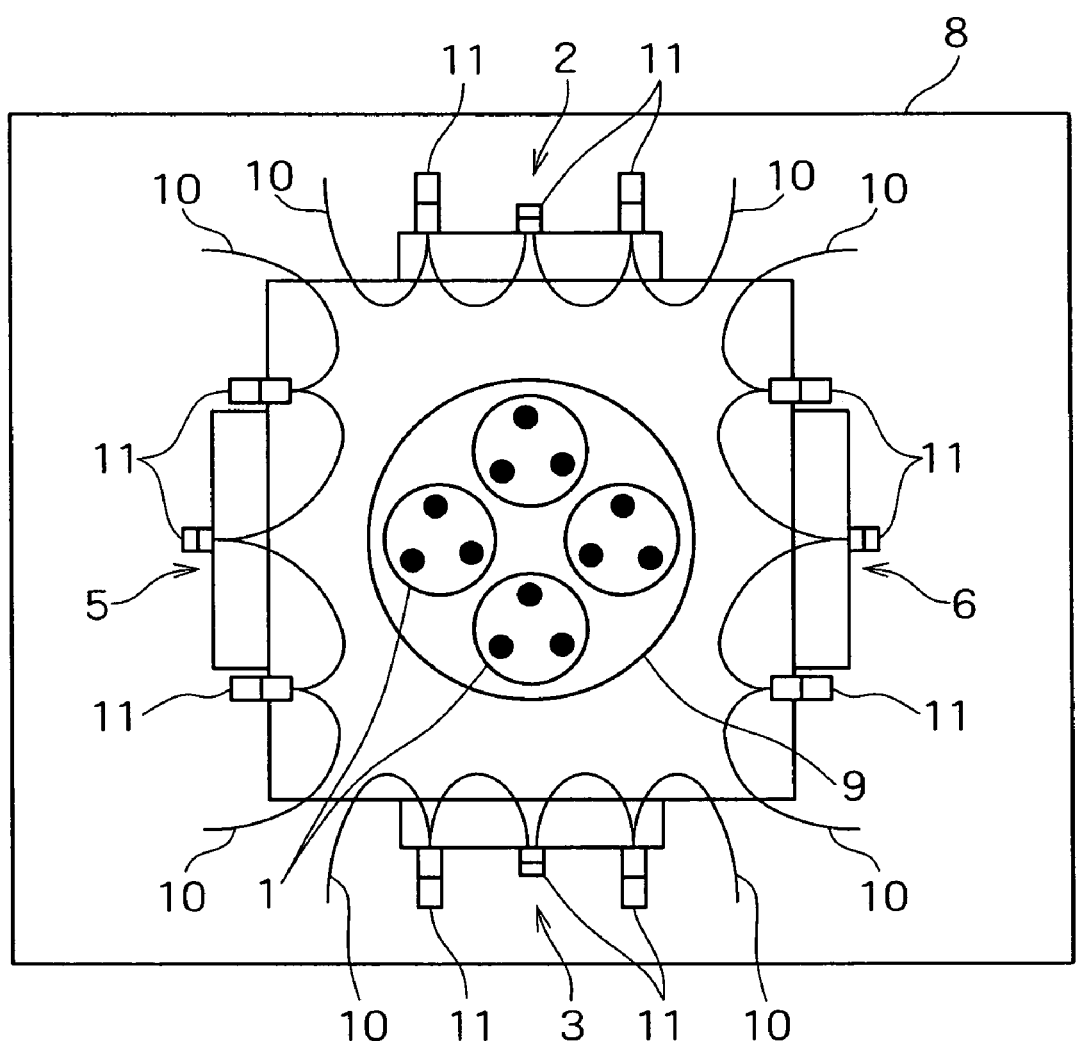
FIG. 6 is a descriptive diagram showing another aspect of a device for forming the hard film according to the present invention.
Figure 8:
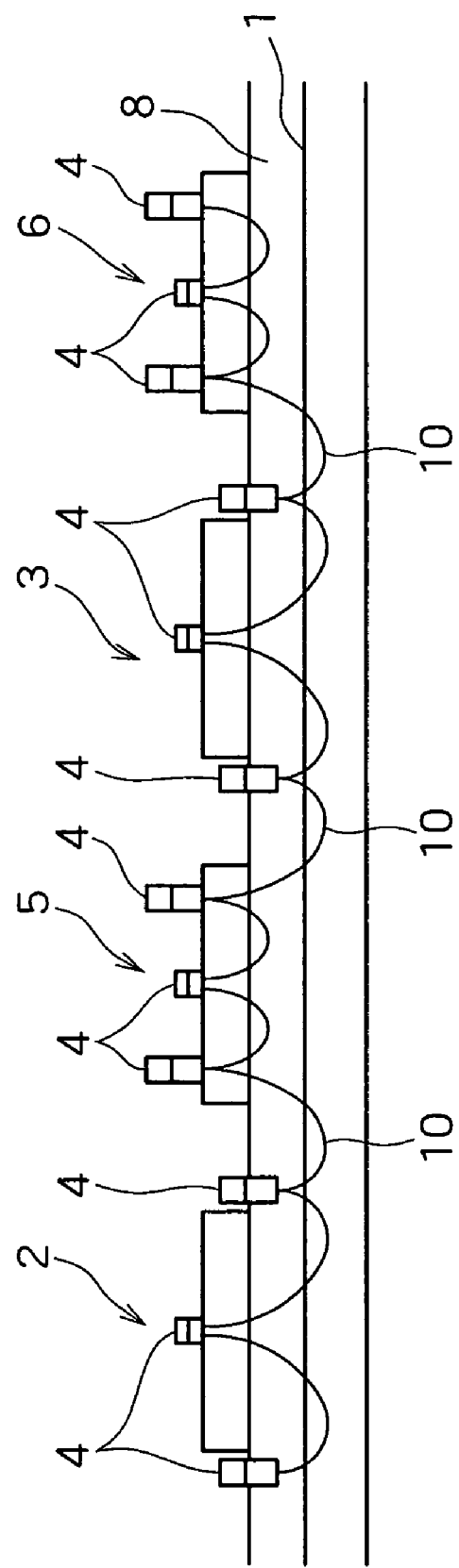
FIG. 8 is a front view showing another aspect of the composite film-forming device according to the present invention.
Figure 9:
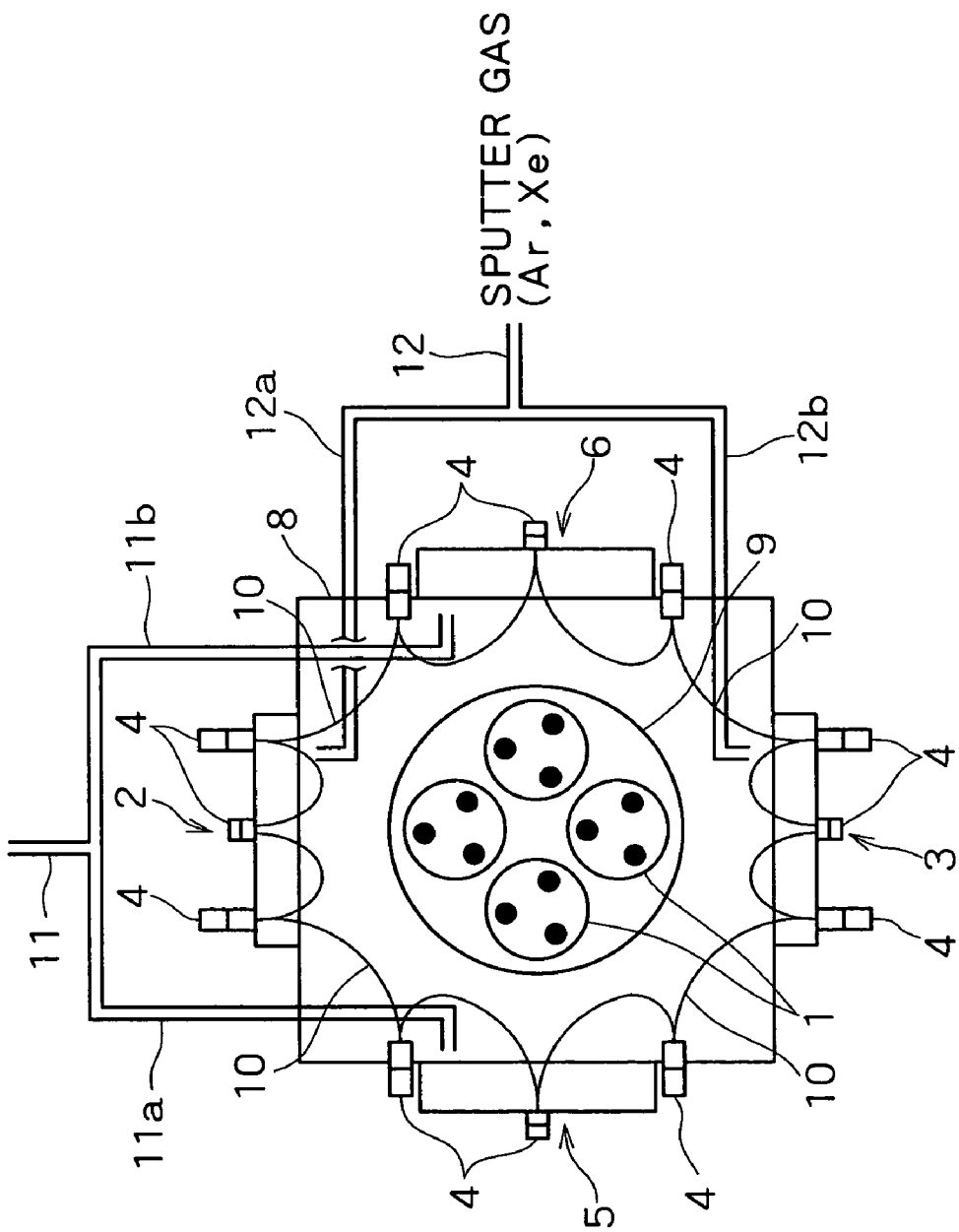
FIG. 9 is a plan view showing still another aspect of the composite film-forming device according to the present invention.

Next, some examples of a composite film-forming device of the fifth embodiment suitable for manufacturing the hard laminated film of the first-fourth embodiments will be described in detail referring to the drawings. FIG. 5 is a plan view showing one embodiment of the film-forming device of the present invention. FIG. 6 is a plan view showing a film-forming device of a comparative example. FIG. 8 is a plan view showing another example of the composite film-forming device of the present invention. FIG. 9 is a plan view showing another example of the composite film-forming device of the present invention.

In the film-forming devices shown in FIGS. 5, 6, plural substrates 1 (four symmetrical substrates in FIG. 5) are disposed on a rotating platform 9 inside a chamber. 8. Sputter vaporization sources 2, 3, and arc vaporization sources 5, 6 are disposed around this rotating platform in a circular arrangement (in a circle) so that the sputter vaporization sources 2, 3 and arc vaporization sources 5, 6 are symmetrical with respect to each other. The sputter vaporization sources and arc vaporization sources are disposed alternately adjacent to each other.

The substrates 1 are rotated by the rotation of the rotating platform 9 so that the substrates 1 alternately pass in front of the arc vaporization sources 5, 6 and sputter vaporization sources 2, 3. In this case, the arc vaporization sources 5, 6 and sputter vaporization sources 2, 3 may also be rotated around the substrates 1 without rotating the rotating platform 9 or substrates 1, or in other words, the substrates on which the film is to be formed need only have a means for relatively displacing them one after the other between the arc vaporization sources and sputter vaporization sources.

Alternatively, in another form of the invention, the sputter vaporization sources 2, 3 and arc vaporization sources 5, 6 may be alternately arranged in series such as in a straight line without disposing them in a circular arrangement, and the substrates on which the film is to be formed relatively displaced one after other between the arc vaporization sources and sputter vaporization sources.

When a hard film such as for example TiAlN is to be formed using the arc vaporization sources 5, 6, the reaction gas such as nitrogen, methane or acetylene is introduced into the chamber 8, and film-forming is performed using a TiAl target in an atmosphere containing the reactive gas having a pressure of about several Pa.

Likewise, when forming a hard film such as for example TiAlN using the sputter vaporization sources 2, 3, a TiAl target is used which is the same as when film-forming is performed using an arc. However, inert gases such as Ar, Ne, Xe which are sputter gases are mixed with the reactive gas such as nitrogen, and the total pressure of the atmosphere is only a fraction of 1 Pa which is a lower pressure than when film-forming is performed using an arc.

Thus, films are formed in sequence by sputter or by arc by rotating the rotation platform 9 and substrates 1 so that the substrates 1 pass alternately in front of the arc vaporization sources 5, 6 and sputter vaporization sources 2, 3, and hard films of identical or different compositions and thicknesses are sequentially formed in plural layers on the substrates 1 using identical or different hard materials.

(Magnetic Field Applying Mechanism)

Herein, the film-forming devices shown in FIGS. 5, 6 use a magnetic field 10 which is generated and controlled by a magnetic field applying mechanism 4 such as a permanent magnet with which the arc vaporization sources 5, 6 and sputter vaporization sources 2, 3 are provided.

However, when this magnetic field 10 is used, in the film-forming device of the present invention of FIG. 5, the magnetic fields 10 of the two adjacent vaporization sources, e.g., the magnetic fields 1 between for example the arc vaporization source 5 and sputter vaporization sources 2, 3 are mutually interconnected. In other words, during film-forming, the aforesaid magnetic field applying mechanism 4 is arranged so that the magnetic force lines (magnetic field 10) of adjacent vaporization sources are mutually interconnected.

Therefore, the magnetic field 10 (magnetic force lines) in the same film-forming chamber 8 is closed (closed magnetic field), and electrons discharged from the vaporization sources are trapped in this closed magnetic field so that they are not easily attracted to the chamber 8 which forms an anode in the same way as the substrate 1. As a result, the concentration of discharged electrons increases, collisions between the sputter gas and reaction gas increase, and high efficiency gas ionization can take place.

Due to this, even if arc film-forming and sputter film-forming are simultaneously performed in the same film-forming chamber, in the film-forming device of the present invention shown in FIG. 1, ion directionality from the two adjacent vaporization sources increases, ion irradiation to the substrates 1 increases, and a film with superior properties can be formed.

On the other hand, in the film-forming device of the comparative example shown in FIG. 6, the magnetic fields 10 of the two adjacent vaporization sources, e.g., the magnetic fields 10 between the arc vaporization source 5 and sputter vaporization sources 2, 3, are not mutually interconnected, and are independent.

Hence, the magnetic field 10 (magnetic force lines) in the same film-forming chamber 8 is open (open magnetic field), and electrons discharged from the vaporization sources are rapidly (easily) attracted by the chamber 8 in the direction of the magnetic fields 10 (magnetic force lines). As a result, when arc film-forming and sputter film-forming are performed simultaneously in the same film-forming chamber, the concentration of discharged electrons is sparse, collisions between the sputter gas and reaction gas are less, and gas ionization efficiency is low.

Therefore, in the film-forming device of the comparative example of FIG. 6, ion directionality from the two vaporization sources is weak, ion irradiation to the substrate decreases, and there is a higher possibility of interference with film-forming properties or film-forming efficiency.

(Verification of Ion Irradiation Increase)

The ion current flowing through the substrates 1 was measured using the film-forming devices shown in FIGS. 5, 6. In the film-forming device of the present invention shown in FIG. 5, an ion current of approximately 14 mA/cm$^2$ was found to be flowing through the substrates 1, showing that the ion current flowing through the substrates 1 had clearly increased. On the other hand, in the case of the film-forming device of the comparative example of FIG. 6, the ion current flowing through the substrates 1 was only about one half of this, i.e., 7 mA/cm$^2$, showing that the ion current flowing through the substrates 1 had not increased. This result also confirms that in the film-forming device of the present invention, ion irradiation to the substrate is increased so that a film with superior properties can be formed.

(Another Variation of the Film-Forming Device)

Next, another example of the film-forming device of the present invention will be described referring to FIG. 8. In the film-forming device shown in FIG. 8, the sputter vaporization sources 2, 3 and arc vaporization sources 5, 6 are not disposed in a circular arrangement as shown in FIG. 5, but are alternately disposed in a straight line in the chamber 8.

The arrangement of the vaporization sources may be a curve instead of a straight line, the number of vaporization sources being freely selected.

In the case of the film-forming device of the present invention of FIG. 8, the substrates 1 which are to be treated or the arc vaporization sources 5, 6 and sputter vaporization sources 2, 3 are relatively displaced by a suitable means, so that the substrates 1 alternately pass in front of the arc vaporization sources 5, 6 and sputter vaporization sources 2, 3. The hard film layer component is then vaporized using the arc vaporization sources 5, 6, and the hard film layer component is vaporized using the sputter vaporization sources 2, 3, respectively, in an atmosphere containing the reaction gas in the chamber 8, so that a hard film layer is alternately and sequentially deposited with a hard film layer on the substrates 1 to form the desired hard film.

Also in the film-forming device of the present invention of FIG. 8, the magnetic fields 10 of the two adjacent vaporization sources, e.g., the magnetic fields 10 of the arc vaporization source 5 and sputter vaporization sources 2, 3 are mutually interconnected. Specifically, the aforesaid magnetic field applying mechanism 4 is configured so that, during film-forming, the magnetic force lines of the adjacent vaporization sources are mutually interconnected. Therefore, the magnetic field 10 in the same film-forming chamber 8 is closed (closed magnetic field), and the electrons discharged from the vaporization sources are trapped by this closed magnetic field so that they are not easily attracted to the chamber 8 which is an anode like the substrates 1. As a result, in the same way as the film-forming device of the present invention of FIG. 5, the concentration of discharged electrons increases, collisions between the sputter gas and reaction gas increase, and high efficiency gas ionization can take place.

(Nitrogen Partial Pressure)

In the film-forming device of the present invention shown in FIGS. 5, 8 described above, it is preferred that nitrogen is mixed with the sputter gas so that the partial pressure of the mixed nitrogen is 0.5 Pa or more when the arc vaporization sources and sputter vaporization sources are operated simultaneously and a hard film containing nitrogen is formed.

As described above, in arc film-forming and sputter film-forming, the ambient gas conditions and pressure conditions largely differ. Consequently, for example, in K. H. Kim et al. Surf. Coat. Technol., when a hard film such as for example TiSiN is formed by operating the arc vaporization sources and sputter vaporization sources simultaneously, the ratio of Ar which is the sputter gas to the reaction gas such as nitrogen is 3:1, the total pressure is of the order of 0.08 Pa, the partial pressure of nitrogen is of the order of 0.02 Pa, Ti is vaporized by the arc vaporization sources and Si is vaporized by the sputter vaporization sources.

However, if film-forming is performed under these conditions, the partial pressure of nitrogen in the gaseous mixture is too low, so insufficient nitrogen is added to the hard film and macroparticles in the hard film increase. As a result, it is difficult to form a fine film.

To add sufficient nitrogen to the hard film, control the generation of macroparticles in the hard film, and form a fine film having superior surface properties as described above, the partial pressure of nitrogen mixed with the sputter gas is preferably 0.5 Pa or more.

Figure 3:
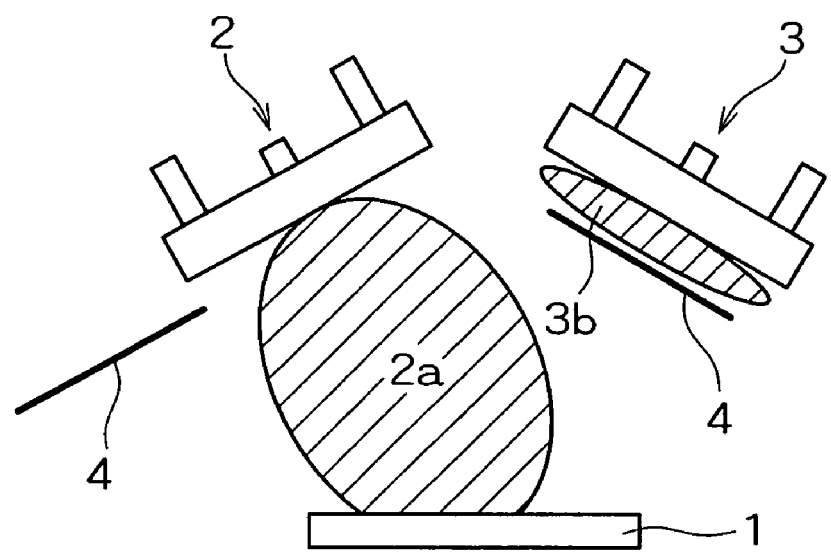
FIG. 3 is a descriptive diagram showing one aspect of a device for forming the hard film according to the present invention.

The effect of this nitrogen partial pressure was examined in the case of forming a TiAlCrN hard film by simultaneously operating the arc vaporization sources and sputter vaporization sources using the film-forming device shown in FIG. 3. While vaporizing a TiAl alloy (Ti50:Al50) by the arc vaporization sources, Cr was simultaneously vaporized by the sputter vaporization sources, and the ratio of Ar which was the sputter gas, to nitrogen which was the reaction gas (nitrogen partial pressure) was varied several times. On each occasion, the nitrogen content in the hard film (atomic %), the surface hardness Ra of the hard film and the Vickers hardness (Hv) were measured.

Figure 10:
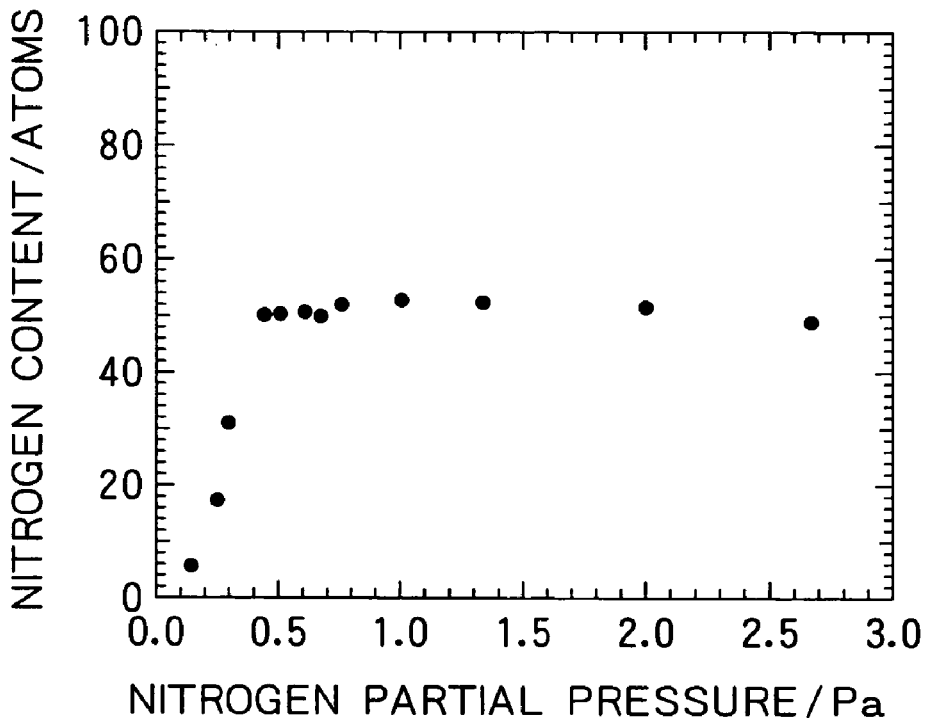
FIG. 10 is a descriptive diagram showing a relation between a nitrogen partial pressure and a nitrogen content of a hard film.
Figure 11:
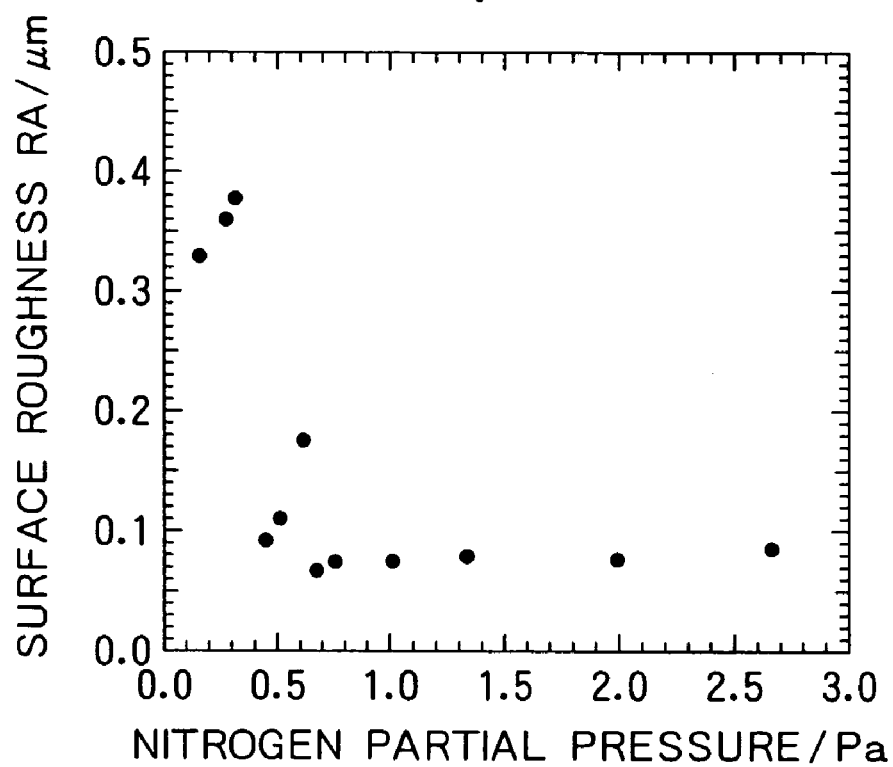
FIG. 11 is a descriptive diagram showing a relation between a nitrogen partial pressure and a surface roughness Ra of a hard film.

FIGS. 10-12 show the results obtained due to this nitrogen partial pressure. FIG. 10 shows the relation between the nitrogen partial pressure and the nitrogen content of the hard film, FIG. 11 shows the relation between the nitrogen partial pressure and the surface hardness Ra of the hard film, and FIG. 12 shows the relation between the nitrogen partial pressure and the Vickers hardness of the hard film.

As can be seen from FIG. 10, the nitrogen content of the hard film shows a clear difference at the boundary line where the nitrogen partial pressure is 0.5 Pa. Specifically, in the region wherein the nitrogen partial pressure is less than 0.5 Pa, the nitrogen content of the hard film considerably decreases more or less steadily compared to the region wherein the nitrogen partial pressure is 0.5 Pa or more. On the other hand, in the region wherein the nitrogen partial pressure is 0.5 Pa or more, the nitrogen content of the hard film is stable at a high level of approximately 50 atomic %.

As can be seen from FIG. 11, the surface hardness Ra of the hard film also shows a clear difference at the boundary line where the nitrogen partial pressure is 0.5 Pa. Specifically, in the region wherein the nitrogen partial pressure is less than 0.5 Pa, the surface hardness Ra of the hard film rapidly increases to approximately 0.38 µm. On the other hand, in the region wherein the nitrogen partial pressure is 0.5 Pa or more, the surface hardness Ra of the hard film is effectively stable at a low level of 0.1 µm or less.

Moreover, as can be seen from FIG. 12, the Vickers hardness of the hard film also shows a clear difference at the boundary line where the nitrogen partial pressure is 0.5 Pa. Specifically, in the region wherein the nitrogen partial pressure is less than 0.5 Pa, the Vickers hardness sharply decreases to a level of 1100 Hv. On the other hand, in the region wherein the nitrogen partial pressure is 0.5 Pa or more, the Vickers hardness of the hard film is stable at a high level of approximately 2500 Hv.

From these results, the importance of maintaining the partial pressure of nitrogen mixed with the sputter gas at 0.5 Pa or more in ensuring sufficient nitrogen addition to the hard film, suppressing the formation of macroparticles in the hard film and forming a fine film having superior surface properties, can be appreciated. It may be noted that these results and trends also apply to other hard films apart from the TiAlCrN which was studied, i.e., TiN, TiCN or TiAlN.

(Abnormal Electrical Discharge Due to Insulator Formation)

However, if film-forming is performed when the nitrogen partial pressure is 0.5 Pa or more, and arc film-forming and sputter film-forming are simultaneously performed in the same film-forming chamber, other problems may occur depending on the material used as the sputter vaporization source. Specifically, the sputter target material may react with the reaction gas to form an insulator (insulating substance) on the target material surface, and an abnormal electrical discharge (arcing) may occur in the sputter vaporization source due to this insulator. For example, if Si is used as the target material and this is sputtered in nitrogen, Si tends to react with nitrogen to form a SiN insulator on the target material surface which easily leads to this abnormal electrical discharge.

Even if this insulator does not form, if a compound is formed on the target material surface due to a reaction between the sputter target material and reaction gas, the vaporization rate in the sputter vaporization source may decrease due to the presence of this surface compound layer. These problems also interfere with high efficiency gas ionization.

In the prior art, to deal with these problems, the partial pressure of the reaction gas such as nitrogen relative to the inert sputter gas was maintained low to suppress reaction between the reaction gas such as nitrogen with the sputter target material, so that sputtering of the target material by the sputter gas was promoted.

This is also why, in K. H. Kim et al. Surf. Coat. Technol., when a hard film such as TiSiN was formed by simultaneously operating the arc vaporization sources and sputter vaporization source, the partial pressure of the reaction gas such as nitrogen relative to Ar, the sputter gas, was made low as described above.

However, as described above, when a film is formed using the film-forming devices shown in FIG. 5 or 6, there is a large difference between atmospheric compositions and pressure regions during arc film-forming and sputter film-forming. Therefore, when an arc vaporization source which requires a relatively high pressure and a sputter vaporization source are operated simultaneously to form a film, the partial pressure of the reaction gas such as nitrogen relative to the sputter gas must be increased, which increases the possibility that the aforesaid problems will occur.

(Method of Introducing Ambient Gas)

To deal with this problem, during film-forming, the sputter gas is introduced in the chamber in the vicinity of the sputter vaporization sources, and the reaction gas is introduced in the chamber in the vicinity of the arc vaporization sources. This arrangement is shown in FIG. 9. The basic construction of the film-forming device of the present invention in FIG. 9 is identical to that of FIG. 5, but during film-forming, the sputter gas is introduced in the vicinity of the sputter vaporization sources and the reaction gas is introduced in the vicinity of the arc vaporization sources.

More specifically, in the film-forming device of FIG. 9, during film-forming, the sputter gas is introduced in the vicinity of the sputter vaporization sources 3, 4 by a guide tube 12 and branch tubes 12a, 12b. Also, the reaction gas is introduced in the vicinity of the arc vaporization sources 5, 6 by a guide tube 11 and branch tubes 11a, 11b.

Due to this arrangement, in the vicinity of the sputter vaporization sources 3, 4, the partial pressure of the reaction gas such as nitrogen relative to the inlet sputter gas is maintained low, so that reaction between the reaction gas such as nitrogen with the sputter target material is suppressed, and sputter of the target material by the sputter gas is promoted.

On the other hand, the ratio of nitrogen which is the reaction gas relative to the sputter gas in the atmosphere in the chamber (nitrogen partial pressure) can be increased to enhance film-forming performance. Further, the pressure of the reaction gas can also be increased according to the film-forming conditions produced by the arc in the vicinity of the arc vaporization sources 5, 6.

Whether these ambient gases are introduced in conjunction with a magnetic field applying mechanism such as that shown in FIGS. 5, 9, or are used alone, mixing of the reaction gas such as nitrogen with the inert sputter gas does not easily occur, so the formation of an insulating film on the target surface due to the ionized gas mixture which leads to an abnormal electrical discharge, is suppressed. Hence, high efficiency gas ionization can take place.

(Abnormal Electrical Discharge Due to Magnetic Field)

Abnormal electrical discharge in the sputter target may be produced not by the formation of electrical insulator on the target material surface due to a reaction with the reaction gas such as nitrogen, but also due to other causes.

Figure 4:
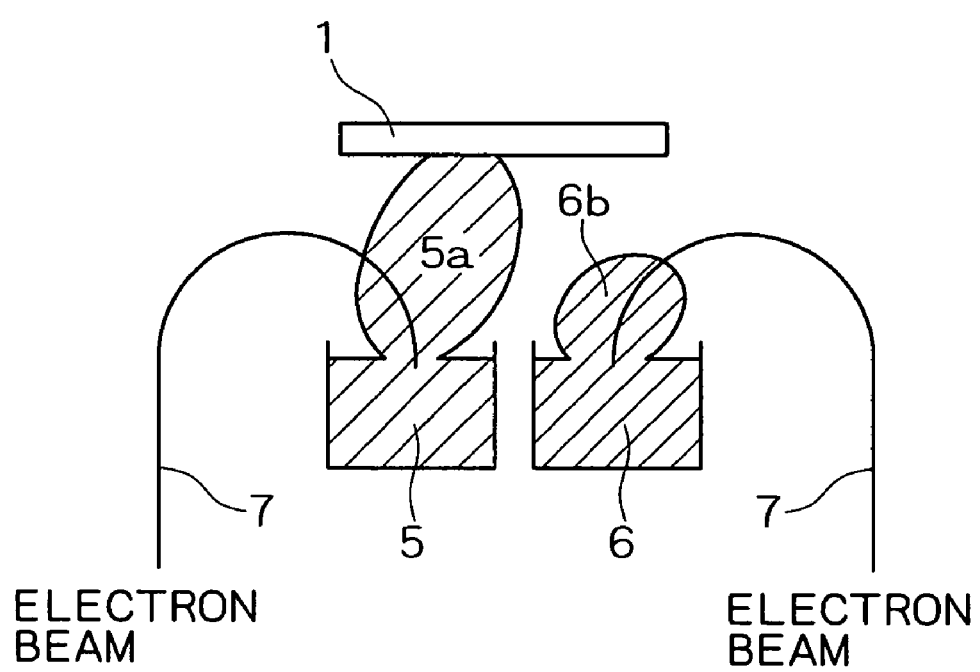
FIG. 4 is a descriptive diagram showing another aspect of a device for forming the hard film according to the present invention.
Figure 13A:
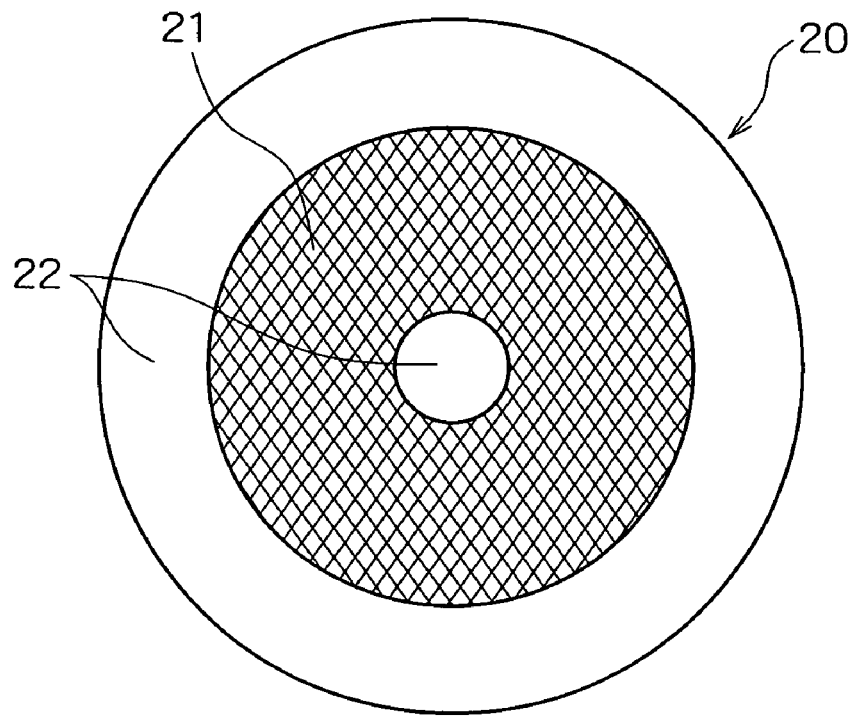
FIG. 13A shows one aspect of a sputter vaporization source according to the present invention and is a plan view of a sputter target material.
Figure 13B:
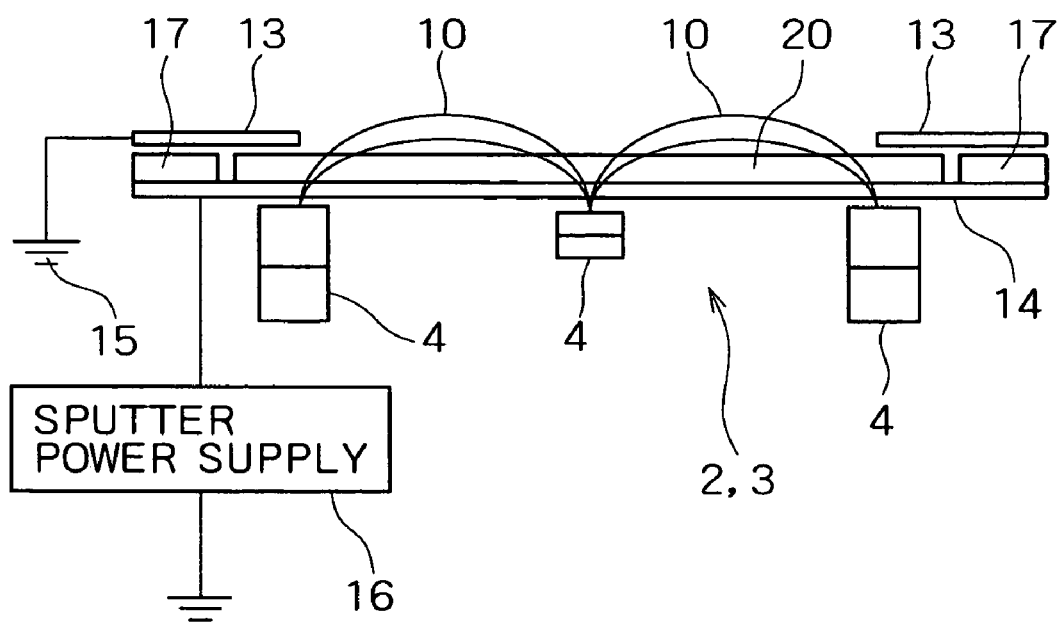
FIG. 13B shows one aspect of a sputter vaporization source according to the present invention and is a front view of the sputter vaporization source.
Figure 14A:
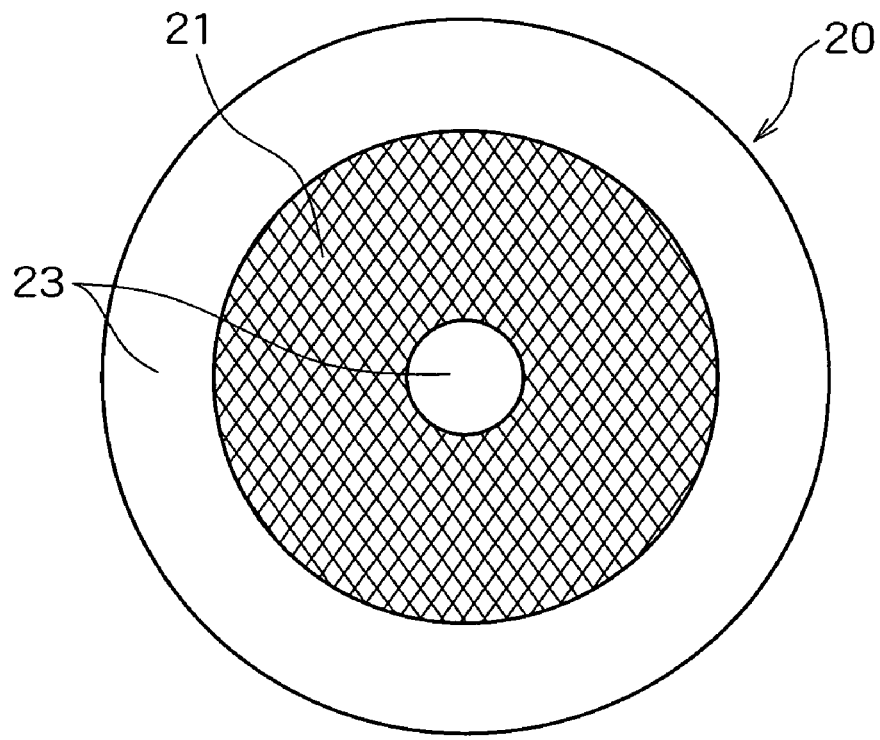
FIG. 14A shows another aspect of the sputter vaporization source according to the present invention and is a plan view of a sputter target material.
Figure 14B:
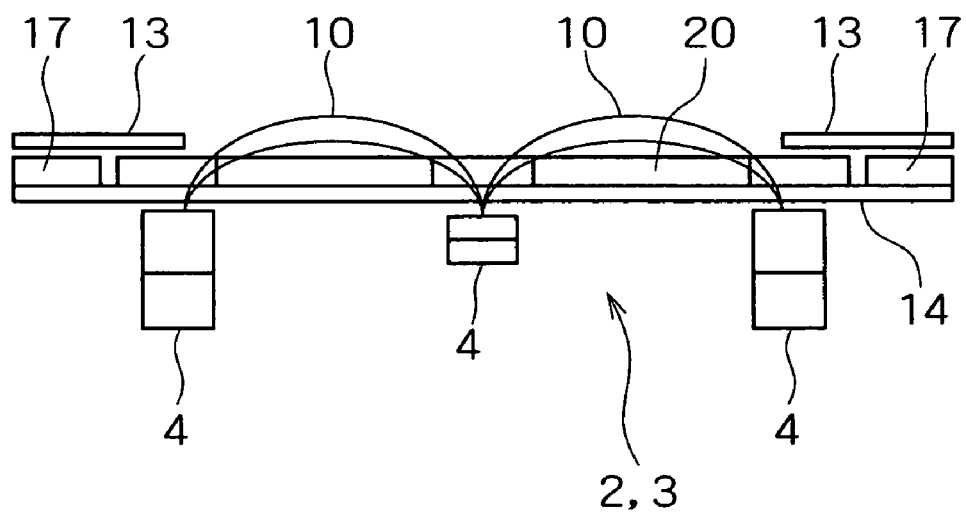
FIG. 14B shows another aspect of the sputter vaporization source according to the present invention and is a front view of the sputter vaporization source.

This may be described as a problem specific to sputter control by a magnetic field such as the aforesaid magnetic field applying mechanism 4. This problem will now be described in detail referring to FIGS. 13A, 13B. FIGS. 14A, 14B show the detailed construction of the sputter vaporization sources 2, 3. FIG. 13A is a plan view of a target material 20 in the sputter vaporization sources 2, 3, and FIG. 13B is a front view of the sputter vaporization sources 2, 3. In FIG. 13B, 4 is a magnetic field applying mechanism, 13 is a shield of the target material 20, 15 is a ground earth of the shield 13, 14 is a packing plate of the target material 20, 16 is a sputter power supply, and 17 is a jig for setting the target material 20.

As shown in FIG. 13B, the magnetron sputter vaporization sources 2, 3 using a magnetic field form the magnetic field 10 parallel to the surface of the target material 20, and as described above, electrons are deliberately trapped to increase the electron density, promote ionization of the sputter gas and increase sputter efficiency.

In this case, an erosion area 21 and a non-erosion area 22 are necessarily produced on the surface of the target material 20 shown in FIG. 13A. In the erosion area 21 which is the shaded part, many ions are produced from the sputter gas, the electron density is high, and sputter is promoted. On the other hand, in the non-erosion areas 22 of the center part of the target material 20 and the part surrounding the erosion area 21, hardly any sputter occurs. In the non-erosion areas 22, sputtered particles from the erosion area 21 react and combine with the reaction gas such as nitrogen, and tend to deposit. As a result, this deposited material forms an insulator (insulating film) on the surface of the target material, and may cause electrical discharge problems.

(Sputter Vaporization Source)

To deal with this problem, during film-forming, it is preferable that the voltage does not act on the non-erosion areas 22 of the sputter vaporization source.

One means of achieving this is to use a material which is an electrical insulator in the non-erosion areas outside the erosion area 21. FIGS. 14A and 14B show an example of this, the basic construction of the device being identical to that of FIGS. 13A and 13B. In FIGS. 14A and 14B, in non-erosion areas 23 in the center part of the target material 20 and the part surrounding the erosion area 21, a material which is an electrical insulator is used, and forms an insulator 23. This material is preferably a material having heat resistance such as BN (boron nitride) or alumina which can withstand the heat generated in the sputter vaporization source.

FIG. 15 shows another means of preventing a voltage from acting on the non-erosion area, wherein a shield is provided which is at a floating potential or at ground potential relative to the potential of the sputter target in a part outside the erosion area.

Figure 15A:
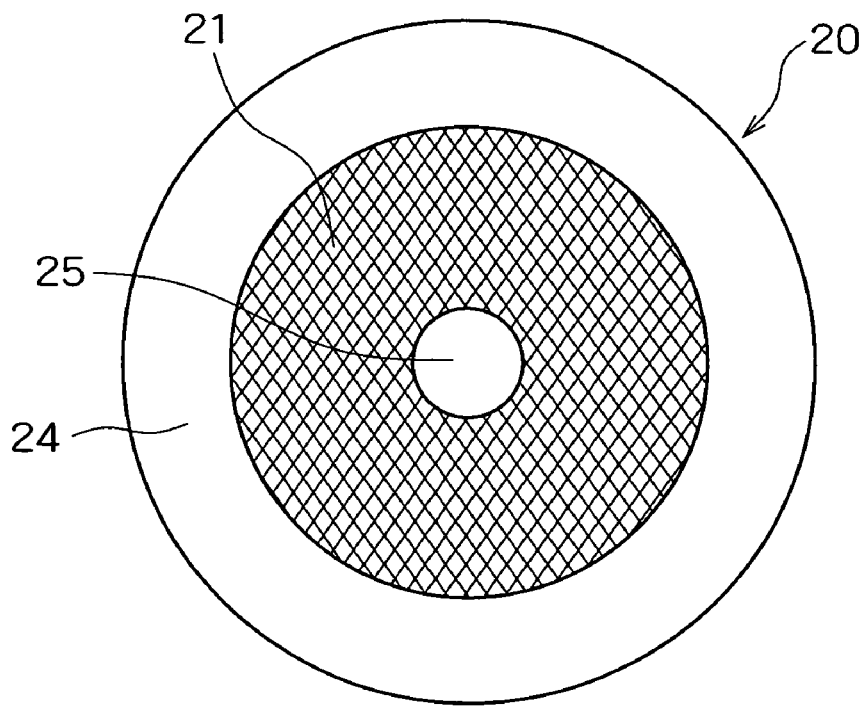
FIG. 15A shows yet another aspect of the sputter vaporization source according to the present invention and is a plan view of a sputter target material.
Figure 15B:
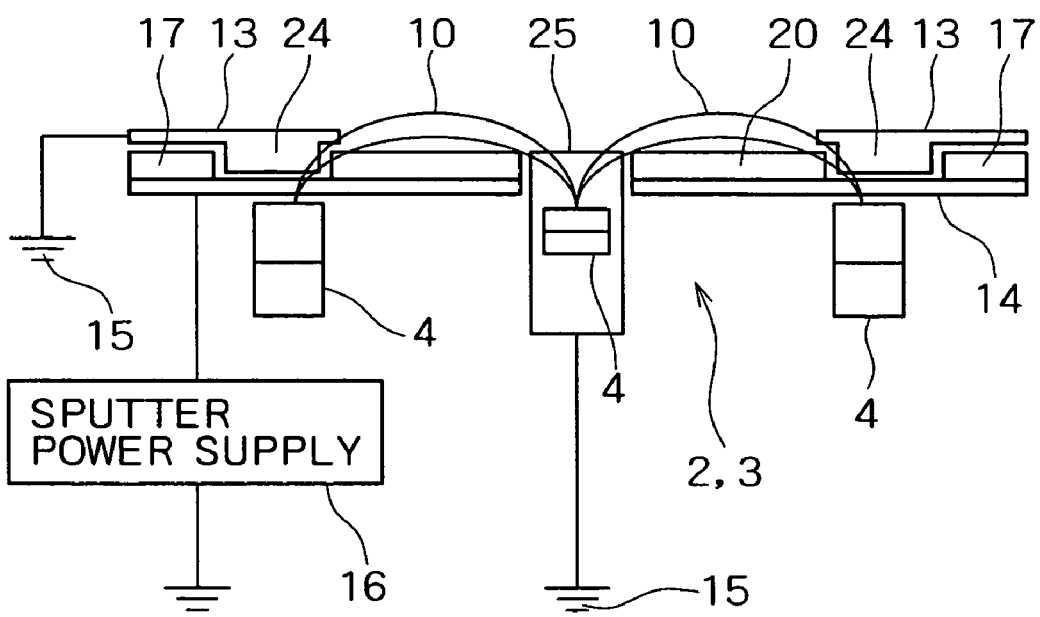
FIG. 15B shows yet another aspect of the sputter vaporization source according to the present invention and is a front view of the sputter vaporization source.

In FIGS. 15A and 15B, the basic construction of the device is also identical to FIGS. 13A and 13B. In FIGS. 15A and 15B, a shield which is at a floating potential is provided in a non-erosion area 25 in the center of the target material 20. A shield which is at ground potential (connected to a ground earth 15) is further provided in a non-erosion area 24 surrounding the erosion area 21.

In the constructions shown in FIG. 9 and FIG. 10 wherein a voltage is prevented from acting on the non-erosion areas 22, particles sputtered from the erosion area 21 react and combine with the reaction gas such as nitrogen on the non-erosion areas 23, and are not deposited. Therefore, electrical discharge problems are prevented from occurring.

Next, the method of forming the hard laminated films of the first-fourth embodiments will be described.

First, problems inherent in this film-forming method common to the first-fourth embodiments, and methods of resolving them, will be described.

One method of forming the hard laminated films of the first-fourth embodiments is for example to combine plural sputter vaporization sources 2, 3 as shown in FIG. 3 to form the hard film layers A, B on the substrate 1. In this case, for example, the hard film layer A component is vapor-deposited on the substrate 1 as a vapor-deposited substance 2a from the sputter vaporization source 2, and the hard film layer B component is vapor-deposited on the substrate 1 as a vapor-deposited substance 3b from the sputter vaporization source 3.

Also, as shown in FIG. 4, there is a method of forming the hard film layers A, B on the substrate 1 using plural electron beam vaporization sources 5, 6. In this case, for example, the hard film layer A component is vapor-deposited on the substrate 1 as a vapor-deposited substance 5a from the electron beam vaporization source 5, and the hard film layer B component is vapor-deposited on the substrate 1 as a vapor-deposited substance 6b from the electron beam vaporization source 6.

However, according to the present invention, it is most preferred to vaporize the hard film layer A using the arc vaporization source and vaporize the hard film layer B using the sputter vaporization source to form the film of the present invention in an atmosphere containing the reaction gas, as shown in FIG. 5. This film-forming method of combining the arc vaporization source with the sputter vaporization source and successively displacing or passing the substrate in front of the arc vaporization source and sputter vaporization source, so that the hard film layer A component from the arc vaporization source and the hard film layer B component from the sputter vaporization source are alternately and sequentially deposited on the substrate, has the following advantages compared to the film-forming methods of FIGS. 3, 4.

The most significant advantage is that in the case of arc vaporization, the film-forming rate is faster than that of sputter vaporization. Hence, the layer A, whereof the thickness must be about 5 times or more than that of layer B, can be deposited at high speed by forming the hard film layer A component by an arc vaporization source. Further, as a sputter vaporization source permits easier adjustment of the film-forming rate than an arc vaporization source, and can be operated when the input power is very small (e.g., 0.1 kW), the thickness of a thin-film layer such as the layer B can be precisely controlled.

Further, by combining the features of arc vaporization with those of sputter vaporization, the ratio of the thicknesses of layer A and layer B can be set within a preferred range from the ratio of powers input to the arc vaporization source and sputter vaporization source, and by subsequently varying the number of revolutions (rotation speed, displacement speed) of the substrate, the repeat period of layer A+layer B can be determined as desired. The thickness of layer A (in the first-third embodiments, the crystal particle size) can also be set as desired.

The method of forming the hard laminated film (film-forming method) of the first embodiment will now be described.

The reason why it is preferred to use the device of FIG. 5 will be explained taking the case wherein layer A is TiN and layer B is SiN. If the sputter vaporization sources 2, 3 shown in FIG. 3 were simply combined, TiN, SiN could be used as targets, or sputter could be performed using Ti, Si as targets alternately in a mixed gas atmosphere of Ar, the sputter gas, and nitrogen, the reaction gas. The thicknesses of the layers A, B can be adjusted by controlling the operating time of the sputter vaporization sources or the film-forming time using a shutter disposed in front of the source. However, as the film-forming rate is slow in the sputter method, considerable time is required to form the layer A having the required film thickness of about 5 times that of layer B, which therefore cannot be described as efficient.

If the electron beam vaporization shown in FIG. 4 were used, Ti, Si could be melted by the electron beam vaporization sources 5, 6 to form the layers A, B. However, in the electron beam method, due to the remaining amount of vaporized material in the electron beam vaporization sources 5, 6 (crucible), the vaporization rate varies and it is difficult to control the film thicknesses of the layers.

Hence, the hard film layer A component is vaporized using the arc vaporization sources 5, 6 and the hard film layer B component is vaporized using the sputter vaporization sources 2, 3 in an atmosphere containing the reactive gas inside the chamber 8 so that the layers A, B are alternately and sequentially deposited on the substrate 1 to form the hard film of the present invention.

Taking the case wherein layer A is TiN and layer B is Si, according to this invention, Ti which is the layer A component is vaporized by the arc vaporization sources 5, 6, and Si which is the layer B component is vaporized by the sputter vaporization sources 2, 3. Film-forming is performed in Ar, the sputter gas, and nitrogen, the reaction gas, and the substrate 1 is rotated so that it passes alternately in front of the arc vaporization sources and sputter vaporization sources. Hence, TiN and SiN are alternately and sequentially deposited on the substrate, and the laminated hard film of TiN+SiN of the present invention can easily be formed.

Next, the method (film-forming method) of forming the hard laminated film of the second embodiment will be described.

In the method of forming the hard laminated film of the second embodiment, using a film-forming device (FIG. 5: hereafter, "composite film-forming device") comprising one or more each of an arc vaporization source having a magnetic field applying mechanism and a sputter vaporization source, the substrate is rotated in a gas mixture comprising a sputter gas such as Ar, Ne, Xe and a reaction gas such as nitrogen, methane, acetylene or oxygen. The layer A component is vaporized by the arc vaporization source while the layer B component is vaporized by the sputter vaporization source in alternation (reactive film-forming), so that the layer A and layer B are deposited alternately. The reason for changing over the vaporization source for layer A and layer B was described hereinabove.

When layer B is a layer comprising (B, N), (Si, C, N) or (C, N), film-forming must be performed using a target such as B, BN, $B_4C$, Si or C, but B and BN are insulating substances, so in an arc vaporization source, an electrical discharge does not occur and film-forming cannot be performed. Likewise, although $B_4C$, Si, C are conducting substances, their electrical discharge is unstable and in an arc vaporization source, film-forming is difficult.

If on the other hand, a sputter vaporization source is used to form both layer A and layer B, unlike the arc vaporization source, although the sputter vaporization source can be operated with a very low input power, the film-forming rate is slower than for the arc vaporization source, and the hardness of the film which is formed is also poorer compared to the arc vaporization source.

Therefore in this embodiment, preferably, to form layer A, Cr or CrX (wherein, X is 1, 2 or more elements selected from among a group comprising Ti, Zr, Hf, V, Nb, Ta, Mo, W, Al and Si) is used as a target in an arc vaporization source, to form layer B, a B, BN, $B_4C$, Si or C target is used in a sputter vaporization source, and the substrate is rotated in a gas mixture of sputter gas and reaction gas so as to deposit layer A and layer B alternately to form the film.

It should be noted that if a B or BN target is used, it has no electrical conductivity so RF sputter is used as the sputter vaporization source, but if a $B_4C$, Si or C target is used, it does have electrical conductivity, so both DC and RF may be used as the sputter vaporization source.

To form layer A, not only Cr or CrX (wherein, X is 1, 2 or more elements selected from among a group comprising Ti, Zr, Hf, V, Nb, Ta, Mo, W, Al and Si), but also Cr (B, C, O, N) or (Cr, X) (B, C, O, N) can be formed using a target to which one or more elements selected from among B, C, O, N have been added.

The partial pressure of the gaseous mixture comprising the sputter gas and reaction gas during film-forming is preferably 0.6 Pa or more, but more preferably 1 Pa or more. The total pressure of the gaseous mixture is not particularly limited, but considering that an equivalent amount of sputter gas to that of reaction gas will be introduced, 1 Pa or more is a general guideline. However, under high pressure, abnormal electrical discharge may occur with sputter vaporization sources and arc vaporization sources, so the total pressure should not exceed 5 Pa.

Next, the method (film-forming method) of forming a hard laminated film of the third embodiment will be described.

In the third embodiment also, the most preferred method is to use a film-forming device comprising one or more each of an arc vaporization source and a sputter vaporization source in the same vacuum vessel as shown in FIG. 5. The arc vaporization source and sputter vaporization source are simultaneously operated in a film-forming atmosphere containing the reaction gas, the layer A component is vaporized by the arc vaporization source and the layer B component is vaporized by the sputter vaporization source, and the substrate is displaced relative to the vaporization sources so as to alternately deposit the layer A and layer B on the substrate.

One reason for this is that the film-forming rate of the sputter method is slow. Layer B mainly comprises B, Si, C and Cu as in Formulae 2-5. Hence, if a target comprising mainly these elements (e.g., Si, $B_4C$, C) is used in an arc discharge, the electrical discharge is very unstable, and due to the thermal load of the arc discharge, these targets may shatter. Moreover, a Cu target may discharge a large amount of molten drops (macroparticles) due to vaporization by the arc discharge. Therefore, from the viewpoint also of layer B target properties, layer B is preferably formed by a sputter vaporization source.

Taking the case wherein the layer A is TiAlN and the layer B is BCN, according to the present invention, Ti, Al which are layer A components are vaporized by the arc vaporization sources 5, 6, and B, C which are layer B components are vaporized by the sputter sources 2, 3. The film-forming is then performed in Ar, the sputter gas, and nitrogen, the reaction gas. The substrate 1 is rotated as described above, and by alternately passing the substrate in front of the arc vaporization source and sputter vaporization source, TiAlN and BCN are alternately and sequentially deposited on the substrate so that the laminated hard film of the present invention can easily be formed.

In the film-forming method of the third embodiment described above, when the arc vaporization sources and sputter vaporization sources are simultaneously operated to form the hard film containing nitrogen, the film-forming atmosphere is a mixture of a reactive gas (reaction gas) such as nitrogen, methane or acetylene, and a sputter inert gas such as Ar (argon), Ne (neon) or Xe (xenon).

The partial pressure of the mixed reactive gas is preferably 0.5 Pa or more. If film-forming is performed when the partial pressure of the mixed reactive gas is less than 0.5 Pa, insufficient nitrogen is added to the hard film and macroparticles in the hard film also increase. Consequently, a fine film can no longer be obtained.

Thus, to add sufficient nitrogen to the hard film, suppress production of macroparticles in the hard film and form a fine film with superior surface properties, the partial pressure of the reactive gas mixed with the sputter gas is preferably 0.5 Pa or more, as described above.

Next, the method (film-forming method) of forming a hard laminated film of the fourth embodiment will be described.

In the fourth embodiment also, the most preferred method is to use a film-forming device comprising one or more each of an arc vaporization source and a sputter vaporization source in the same vacuum vessel, as shown in FIG. 5. The arc vaporization source and sputter vaporization source are simultaneously operated in a film-forming atmosphere containing the reaction gas, the layer A component is vaporized by the arc vaporization source and the layer B component is vaporized by the sputter vaporization source, and the substrate is displaced relative to the vaporization sources so as to alternately deposit the layer A and layer B on the substrate.

One reason for this is that the film-forming rate of the sputter method is slow. If the layers A, B are respectively formed on the substrate using only plural sputter vaporization devices, the thicknesses of the layers A, B can be controlled by controlling the operating times of the sputter vaporization devices or the film-forming time using a shutter disposed in front of the substrate. However, as the film-forming rate in the sputter method is slow, considerable time is required to form the layer A having the required thickness of twice or more that of the layer B, which cannot be described as efficient.

Also, the layer B contains W, Mo, V or Nb as in the composition of Formula 3, and a target comprising mainly these elements has a high melting point, so in an arc discharge, the electrical discharge may be unstable due to voltage increase. From this viewpoint also, it is preferred to form the layer B by a sputter vaporization source and form the layer A by an arc vaporization source.

Taking the case wherein the layer A is TiAlN and the layer B is WN, according to the present invention, Ti, Al which are layer A components are vaporized by the arc vaporization sources 5, 6, and W which is the layer B component is vaporized by the sputter sources 2, 3. The film-forming is then performed in Ar, the sputter gas, and nitrogen, the reaction gas. The substrate 1 is rotated as described above, and by alternately passing the substrate in front of the arc vaporization source and sputter vaporization source, TiAlN and WN are alternately and sequentially deposited on the substrate so that the laminated hard film of the present invention can easily be formed.

(Partial Pressure of Reaction Gas)

In the film-forming method of the fourth embodiment described above, when the arc vaporization sources and sputter vaporization sources are simultaneously operated to form the hard film containing nitrogen, the film-forming atmosphere is a mixture of a reactive gas (reaction gas) such as nitrogen, methane or acetylene, and a sputter inert gas such as Ar (argon), Ne (neon) or Xe (xenon).

The partial pressure of the mixed reactive gas is preferably 0.5 Pa or more. If film-forming is performed when the partial pressure of the mixed reactive gas is less than 0.5 Pa, insufficient nitrogen is added to the hard film and macroparticles in the hard film also increase. Consequently, a fine film can no longer be obtained.

To add sufficient nitrogen to the hard film, suppress production of macroparticles in the hard film and form a fine film with superior surface properties, the partial pressure of the reactive gas mixed with the sputter gas is preferably 0.5 Pa or more, as described above.

Next, the present invention will be described in detail referring to specific examples, but it should be understood that the invention is not to be construed as being limited in any way thereby, various modifications being possible within the scope and spirit of the appended claims which are hereby included in the present invention by inference.

First, an example of the first embodiment will be described.

EXAMPLE 1-1

The effect of the crystal structure of layer B was examined as follows. Specifically, a material having a cubic rock-salt crystal structure was selected as layer A, a material having the same cubic rock-salt crystal structure or a different crystal structure was selected as layer B, and it was verified whether the fineness of the crystal particles had any effect.

Specifically, a film having the laminated structure shown in Table 1 was formed using a sputter film-forming device containing two sputter vaporization sources 2, 3 shown in FIG. 3. The substrate 1 was a super-hard alloy (with mirror-polished surface) used for hardness measurements. After introducing this substrate into the device of FIG. 3, the substrate temperature was raised to about 400-500° C., the device was placed under a vacuum of $3 \times 10^{-3}$ Pa or less, cleaning was performed with Ar ions (pressure 0.6 Pa, substrate voltage 500V, treatment time 5 minutes), and films were then successively formed.

For film-forming, metal films were formed in a pure Ar atmosphere, nitrides were formed in a mixture of Ar and nitrogen (mixing ratio 65:35), and carbonitrides were formed in a mixture of Ar, nitrogen and methane (mixing ratio 65:30:5), the total pressure being constant at 0.6 Pa.

The thicknesses of layer A and layer B were adjusted by varying the operating time of the sputter vaporization sources. The thickness of layer A was constant at 50 nm and the thickness of layer B was constant at 10 nm, and layer A and layer B (lamination units) were repeatedly deposited a total of 50 times to form a film of thickness approximately 3000 nm. After film-forming, a sample was taken, and the film cross-section was examined by TEM at a magnification of 45000 times to see whether or not the crystal particles had increased fineness, as can be seen in FIG. 1. If this effect was present, 0 was marked, and if the effect was absent, X was marked. These results are shown in Table 1.

As shown in Table 1, in the case of Comparative Examples Nos. 1-4, a material having a cubic rock-salt crystal structure was selected as layer A, and a material having a cubic rock-salt crystal structure was also selected as layer B. Therefore, the crystal particles grew continuously without interruption of crystal growth between layer A and layer B, and the crystal particles did not become any finer.

On the other hand, in Inventive examples Nos. 5-13, when a material having a different crystal structure to that of layer A was selected as layer B, as can be seen in FIG. 1, the crystals did not grow continuously between layer A and B, and as a result the crystal particles of layer A were reduced to a fineness of the order of the thickness of layer A (50 nm). Also, the AlN used for layer B of Comparative Example No. 4 is a material which has a stable cubic $B_4$ structure, but when it was deposited together with the material of layer A which has a rock-salt structure as in this example, the AlN layer assumed a rock-salt structure in the film which was formed and there was no increase in the crystal particle fineness of layer A.

From the above results, it was found that when a hard laminated film of layer A having a cubic rock-salt structure was formed, the crystal particles did not become finer unless a material having a crystal structure different from that of the cubic rock-salt structure of layer A, was selected.

EXAMPLE 1-2

The effect of the crystal structure of layer B was further investigated based on the results of Example 1-1. Specifically, the presence or absence of increased crystal particle fineness and film hardness were examined when a hard film material having a rock-salt cubic crystal structure such as TiAlN, CrN, TiN was selected as layer A, a material having a crystal structure different from a rock-salt cubic crystal structure such as Cu, Co, SiN, BN or a material having a rock-salt cubic crystal structure such as CrN, MoN, WN, TaN, AlN was selected as layer B, or layer B was not provided at all.

Specifically, when the sputter film-forming device comprising the two sputter vaporization sources 2, 3 shown in FIG. 3 and the composite arc/sputter film-forming device shown in FIG. 5 were used in conjunction, a film having the laminated structure shown in Table 2 was formed. The substrate was the same superhard alloy (mirror surface-polished) used for hardness measurement in Example 1-1. After introducing the substrate into the aforesaid two devices, the substrate temperature was heated to about 400-500° C., the devices were placed under a vacuum of $3 \times 10^{-3}$ Pa or less, cleaning with Ar ions was performed (pressure 0.6 Pa, substrate voltage 500V, treatment time 5 minutes), and films were then formed.

In the case of the sputter film-forming device shown in FIG. 3, to form a nitride, film-forming was performed in a gaseous mixture of Ar and nitrogen (mixing ratio 65:35), and to form a carbonitride, film-forming was performed in a gaseous mixture of Ar, nitrogen and methane (mixing ratio 65:30:5) under a total pressure of 0.6 Pa. The thicknesses of layer A and layer B were adjusted by varying the operating times of the vaporization sources.

In the case of the composite film-forming device shown in FIG. 5, to form a nitride, film-forming was performed in a gaseous mixture of Ar and nitrogen (mixing ratio 50:50), and to form a carbonitride, film-forming was performed in a gaseous mixture of Ar, nitrogen and methane (mixing ratio 50:45:5) under a total pressure of 2.66 Pa. The thicknesses of layer A and layer B were determined by the power ratio input to the vaporization sources, and the thickness ratio of layer A+layer B was determined by the substrate rotation period. The film thickness was constant at about 3 μm. Layer A was formed by the arc vaporization source, and layer B was formed by the sputter vaporization source.

The hardness, which is a mechanical property of the film, was measured a micro Vickers gauge (load 25 gf). The crystal structures of layer A, layer B were analysed by TEM observation of a film cross-section at a magnification of 45000 times, the film thicknesses and crystal particle sizes of layer A, layer B were determined from the cross-sectional TEM images, and the presence or absence of increased crystal particle fineness of layer A was evaluated in an identical way to that of Example 1-1. These test results are shown in Table 2.

As can be seen from Table 2, it was only when a hard film material having a rock-salt cubic crystal structure such as TiAlN, CrN, TiN was selected as layer A, and a material having a crystal structure different from a rock-salt cubic crystal structure such as Cu, Co, SiN, BN was selected as layer B, as in the case of Inventive examples Nos. 20, 21, 24-27, 29, that an increase of crystal particle fineness and a corresponding remarkable increase of film hardness was observed.

On the other hand, when layer B was not provided as in Comparative Examples Nos. 14-19, or when a material having a rock-salt cubic crystal structure was selected as layer B as in Comparative Examples Nos. 22, 23, 28, there was no increased crystal particle fineness and the film hardness was also lower.

EXAMPLE 1-3

Next, the effect of the thickness of layer B comprising a material having a crystal structure other than a rock-salt cubic crystal structure on the increased fineness of the crystal particles of layer A, was examined.

The film-forming device was the same sputter device and composite film-forming device as that of Example 1-2. As layer A, $(Ti_{0.5}Al_{0.5})N$, CrN and TiN having a high hardness were selected as typical examples of materials having a halide cubic crystal structure, and as layer B, SiN, BN and Cu were selected. To form the layers of SiN, BN and Cu, Si, $B_4C$ and Cu targets were used.

The thickness of layer A was constant at 30 nm, and the thickness of layer B was varied within the range of 0.2-100 nm to examine the effect of the thickness of layer B on the increased fineness of the crystal particles. As in the case of Example 1-2, a hardness measurement and the presence or absence of increased fineness of crystal particles was investigated by cross-sectional TEM or a sample material obtained after film-forming. The results are shown in Table 3.

In Table 3, in a comparison within groups Nos. 30-36, 37-43, 44-50 for which conditions other than the thickness of layer B were identical, in all these groups, there was no increased fineness of crystal particles for Nos. 30, 37, 44 wherein the thickness of layer B was 0.2 nm which is less than 0.5 nm. Therefore, the thickness of layer B is preferably at least of the order of 0.5 nm or more which exceeds this 0.2 nm.

Also, in Table 3, on the other hand, for Nos. 35, 36, 42, 43 or 49, 54 wherein the thickness of layer B relative to layer A exceeds one half of the thickness of layer A and is relatively large, the properties of layer B are predominant in the properties of the film which is formed overall. As a result, compared to Nos. 31-34, 38-41 or 45-48 wherein the thickness of layer B relative to layer A in each group is relatively small, a remarkable hardness increase was no longer observed. Therefore, it is seen that the thickness of layer B is preferably one half or less than the thickness of layer A.

EXAMPLE 1-4

Next, the effect of the thickness of layer A on increased crystal particle fineness and hardness of the hard film was examined.

$(Ti_{0.5}Al_{0.5})N$ as layer A and SiN as layer B were formed under identical conditions to those of Example 1-2 using the composite film-forming device of FIG. 5 used in Example 1-2. The thickness of layer B was constant at 2 nm, and the thickness of layer A was varied within the range of 1-300 nm to manufacture a sample material. For this sample material, as in the case of Example 1-2, a hardness measurement was performed and the fineness increase of the crystal particles was investigated by cross-sectional TEM. These test results are shown in Table 4.

From Table 4, in the case of No. 51 for which the thickness of layer A is as thin as 1 nm relative to the thickness of layer B, 2 nm, the properties of layer B are predominant in the film overall and the crystal particles do become finer, but compared to the other Nos. 52-55, the hardness declines. On the other hand, in the case of No. 53 for which the thickness of layer A exceeds 200 nm, there is no increase of crystal particle fineness, so the size of the crystal particles approaches that of prior art products and the hardness is effectively identical to that of prior art products. Therefore, the thickness of layer A is preferably within the range of 2-200 nm.

EXAMPLE 1-5

Next, increase of oxidation resistance depending on the material selected as layer B was examined from the oxidation start temperature of the hard film.

Again using the composite film-forming device of FIG. 5 which was used in Example 1-2, $(Ti_{0.5}Al_{0.5})N$ as layer A, and SiN, BN, MoN and Ti as layer B, were used to form a platinum foil (thickness 0.1 mm). The film thicknesses of layer A and layer B were constant at 2 nm, and a total of approximately 90 layers of layer A+layer B were laminated to form the film.

The oxidation increase of the film formed was measured in the temperature range up to 1000° C., and the oxidation resistance was examined. To examine the oxidation resistance, a heat balance was used to raise the temperature to 1000° C. at a temperature increase rate of 4° C./minute in dry air, and the oxidation start temperature was determined from the weight increase due to oxidation.

As can be seen from Table 5, in the case of Inventive examples Nos. 58, 59 wherein SiN, BN were selected as layer B, compared to Comparative Example 57 corresponding to prior art materials wherein layer B was not provided and Comparative Example 60 having a rock-salt crystal structure which had an oxidation start temperature of 850° C., the oxidation start temperature increased to 900° C. Therefore, in the film structure of the present invention, it is seen that if SiN, BN are selected as layer B, not only do SiN, BN increase hardness, but they also improve oxidation resistance. It may be noted that in the case of Invention No.

61 wherein Ti is selected as layer B, the crystal particle fineness of layer A does increase, but the oxidation start temperature is lower.

EXAMPLE 1-6

Next, as regards differences in film-forming conditions, the effect on film-forming when the magnetic force lines of the arc vaporization source and sputter vaporization source were connected, and the effect when these magnetic force lines were not connected, were examined. The film was essentially formed under the same conditions as those of the previous examples, i.e., layer A was $(Ti_{0.5}Al_{0.5})N$ or CrN to a thickness of 30 nm, layer B was SiN or BN to a thickness of 3 nm, and a total of 90 layer A+layer B units was deposited.

This film was formed using the composite film-forming device of FIG. 5, but for comparison purposes, film-forming was performed using a device wherein the magnetic force lines of the arc vaporization source and sputter vaporization device of FIG. 5 were connected, and a device wherein the magnetic force lines of these vaporization devices of FIG. 6 were not connected. The test results are shown in Table 6. The devices and film-forming conditions in FIG. 5 and FIG. 6 are identical to those of FIG. 5 in Example 1-2.

As can be seen from Table 6, for Nos. 62, 64 wherein the magnetic force lines were connected (FIG. 5), compared to Nos. 63, 65 wherein the magnetic force lines were not connected (FIG. 6), (Nos. 62 and 63, 64 and 65), properties were substantially identical as regards oxidation resistance, but hardness was high.

From these results, it is seen that a harder film can be formed when the magnetic force lines are connected due to an increase of ion density.

[Table 1]
[Table 2]
[Table 3]
[Table 4]
[Table 5]
[Table 6]

Next, an example of the second embodiment will be described.

EXAMPLE 2-1

Films having the laminated structures shown in Table 7 were formed using a sputter film-forming device comprising two sputter vaporization sources shown in FIG. 3 or the composite film-forming device comprising two each of the sputter vaporization sources and arc vaporization sources shown in FIG. 5.

The substrate was a super-hard alloy (mirror surface-polished) used for hardness measurements. Whether the sputter film-forming device or the composite film-forming device was used, the substrate was introduced into the device, the substrate temperature was raised to about 400-500° C., the device was placed under a vacuum of $3 \times 10^{-3}$ Pa or less, cleaning was performed with Ar ions (pressure 0.6 Pa, substrate voltage 500V, treatment time 5 minutes), and films were then successively.

Formed.

For film-forming by the sputter film-forming device, metal films were formed in a pure Ar atmosphere, nitrides were formed in a mixture of Ar and nitrogen (mixing ratio 65:35), and carbonitrides were formed in a mixture of Ar, nitrogen and methane (mixing ratio 65:30:5), the total pressure being constant at 0.6 Pa. The thicknesses of layer A and layer B were adjusted by varying the operating time of the vaporization sources. The targets were metallic Cr and B.

In the case of the composite film-forming device, film-forming was performed in a gaseous mixture of Ar and nitrogen (mixing ratio 50:50), and to form a carbonitride, film-forming was performed in a gaseous mixture of Ar, nitrogen and methane (mixing ratio 50:45:5), the total pressure being 2.66 Pa. The film thickness ratio of layer A and layer B was adjusted by the power ratio input to the vaporization sources, and the thicknesses of layer A and layer B were adjusted by the substrate rotation speed.

The film thickness was constant at about 3 µm. Layer A was formed by the arc vaporization source, and layer B was formed by the sputter vaporization source. The target was metallic Cr for the arc vaporization source, and electrically conducting $B_4C$ for the sputter vaporization source.

First, using the sputter film-forming device and the composite film-forming device, films were formed wherein layer A was CrN, layer B was $B_{0.45}C_{0.1}N_{0.45}$, the thickness of layer A was 30 nm and the thickness of layer B was varied within the range of 0.2-50 nm (Nos. 2-7, 9-14). For comparison, film-forming was performed using only layer A as an example of the prior art (Test Nos. 1, 8).

Next, using only the composite film-forming device, the composition of layer A was changed to $Cr_2N$, and film-forming was performed under identical conditions to the above (Test Nos. 15-21).

Figure 7A:
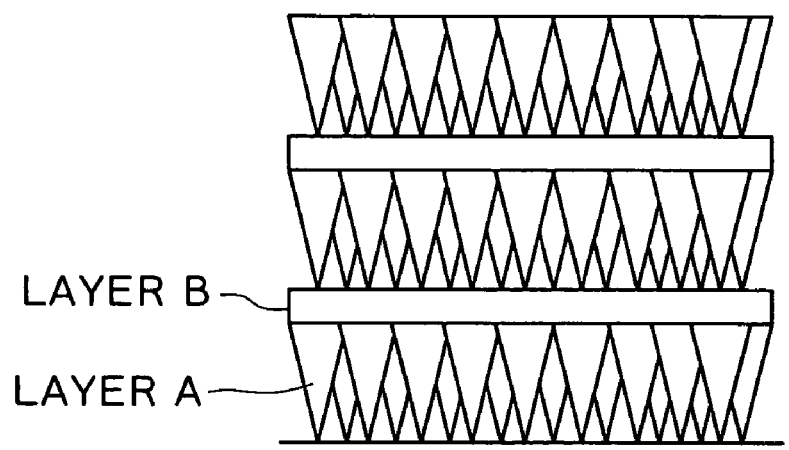
FIG. 7A is a diagram showing the microstructure of a cross-section in the thickness direction of the hard film according to the present invention and is a schematic view.
Figure 7B:
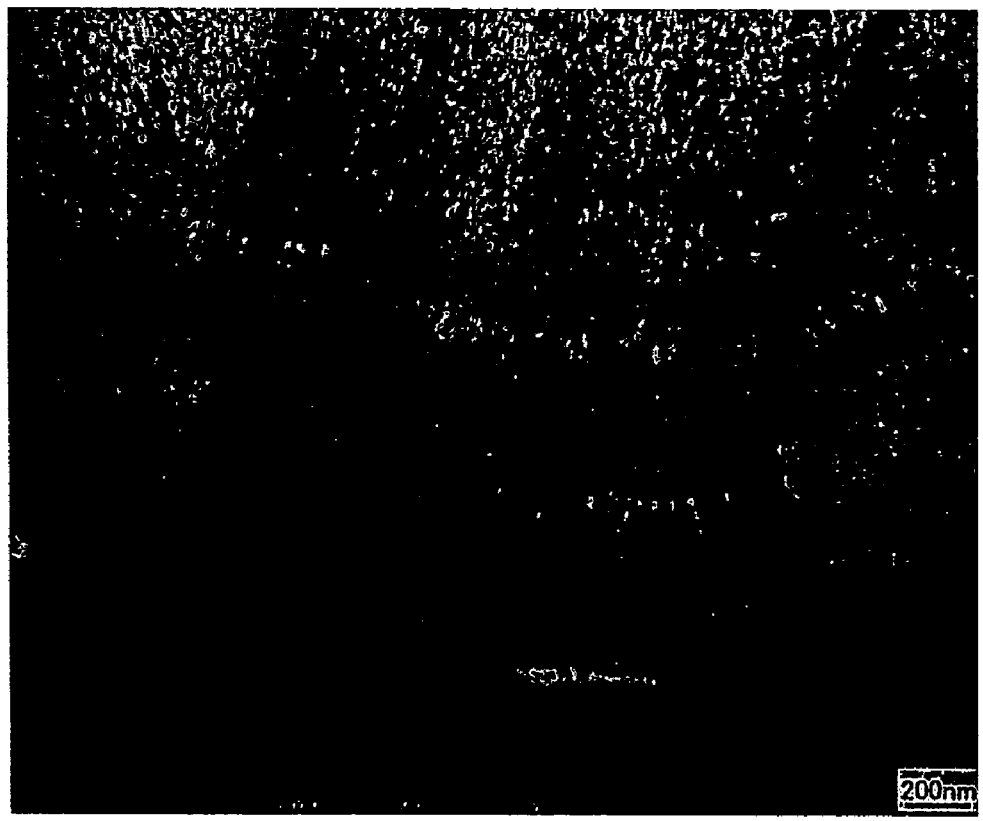
FIG. 7B is a diagram showing the microstructure of a cross-section in the thickness direction of the hard film according to the present invention and is a vertical section.

As a result of performing cross-sectional TEM observations on the test samples obtained after film-forming, an increased fineness of crystal particles was found as can be seen from FIG. 7. The crystal particle size was marked by X when it was of the same order as that of a prior art film which did not have a laminated structure, and by O when it was smaller than a prior art film.

The thicknesses of the layers A, B after film-forming were measured by observing in two views at a magnification of 500000-1500000 times.

The proportion of metal elements and elements such as N, C, O in the film was computed from the composition profile in the sampling depth direction while sputtering with Ar ions from the surface by Auger electron spectroscopy.

The hardness of the obtained film was measured by a micro Vickers hardness metre (load 25 gf [≈0.245 N], retention time 15 seconds).

The wear resistance and aggressiveness of the film with respect to a partner material were evaluated using a ball-on-plate type back-and-forth sliding wear and friction resistance tester. Sliding tests were performed using bearing steel (SUJ2, HRC60) of diameter 9.53 mm as the partner material (ball) in a dry atmosphere at a sliding speed of 0.1 m per second, load of 2N and sliding distance of 250 m. The frictional coefficient during sliding and the respective wear rates of the ball and film were measured, and the film properties were evaluated.

An X-ray diffraction measurement of θ-2θ was performed using the CuKα line, and the half-width of the (111) and (200) planes was measured.

Table 7 shows the results of these tests. The number of layers shown in Table 7 is reckoned counting one deposit of layer A and layer B, as one layer (same for Tables 8-10).

The following is clear from these test results. Specifically, if the thickness of layer B is less than 0.5 nm, an increase in crystal particle fineness is not obtained, and the film hardness does not much increase (Test Nos. 1, 2, 8, 9, 15, 16). On the other hand, if the thickness of layer B is too large, the crystal particle fineness increases, but the proportion of the thickness of the low hardness layer B relative to the high hardness layer A is too large, so the film hardness tends to decrease (Test Nos. 7, 14, 21). Therefore, the film thickness of layer B should be 0.5 times or less than the film thickness of layer A (Test Nos. 3-6, 10-13, 17-20).

The frictional coefficient of the film exhibits more or less similar behaviour. If the thickness of layer B is less than the thickness of layer A, the film wear rate shows hardly no change (Test Nos. 1-6,8-13, 15-20), when the thickness of layer B becomes larger than the thickness of layer A, the film wear rate tends to rapidly increase which suggests that the wear resistance decreases (Test Nos. 7, 14, 21).

It is also seen that if, in addition to satisfying Formulae (1)-(3), layer A is formed of CrN which has a rock-salt cubic crystal structure, and at least one of the half-widths of the diffraction lines from the (111) plane and (200) plane is 0.3° or more, a film having high hardness and superior wear resistance is obtained (Test Nos. 3-6, 10-13).

[Table 7]

EXAMPLE 2-2

In this example, films were formed using the same composite film-forming device as that used in Example 2-1, the composition of layer A was CrN and the composition of layer B was $B_{0.45}C_{0.1}N_{0.45}$ as in Example 2-1, but the thickness of layer B was constant at 2 nm, and the thickness of layer A was varied within the range of 1-300 nm. The other test conditions were identical to those of Example 2-1.

Table 8 shows the test results. The following is clear from these test results.

When the thickness of layer A is less than the thickness of layer B, the properties of layer B which has a lower hardness become predominant, so the film hardness does not much increase (Test No. 31). On the other hand, if the thickness of layer A exceeds 300 nm, the effect of layer B in interfering with the crystal particles leading to increased fineness is less, so the film hardness tends to decrease (Test No. 36). Therefore, the film thickness of layer A should preferably be 200 nm or less, and the film thickness of layer B should be 0.5 times or less than the film thickness of layer A.

[Table 8]

EXAMPLE 2-3

In this example, films were formed using the same composite film-forming device as that used in Example 2-1, the thickness of layer A was constant at 30 nm and the thickness of layer B was constant at 2 nm, and the compositions of layer A, layer B were varied. When the layer A was made to contain C or O, methane or oxygen gas was added to the reaction gas, and when it was made to contain B, a Cr—B alloy target containing B was used. The remaining test conditions were identical to those of Example 2-1.

Table 9 and Table 10 show the test results. From these test results, it is seen that when layer A, layer B have compositions respectively satisfying the aforesaid Formulae (1), (2), a film having high hardness and superior wear resistance is obtained.

It was also found that when layer B had a SiCN composition, compared to a BCN composition, the frictional coefficient of the film was rather high and the ball wear rate was also rather high, but as the film hardness was either of the same order or a rather high value, the film was still suitable for cutting tools without any need for concern regarding aggressiveness toward partner materials.

This means that provided that the composition specified according to the present invention for layer B is not a SiCN composition, aggressiveness toward partner materials can be reduced more than in the prior art films.

[Table 9]

[Table 10]

Next, a third example of the present invention will be described.

EXAMPLE 3-1

Hard laminated films and single-layer hard films were formed under various conditions, the film hardness was examined, and the effect of alternating layers A, B according to the present invention together with the effect of the thicknesses of layers A, B was evaluated.

In the case of the arc film-forming method, films were formed using only the arc vaporization source in the film-forming device having arc and sputter vaporization sources shown in FIG. 5. In the case of the sputter film-forming method, films were formed using the film-forming device having only two sputter vaporization sources shown in FIG. 3. In the case of the arc+sputter film-forming method, films having the compositions shown in Table 11 were formed using the film-forming device having arc and sputter vaporization sources shown in FIG. 5.

In all these film-forming devices, after introducing the substrate into these film-forming devices, the substrate temperature was increased to about 400-500° C., the device was placed under a vacuum of $3 \times 10^{-3}$ Pa or less, cleaning was performed by Ar ions (pressure 0.6 Pa, substrate voltage 500V, treatment time 5 minutes), and films were then formed.

In all these film-forming devices, the film-forming temperature was set to between 400-500° C. The substrate was a mirror surface-polished super-hard alloy. To form layer A, a target containing the metal component in layer A of Table 11 was used, and to form layer B, $B_4C$, C, Si and Cu targets were used.

In each of these examples, the laminated film thickness (film thickness) was constant at approximately 3 μm (3000 nm). The thickness of layer A was varied within the range of 2-250 nm, and the thickness of layer B was varied within the range of 0.2-30 nm.

In the case of the sputter film-forming device of FIG. 3, during film-forming, to form a metal film the atmosphere was pure Ar, to form a nitride the atmosphere was a gaseous mixture of Ar and nitrogen (mixing ratio 65:35), and to form a carbonitride the atmosphere was a gaseous mixture of Ar, nitrogen and methane (mixing ratio 65:30:5), the total pressure being 0.6 Pa, and the thicknesses of layer A and layer B were adjusted by the operating times of the vaporization sources.

In the case of the composite film-forming device of FIG. 5, films were formed using a gaseous mixture of Ar and nitrogen (mixing ratio 50:50), and carbonitrides were formed using a gaseous mixture of Ar, nitrogen and methane (mixing ratio 50:45:5), the total pressure being 2.66 Pa. Further, layer A was formed by the arc vaporization source, and layer B was formed by the sputter vaporization source. The thicknesses of layer A and layer B were determined by power ratio input to the vaporization sources, and the total laminated film thickness of layer A+layer B was determined by the substrate rotation period.

The Vickers hardness of each of these films was evaluated by a micro Vickers hardness gauge (measuring load 25kf: HV0.25).

The lamination period and thicknesses of layer A, layer B were found from a cross-sectional TEM photograph. The composition was analyzed in the film depth direction by Auger electron spectroscopy. Table 11 shows these results.

As shown in Table 11, in the case of Comparative Examples Nos. 1-5, layer B is not provided and there is only a single layer A. On the other hand, comparing inventive examples with comparative examples wherein layer A has identical compositions, such as Comparative Example 1 with Inventive examples 7-8, Comparative Example 3 with Inventive examples 12-14, Comparative Example 4 with Inventive examples 17-19 and Comparative Example 5 with Inventive examples 22-24, the inventive examples have a higher hardness than the Comparative Examples. This supports the effect of alternately depositing layer A and layer B in the present invention.

Next, Nos. 6-15 show the effect of the film thickness of layer B. Comparing within groups Nos. 6-10 and 11-15, wherein layer A and layer B respectively have identical compositions within the range of the present invention, in Comparative Examples 6, 11, the thickness of layer B is less than a lower limit of 0.5 nm. In Comparative Examples 10, 15, the thickness of layer A is less than twice the thickness of layer B. As a result, in these comparative examples, the hardness is lower, compared to Inventive examples 7-9 or Inventive examples 12-14 of the same groups for which the thicknesses of layer A, layer B, and the relation between the thickness of layer A and layer B, satisfy the specifications of the present invention.

Nos. 16-25 show the effect of the film thickness of layer A. Comparing within groups Nos. 16-20 and 21-25, wherein layer A and layer B respectively have identical compositions within the range of the present invention, in Comparative Examples 16, 21, the thickness of layer A is less than twice the thickness of layer B. Also, in Comparative Examples 20, 25, the thickness of layer A exceeds an upper limit of 200 nm. As a result, in these Comparative Examples, the hardness is lower than in Inventive examples 17-19 or Inventive examples 22-24 of the same groups for which the thickness of layer A, and the relation between the thicknesses of layer A and layer B, satisfy the specifications of the present invention.

This supports the specifications and preferred specifications of the thicknesses of layer A, layer B, and the relation between the thicknesses of layer A and layer B.

[Table 11]

EXAMPLE 3-2

Next, layers A having various compositions were formed, the film hardness was examined, and the impact (effect) of the composition of layer A in the present invention on film hardness was evaluated.

Films having the various compositions shown in Table 12 were formed under identical film-forming conditions to those of Example 3-1. The Vickers hardness of the films formed was evaluated by a micro Vickers hardness gauge (measuring load 25 gf) as in Example 3-1. The lamination period and thicknesses of layers A, B were verified on a cross-sectional TEM photograph. The composition was analyzed in the film depth direction by Auger electron spectroscopy. Table 12 shows these results.

As shown in Table 12, in Comparative Examples Nos. 1-6, only a single layer A was provided without providing layer B. On the other hand, in comparisons wherein layer A had the same composition, such as Comparative Example 1 with Invention 12, Comparative Example 2 with Invention 17, Comparative Example 3 with Invention 13, and Comparative Example 4 with Invention 29, the hardness was higher in the Inventive examples (BNCO) is of course not limited to 1:1 and may have a fluctuation width of, for example, 0.8 to 1.3. Therefore, in the aforesaid Formula 1, the atomic ratio of (TiAlM) and (BCNO), and the atomic ratio of the metal element group and non-metal element group, naturally allows a fluctuation width in the atomic ratio of the Ti compound actually forming the film.

In the compositional formula of layer A, Ti nitrides, carbonitrides, boronitrides and carboboronitrides such as TiAlN, TiAlCrN, TiAlVN, TiAlBN, and TiAlCrCN have properties such as high hardness and high wear resistance in hard films which make them very suitable as base components of the layer A part of the present invention.

(Al)

In contrast to the Ti component, the inclusion of Al in the aforesaid compositional formula improves the hardness and oxidation resistance of the layer A. This effect is particularly evident when Al is contained with an atomic ratio within the range of 0.4-0.8 ($0.4 \leq x \leq 0.8$), but preferably 0.5-0.8 ($0.5 \leq x \leq 0.8$). On the other hand, if Al is included but lies outside this component range, there is no or little improvement of hardness and oxidation resistance, and there is them no reason to include Al.

(Metal Element M)

When one or more metal elements represented by M selected from among 4A, 5A, 6A and Si is further contained in the aforesaid compositional formula, the hardness and oxidation resistance of layer A are improved. This effect is particularly evedent than in the corresponding Comparative Examples. Also, in a comparison of comparative examples wherein layer A was TiN, e.g., Comparative Examples 6, 7, Comparative Example 6 which had a single layer A without layer B, had a lower hardness than Comparative Example 7 wherein layer A and layer B were deposited alternately. The results of Table 12 therefore also confirm the effect of alternately depositing layer A and layer B according to the present invention.

As described above, layer A in the present invention has a composition represented by Formula 1: $(Ti_{1-x-y}Al_xM_y)(B_aC_bN_{1-a-b-c}O_c)$ [wherein, $0.4 \leq x \leq 0.8$, $0 \leq y \leq 0.6$, $0 \leq a \leq 0.15$, $0 \leq b \leq 0.3$, $0 \leq c \leq 0.1$, and M is one or more metal elements selected from among 4A, 5A, 6A and Si].

Here, in Table 12, examples having the same components are compared. First, for (TiAl)N, in Comparative Examples 8, 11 wherein the Al content is lower or higher than the specified range of $0.4 \leq x \leq 0.8$, the hardness is lower than in Inventive examples 9, 10, 12 wherein the Al content is within the range.

For (TiAlCr)N, in Comparative Example 16 wherein the Al content is lower than the specified range of $0.4 \leq x \leq 0.8$ and the Cr content is higher than the specified range of $0 \leq y \leq 0.6$, the hardness is lower than in Inventive examples 13-15 wherein the Al content x is 0.45-0.65 which is within the aforesaid range of 0.4-0.8, and within the more preferred specified range of 0.55-0.75.

These results therefore confirm the significance of the Al content x in layer A according to the present invention or the significance of the more preferred specification.

For (TiAl)(BN), in Comparative Example 25 wherein the B content is higher than the specified range of $0 \leq a \leq 0.15$, and the hardness is lower than in Inventive examples 23, 24 wherein the B content a is within the aforesaid range of 0.15 or less, and within the more preferred specified range of 0.1 or less.

These results therefore confirm the significance of the B content a in layer A according to the present invention, or the significance of the more preferred specification.

For (TiAlCr)(CN), in Comparative Example 28 wherein the C content is higher than the specified range of $0 \leq b \leq 0.3$, the hardness is lower than in Inventive examples 26, 27 wherein the C content is within the aforesaid range of 0.3 or less, and within the more preferred specified range of 0.1 or less.

These results therefore confirm the significance of the C content b in layer A according to the present invention, or the significance of the more preferred specification.

For (TiAlV)(ON), in Comparative Example 30 wherein the O content is higher than the specified range of $0 \leq c \leq 0.1$, the hardness is lower than in Invention 29 wherein the O content is within the specified range of 0.1 or less.

These results therefore confirm the significance of the O content in layer A according to the present invention.

Further, in Inventive examples 13-15, 17-22 of Table 12, as the addition element M, the film contains Cr, Si, Zr, Nb, Ta, V. Among these elements M, the hardness is particularly high when M is Cr, Si or V. This confirms the increase of hardness due to the element M.

[Table 12]

EXAMPLE 3-3

Next, layers B having various compositions were formed, the film hardness was examined, and the impact (effect) of the composition of layer B in the present invention on film hardness was evaluated.

Films having the various compositions shown in Table 13 were formed under identical film-forming conditions to those of Example 3-1. The Vickers hardness of the films formed was evaluated as in Examples 3-1, 3-2. The lamination period and thicknesses of layers A, B were verified on a cross-sectional TEM photograph. The composition was also analyzed in the film thickness direction by Auger electron spectroscopy. Tables 13, 14 (continued from Table 13) show these results.

In this example, the sliding properties of the film were evaluated using a ball-on-plate type back-and-forth sliding wear and friction resistance tester. Sliding tests were performed using bearing steel (SUJ2, HRC60) of diameter 9.53 mm as the partner material (ball) in a dry atmosphere at a sliding speed of 0.1 m per second, load of 2N and sliding distance of 250 m, and the frictional coefficient ($\mu$) during the tests was evaluated.

Further, according to this example, the oxidation resistance of the films was evaluated from the oxidation start temperature. Specifically, a film sample formed to approximately 3 μm on platinum foil was heated from room temperature to 1100° C. in dry air at a rate of 4° C./minute using a thermal balance, and the oxidation start temperature was determined from the curve of this oxidation weight increase. Tables 13, 14 show these results.

As shown in Tables 13, 14, in Comparative Examples Nos. 1-6, only a single layer A is provided without a layer B. On the other hand, in a comparison between Comparative Example 1 with Inventive examples 7-10 or Comparative Example 11, a comparison between Comparative Example 3 with Inventive examples 12, 13, 16-19, and Comparative Example 4 with Inventive examples 25-28, the hardness is higher in these inventive examples than in the corresponding comparative examples. The results of Tables 3, 4 therefore also confirm the effect of alternately depositing layer A and layer B according to the present invention.

As described above, layer B in the present invention is selected from among compounds represented by the following 4 compositional formulae.

Formula 2: $B_{1-x-y}C_xN_y$ [wherein x, y are respectively atomic ratios, $0 \leq x \leq 0.25$ and $B/N \leq 1.5$], Formula 3: $Si_{1-x-y}C_xN_y$ [wherein x, y are respectively atomic ratios, $0 \leq x \leq 0.25$ and $0.5 \leq Si/N \leq 2.0$], Formula 4: $C_{1-x}N_x$ [wherein, x is an atomic ratio and $0 \leq x \leq 0.6$], Formula 5: $Cu_{1-y}(C_xN_{1-x})_y$ [wherein x, y are respectively atomic ratios, $0 \leq x \leq 0.1$ and $0 \leq y \leq 0.5$].

Here, in Tables 13, 14, examples wherein layer B has the same components are compared. First, for $B_{1-x-y}C_xN_y$, in Comparative Example 11 wherein the C content x is higher than the specified range of $0 \leq x \leq 0.25$, the hardness is lower than in Inventive examples 7-10 wherein the C content is within the specified range. In Comparative Examples 14, 15 wherein B/N is higher than the specified 1.5 or less, the hardness is lower and the frictional coefficient is higher than in Inventive examples 12, 13 wherein it is within the specified range. It is seen that when B/N is 1.5 or less, the film hardness and frictional coefficient are both high.

For $Si_{1-x-y}C_xN_y$, in Comparative Example 20 wherein the C content x is higher than the specified range of $0 \leq a \leq 0.25$, the hardness and oxidation resistance are lower than in Inventive examples 16-19 wherein the C content x is within the specified range. It is seen that when the C content x is 0.25 or less, both film hardness and oxidation resistance improve. Also, in Comparative Example 24 wherein Si/N is lower than the specified.

Range of 0.5-2.0, the hardness is lower than in Inventive examples 21-23 wherein it is within the specified range.

For $Cu_{1-y}(C_xN_{1-x})_y$, in Comparative Example 29 wherein the coefficient y of the ratio of CN to Cu is higher than the specified range of $0 \leq y \leq 0.5$, the hardness is lower than in Inventive examples 25-28 wherein the N content x is within the specified range. From these results, it is seen that the hardness is high when the coefficient y of the ratio of CN to Cu lies within the range of 0-0.5, and the hardness is high when the C content x lies within the range $0 \leq x \leq 0.1$.

For $C_{1-x}N_x$, in Comparative Example 34 wherein the N content x is higher than the specified range of $0 \leq x \leq 0.6$, the hardness is lower and the frictional coefficient is higher than in Inventive examples 30-33 wherein the N content x lies within the specified range. It is seen that the hardness is high and frictional coefficient decreases when the N content x lies within the specified range.

In all the examples shown in Tables 3, 4, the frictional coefficient decreases due to lamination when the layer B is BCN or C type, and the oxidation resistance also slightly increases when it is BCN type. When it is SiCN type, the frictional resistance hardly varies, but the oxidation resistance remarkably increases. When it is CuCN type, the hardness increases and the oxidation resistance also slightly increases.

These results therefore confirm the significance of the specified compositions of layer B according to the present invention.

[Table 13]

[Table 14]

Next, a fourth example of this invention will be described.

EXAMPLE 4-1

Hard laminated films and single-layer hard films were formed under various conditions, the film hardness was examined, and the effect of alternating layers A, B according to the present invention together with the effect of the thicknesses of layers A, B was evaluated.

In the case of the arc film-forming method, films were formed using only the arc vaporization source in the film-forming device having arc and sputter vaporization sources shown in FIG. 5. In the case of the sputter film-forming method, films were formed by a film-forming device having only two sputter vaporization sources shown in FIG. 4. In the case of the arc+sputter film-forming method, films having the compositions shown in Table 15 were formed by the film-forming device having arc and sputter vaporization sources shown in FIG. 5.

After introducing the substrate into these film-forming devices, the substrate temperature was increased to about 400-500° C., the device was placed under a vacuum of $3 \times 10^{-3}$ Pa or less, cleaning was performed by Ar ions (pressure 0.6 Pa, substrate voltage 500V, treatment time 5 minutes), and films were formed.

In all these film-forming devices, the film-forming temperature was set to between 400-500° C. The substrate was a mirror surface-polished super-hard alloy. To form layer A, a target containing the metal component in layer A of Table 15 was used, and to form layer B, $B_4C$, C, Si and Cu targets were used.

In each of these examples, the laminated film thickness (film thickness) was constant at approximately 3 μm (3000 nm). The thickness of layer A was varied within the range of 2-250 nm, and the thickness of layer B was varied within the range of 0.2-30 nm.

In the case of the sputter film-forming device of FIG. 4, during film-forming, to form a metal film the atmosphere was pure Ar, to form a nitride the atmosphere was a gaseous mixture of Ar and nitrogen (mixing ratio 65:35), and to form a carbonitride the atmosphere was a gaseous mixture of Ar, nitrogen and methane (mixing ratio 65:30:5), the total pressure being 0.6 Pa, and the thicknesses of layer A and layer B were adjusted by the operating times of the vaporization sources.

In the case of the composite film-forming device of FIG. 5, films were formed using a gaseous mixture of Ar and nitrogen (mixing ratio 50:50), and carbonitrides were formed using a gaseous mixture of Ar, nitrogen and methane (mixing ratio 50:45:5), the total pressure being 2.66 Pa. Layer A was formed by the arc vaporization source, and layer B was formed by the sputter vaporization source. The thicknesses of layer A and layer B were determined by power ratio input to the vaporization sources, and the total laminated film thickness of layer A+layer B was determined by the substrate rotation period.

The Vickers hardness of each of these films was evaluated by a micro Vickers hardness gauge (measuring load 25kf: HV0.25) The lamination period and thicknesses of layer A, layer B were found from a cross-sectional TEM photograph. The composition was analyzed in the film depth direction by Auger electron spectroscopy. Table 15 shows these results.

As shown in Table 15, in the case of Comparative Examples Nos. 1-6, there is only a single layer A and layer B is not provided. On the other hand, in comparisons wherein layer A has identical compositions, such as Comparative Example 1 with Inventive examples 8-10, Comparative Example 3 with Inventive examples 13-15 and Comparative Example 4 with Inventive examples 18-20, the inventive examples have a higher hardness than the comparative examples. This therefore confirms the effect of alternately depositing layer A and layer B in the present invention.

Next, Nos. 7-16 show the effect of the film thickness of layer B. Comparing within groups Nos. 7-11 and 12-16, wherein layer A and layer B are respectively provided with identical compositions, in Comparative Examples 7, 12, the thickness of layer B is less than a lower limit of 0.5 nm. In Comparative Examples 11, 16, the thickness of layer A is less than twice the thickness of layer B. As a result, in these comparative examples, the hardness is lower compared to Inventive examples 8-10 or Inventive examples 13-15 of the same groups wherein the thicknesses of layer A, layer B, and the relation between the thickness of layer A and layer B, satisfy the specifications of the present invention.

Next, Nos. 7-16 show the effect of the film thickness of layer B. Comparing within groups Nos. 7-11 and 12-16, wherein layer A and layer B are respectively provided with identical compositions, in Comparative Examples 7, 12, the thickness of layer B is less than a lower limit of 0.5 nm. In Comparative Examples 11, 16, the thickness of layer A is less than twice the thickness of layer B. As a result, in these comparative examples, the hardness is lower compared to Inventive examples 8-10 or Inventive examples 13-15 of the same groups wherein the thicknesses of layer A, layer B, and the relation between the thickness of layer A and layer B, satisfy the specifications of the present invention.

Next, Nos. 17-26 show the effect of the film thickness of layer A. Comparing within groups Nos. 17-21 and 22-26, wherein layer A and layer B are respectively provided with identical compositions, in Comparative Examples 17, 22, the thickness of layer A is less than twice the thickness of layer B. Also, in Comparative Examples 21, 26, the thickness of layer A exceeds an upper limit of 200 nm. As a result, in these comparative examples, the hardness is lower compared to Inventive examples 18-20 or Inventive examples 23-25 of the same groups wherein the thickness of layer A, and the relation between the thickness of layer A and layer B, satisfy the specifications of the present invention.

Moreover, in Inventive examples 23-25 wherein layer A has a Cr type composition, compared to Inventive examples 8-10, 13-15, 18-20 wherein layer A has a Ti type composition, the hardness is low. However, as described above, when used for sliding parts, aggressiveness toward partner materials is lower than in the case of a Ti type composition.

These results confirm the significance of the compositions and thicknesses of layer A, layer B, the relation between the thicknesses of layer A and layer B, and more preferred specifications thereof.

[Table 15]

EXAMPLE 4-2

Next, layers A having various compositions were formed, the film hardness was examined, and the impact (effect) of the composition of layer A in the present invention on film hardness was evaluated.

Films having the various compositions shown in Table 16 were formed under identical film-forming conditions to those of Example 4-1. The Vickers hardness for the films formed was evaluated by a micro Vickers hardness gauge (measuring load 25 gf) as in Example 4-1. The lamination period and thicknesses of layers A, B were verified on a cross-sectional TEM photograph. The composition was analyzed in the film depth direction by Auger electron spectroscopy. Tables 16, 17 show these results.

As shown in Tables 16, 17, in Comparative Examples Nos. 1-7, only a single layer A was provided without providing layer B. On the other hand, in comparisons wherein layer A had identical or near-similar compositions, such as Comparative Example 1 with Invention 11, Comparative Example 2 with Invention 18, Comparative Example 3 with Invention 14, and Comparative Example 4 with Invention 23, the hardness was higher in the inventive examples than in the corresponding comparative examples. Also, in a comparison of Comparative Examples 6, 7 wherein layer A was TiN, Comparative Example 6 which had a single layer A without layer B, had a lower hardness than Comparative Example 7 wherein layer A and layer B were deposited alternately. The results of Table 16 therefore also confirm show the effect of alternately depositing layer A and layer B according to the present invention.

As described above, layer A in the present invention has the composition:

$(Ti_{1-x-y}Al_xM_y)(B_aC_bN_{1-a-b-c}O_c)$ [wherein, $0.4 \leq x \leq 0.8$, $0 \leq y \leq 0.6$, $0 \leq a \leq 0.15$, $0 \leq b \leq 0.3$, $0 \leq c \leq 0.1$, and M is one or more metal elements selected from among 4A, 5A, 6A and Si].

Here, in Table 16, examples having the same components are compared. First, for (TiAl)N, in Comparative Examples 9, 13 wherein the Al content is lower or higher than the specified range of $0.4 \leq x \leq 0.8$, the hardness is lower than in Inventive examples 10-12 wherein the Al content is within the range.

For (TiAlCr)N, in Comparative Example 17 wherein the Al content is lower than the specified range of $0.4 \leq x \leq 0.8$, the hardness is lower than in Inventive examples 14-16 wherein the Al content x is 0.45-0.65 which is within the aforesaid range of 0.4-0.8, and within the more preferred specified range of 0.55-0.75.

These results therefore confirm the significance of the Al content x in layer A according to the present invention and of the more preferred range thereof.

For (TiAl) (BN), in Comparative Example 26 wherein the B content is higher than the specified range of $0 \leq a \leq 0.15$, the hardness is lower than in Inventive examples 24, 25 wherein the B content a is within the aforesaid range of 0.15 or less, and within the more preferred specified range of 0.1 or less.

These results therefore confirm the significance of the B content a in layer A according to the present invention and of the more preferred range thereof.

For (TiAlCr) (CN), in Comparative Example 29 wherein the C content is higher than the specified range of $0 \leq b \leq 0.3$, the hardness is lower than in Inventive examples 27, 28 wherein the C content is within the aforesaid range of 0.3 or less, and within the more preferred specified range of 0.1 or less.

These results therefore confirm the significance of the C content b in layer A according to the present invention and of the more preferred range thereof.

For (TiAlV)(ON), in Comparative Example 31 wherein the O content is higher than the specified range of $0 \leq c \leq 0.1$, the hardness is lower than in Invention 30 wherein the O content is within the specified range of 0.1 or less.

These results therefore confirm the significance of the O content in layer A according to the present invention.

Further, in Inventive examples 14-16, 18-23 of Table 16, the addition element M is Cr, Si, Zr, Nb, Ta, V. Among these elements M, the hardness is particularly high when M is Cr, Si or V. This confirms the increase of hardness due to the element M.

[Table 16]
[Table 17]

EXAMPLE 4-3

Next, layers B having various compositions were formed, the film hardness was examined, and the impact (effect) of the composition of layer B in the present invention on film hardness was evaluated.

Films having the various compositions shown in Table 18 were formed under identical film-forming conditions to those of Example 4-1. The Vickers hardness of the films formed was evaluated as in Examples 4-1, 4-2. The lamination period and thicknesses of layers A, B were verified on a cross-sectional TEM photograph. The composition was also analyzed in the film thickness direction by Auger electron spectroscopy. Table 18 shows these results.

In this example, the sliding properties of the film were evaluated using a ball-on-plate type back-and-forth sliding wear and friction resistance tester. Sliding tests were performed using bearing steel (SUJ2, HRC60) of diameter 9.53 mm as the partner material (ball) in a dry atmosphere in a room temperature at a sliding speed of 0.1 m per second, load of 2N and sliding distance of 250 m, and the frictional coefficient (μ) during the tests was evaluated.

Further, in this example, the oxidation resistance of the films was evaluated from the oxidation start temperature. Specifically, a film sample formed to approximately 3 μm on platinum foil was heated from room temperature to 1100° C. in dry air at a rate of 4° C./minute using a thermal balance, and the oxidation start temperature was determined from the curve of this oxidation weight increase. Table 4 shows these results.

As shown in Table 18, in Comparative Examples Nos. 1-7, only a single layer A is provided without the layer B. On the other hand, in a comparison between Comparative Example 1 with Inventive examples 8-10 or Comparative Example 11, and a comparison between Comparative Example 3 with Inventive examples 12, 13, 15-17, 19-21, the hardness was higher in these inventive examples than in the corresponding comparative examples. The results of Table 18 therefore also confirm the advantage of alternately depositing layer A and layer B according to the present invention.

As described above, layer B in the present invention is a composition represented by the following Formula 3.

Formula 3: $M(B_aC_bN_{1-a-b-c}O_c)$ [wherein, M is one or more metal elements selected from among W, Mo, V, Nb; a, b, c, e denote atomic ratios, and $0 \leq a \leq 0.15$, $0 \leq b \leq 0.3$, $0 \leq c \leq 0.1$].

Here, in Table 18, examples wherein layer B has the same components are compared. First, for W(CN), in Comparative Example 11 wherein the C content b is higher than the specified range of $0 \leq b \leq 0.3$, the hardness and oxidation resistance are lower than in Inventive examples 8-10 wherein the C content is within the specified range.

For V(NO), in Comparative Example 14 wherein the 0 content c is higher than the specified range of $0 \leq c \leq 0.1$, the hardness and oxidation resistance are lower than in Inventive examples 12, 13 wherein the O content c is within the specified range.

For Nb(BN), in Comparative Example 18 wherein the B content a is higher than the specified range of $0 \leq a \leq 0.15$, the hardness is lower than in Inventive examples 15-17 wherein the O content c is within the specified range.

In Inventive examples 16, 17 (and Comparative Example 18) wherein layer B is Nb(BN) type and contains Nb, Inventive examples 20 and 22 wherein layer B is (MoNb) CN type and contains Mo, and Inventive example 21 wherein layer B is (WAl)N type and contains W, the film hardness is high, and the oxidation resistance is particularly improved. Also, in Inventive example 19 wherein layer B is (WV)N, the film hardness is high.

In Inventive examples 12, 13, 26 (and Comparative Example 14) wherein layer B contains V, the frictional coefficient is particularly low.

Further, in Inventive examples 21, 22, 23, 25, in the Compositional Formula 3 of layer B, the metal element M is substituted by one or more metal elements M1 selected from among 4A, 5A, 6A, Si excluding W, Mo, V, Nb with an atomic ratio of 0.3 or less. In Inventive example 21, W is substituted by Al. In Inventive example 22, Mo is substituted by Si. In Inventive example 23, V is substituted by Ti.

As a result, the film hardness is high.

In Inventive examples 24-28 wherein layer A has a Cr type composition, the hardness is low compared to the aforesaid inventive examples wherein it has a Ti type composition. However, as described above, when used in sliding parts, aggressiveness toward partner materials is lower than for a Ti type composition.

These results therefore confirm the compositional significance of layer B according to the present invention.

[Table 18]

As described above, by controlling the hard film of the present invention and the hard film crystal particle size, the crystal particle size of the rock-salt hard film can be made finer which improves properties such as hard film wear resistance. This film can therefore be used as a wear-resistant film in cutting tools having thermite or high-speed tool steel as substrate or vehicle sliding parts.

The present invention further provides a hard laminated film having superior wear resistance and oxidation resistance, and a method of forming this hard laminated film. This film can therefore be used as a wear resistant film in super-hard alloys, cutting tools having thermite or high-speed tool steel as substrate or vehicle sliding parts.

The present invention also provides a composite film-forming device and sputter vaporization source which enables a hard film having the desired properties to be obtained without problems of film-forming.

The foregoing invention has been described in terms of preferred embodiments. However, those skilled, in the art will recognize that many variations of such embodiments exist. Such variations are intended to be within the scope of the present invention and the appended claims.

TABLE 1

| | | | | Layer | | | |
|---|---|---|---|---|---|---|---|
| | | | | Layer A (50 nm) Crystal structure | | | |
| | | | | Rock-salt | Rock-salt | Rock-salt Material | Rock-salt |
| No. | Layer | Crystal structure | Material | Ti0.5, Al0.5, N | TiN | CrN | TiCN |
| 1 | Layer B (10 nm) | Rock-salt | Ti0.5, Al0.5, N | x | x | x | x |
| 2 | | Rock-salt | TiN | x | x | x | x |
| 3 | | Rock-salt | CrN | x | x | x | x |
| 4 | | Rock-salt | AlN | x | x | x | x |
| 5 | | bcc | Ti | o | o | o | o |
| 6 | | bcc | Cr | o | o | o | o |
| 7 | | bcc | Ta | o | o | o | o |
| 8 | | fcc | Ni | o | o | o | o |
| 9 | | fcc | Cu | o | o | o | o |
| 10 | | Diamond | Si | o | o | o | o |
| 11 | | Amorphous | Si—N | o | o | o | o |
| 12 | | Amorphous | B—N | o | o | o | o |
| 13 | | Amorphous | C | o | o | o | o |

TABLE 2

| | | | Hard film conditions | | | | | | |
|---|---|---|---|---|---|---|---|---|---|
| | | | Layer A | | | Layer B | | | |
| | | No. of | | Film | | | Film | | Film properties |
| No. | Film-forming method | layers A + B | Material | thickness (nm) | Crystal structure | Material | thickness (nm) | Crystal structure | Fineness | Hardness (Hv0.25) |
| 14 | Sputter | 1 | (Ti0.5, Al0.5)N | 3000 | Rock-salt | — | — | — | x | 2800 |
| 15 | Arc | 1 | CrN | 3000 | Rock-salt | — | — | — | x | 1500 |
| 16 | Arc | 1 | (Ti0.5, Al0.45, Si0.05)N | 3000 | Rock-salt | — | — | — | x | 2900 |
| 17 | Arc | 1 | TiN | 3000 | Rock-salt | — | — | — | x | 2000 |
| 18 | Sputter | 86 | (Ti0.5, Al0.5)N | 30 | Rock-salt | CrN | 5 | Rock-salt | x | 2500 |
| 19 | Sputter | 86 | (Ti0.5, Al0.5)N | 30 | Rock-salt | MoN | 5 | Rock-salt | x | 2600 |
| 20 | Sputter | 86 | (Ti0.5, Al0.5)N | 30 | Rock-salt | Ti | 5 | bcc | o | 3000 |
| 21 | Arc + sputter | 86 | (Ti0.5, Al0.5)N | 30 | Rock-salt | SiN | 5 | Amorphous | o | 3500 |
| 22 | Arc + sputter | 86 | CrN | 30 | Rock-salt | WN | 5 | Rock-salt | x | 1800 |
| 23 | Arc + sputter | 86 | CrN | 30 | Rock-salt | TaN | 5 | Rock-salt | x | 1900 |

TABLE 2-continued

| No. | Film-forming method | No. of layers A + B | Layer A Material | Film thickness (nm) | Crystal structure | Layer B Material | Film thickness (nm) | Crystal structure | Fineness | Hardness (Hv0.25) |
|---|---|---|---|---|---|---|---|---|---|---|
| 24 | Arc + sputter | 86 | CrN | 30 | Rock-salt | BN | 5 | Amorphous | ○ | 2500 |
| 25 | Sputter | 86 | (Ti0.5, Al0.5)N | 30 | Rock-salt | Co | 5 | fcc | ○ | 3100 |
| 26 | Arc + sputter | 86 | (Ti0.5, Al0.5)N | 30 | Rock-salt | Cu | 5 | fcc | ○ | 3150 |
| 27 | Arc + sputter | 86 | TiN | 30 | Rock-salt | Cu | 5 | fcc | ○ | 2300 |
| 28 | Arc + sputter | 86 | TiN | 30 | Rock-salt | AlN | 5 | Rock-salt | x | 2100 |
| 29 | Arc + sputter | 86 | TiN | 30 | Rock-salt | SiN | 5 | Amorphous | ○ | 2500 |

TABLE 3

| No. | Film-forming method | No. of layers A + B | Layer A Material | Film thickness (nm) | Crystal structure | Layer B Material | Film thickness (nm) | Crystal structure | Fineness | Hardness (Hv0.25) |
|---|---|---|---|---|---|---|---|---|---|---|
| 30 | Sputter | 99 | (Ti0.5, Al0.5)N | 30 | Rock-salt | SiN | 0.2 | Amorphous | x | 2800 |
| 31 | Sputter | 98 | (Ti0.5, Al0.5)N | 30 | Rock-salt | SiN | 0.5 | Amorphous | ○ | 3000 |
| 32 | Sputter | 97 | (Ti0.5, Al0.5)N | 30 | Rock-salt | SiN | 1 | Amorphous | ○ | 3200 |
| 33 | Sputter | 86 | (Ti0.5, Al0.5)N | 30 | Rock-salt | SiN | 5 | Amorphous | ○ | 3500 |
| 34 | Sputter | 75 | (Ti0.5, Al0.5)N | 30 | Rock-salt | SiN | 10 | Amorphous | ○ | 3100 |
| 35 | Sputter | 38 | (Ti0.5, Al0.5)N | 30 | Rock-salt | SiN | 50 | Amorphous | ○ | 2900 |
| 36 | Sputter | 23 | (Ti0.5, Al0.5)N | 30 | Rock-salt | SiN | 100 | Amorphous | ○ | 2700 |
| 37 | Arc + sputter | 99 | CrN | 30 | Rock-salt | BN | 0.2 | Amorphous | x | 1800 |
| 38 | Arc + sputter | 98 | CrN | 30 | Rock-salt | BN | 0.5 | Amorphous | ○ | 2000 |
| 39 | Arc + sputter | 97 | CrN | 30 | Rock-salt | BN | 1 | Amorphous | ○ | 2100 |
| 40 | Arc + sputter | 86 | CrN | 30 | Rock-salt | BN | 5 | Amorphous | ○ | 2500 |
| 41 | Arc + sputter | 75 | CrN | 30 | Rock-salt | BN | 10 | Amorphous | ○ | 2300 |
| 42 | Arc + sputter | 38 | CrN | 30 | Rock-salt | BN | 50 | Amorphous | ○ | 2100 |
| 43 | Arc + sputter | 23 | CrN | 30 | Rock-salt | BN | 100 | Amorphous | ○ | 1900 |
| 44 | Arc + sputter | 99 | TiN | 30 | Rock-salt | Cu | 0.2 | Amorphous | x | 2000 |
| 45 | Arc + sputter | 98 | TiN | 30 | Rock-salt | Cu | 0.5 | Amorphous | ○ | 2250 |
| 46 | Arc + sputter | 97 | TiN | 30 | Rock-salt | Cu | 1 | Amorphous | ○ | 2300 |
| 47 | Arc + sputter | 86 | TiN | 30 | Rock-salt | Cu | 5 | Amorphous | ○ | 2600 |
| 48 | Arc + sputter | 75 | TiN | 30 | Rock-salt | Cu | 10 | Amorphous | ○ | 2500 |
| 49 | Arc + sputter | 38 | TiN | 30 | Rock-salt | Cu | 50 | Amorphous | ○ | 2000 |
| 50 | Arc + sputter | 23 | TiN | 30 | Rock-salt | Cu | 100 | Amorphous | ○ | 1800 |

TABLE 4

| No. | Film-forming method | No. of layers A + B | Layer A Material | Film thickness (nm) | Crystal structure | Layer B Material | Film thickness (nm) | Crystal structure | Fineness | Hardness (Hv0.25) |
|---|---|---|---|---|---|---|---|---|---|---|
| 51 | Arc + sputter | 1000 | (Ti0.5, Al0.5)N | 1 | Rock-salt | SiN | 2 | Amorphous | ○ | 2500 |
| 52 | Arc + sputter | 250 | (Ti0.5, Al0.5)N | 10 | Rock-salt | SiN | 2 | Amorphous | ○ | 3400 |
| 53 | Arc + sputter | 58 | (Ti0.5, Al0.5)N | 50 | Rock-salt | SiN | 2 | Amorphous | ○ | 3500 |
| 54 | Arc + sputter | 29 | (Ti0.5, Al0.5)N | 100 | Rock-salt | SiN | 2 | Amorphous | ○ | 3450 |
| 55 | Arc + sputter | 17 | (Ti0.5, Al0.5)N | 170 | Rock-salt | SiN | 2 | Amorphous | ○ | 3300 |
| 56 | Arc + sputter | 10 | (Ti0.5, Al0.5)N | 300 | Rock-salt | SiN | 2 | Amorphous | x | 2800 |

TABLE 5

| | | | Hard film conditions | | | | | | Film properties | |
|---|---|---|---|---|---|---|---|---|---|---|
| | | | Layer A | | | Layer B | | | | |
| No. | Film-forming method | No. of layers A + B | Material | Film thickness (nm) | Crystal structure | Material | Film thickness (nm) | Crystal structure | Fineness | Oxidation start temperature(° C.) |
| 57 | Arc + sputter | 1 | (Ti0.5, Al0.5)N | 3000 | Rock-salt | — | — | — | x | 850 |
| 58 | Arc + sputter | 91 | (Ti0.5, Al0.5)N | 30 | Rock-salt | SiN | 3 | Amorphous | o | 900 |
| 59 | Arc + sputter | 91 | (Ti0.5, Al0.5)N | 30 | Rock-salt | BN | 3 | Amorphous | o | 900 |
| 60 | Arc + sputter | 91 | (Ti0.5, Al0.5)N | 30 | Rock-salt | MoN | 3 | Rock-salt | x | 850 |
| 61 | Arc + sputter | 91 | (Ti0.5, Al0.5)N | 30 | Rock-salt | Ti | 3 | bcc | o | 800 |

TABLE 6

| | | | | Hard film conditions | | | | | | | | |
|---|---|---|---|---|---|---|---|---|---|---|---|---|
| | | | | Layer A | | | Layer B | | | Film properties | | |
| No. | Film-forming method | Magnetic force lines | No. of layers A + B | Material | Film thickness (nm) | Crystal structure | Material | Film thickness (nm) | Crystal structure | Fineness | Hardness (Hv0.25) | Oxidation start temperature (° C.) |
| 62 | Arc + sputter | FIG. 5 | 91 | (Ti0.5, Al0.5)N | 30 | Rock-salt | SiN | 3 | Amorphous | o | 3400 | 900 |
| 63 | Arc + sputter | FIG. 6 | 91 | (Ti0.5, Al0.5)N | 30 | Rock-salt | SiN | 3 | Amorphous | o | 3200 | 900 |
| 64 | Arc + sputter | FIG. 5 | 91 | CrN | 30 | Rock-salt | BN | 3 | Amorphous | o | 2500 | 900 |
| 65 | Arc + sputter | FIG. 6 | 91 | CrN | 30 | Rock-salt | BN | 3 | Amorphous | o | 2300 | 900 |

TABLE 7

| Test No. | Film-forming method | No. of layers (A + B) | Layer A Composition | Film thickness (nm) | Layer B Composition | Film thickness (nm) | Crystal fineness | Film hardness (HV, 25 gf) | Friction coefficient (-) | Ball wear rate (mm³/(N·m)) | Film wear rate (mm³/(N·m)) | (111) Plane FWHM (°) | (200) Plane FWHM (°) |
|---|---|---|---|---|---|---|---|---|---|---|---|---|---|
| 1 | Sputter | 1 | CrN | 3000 | — | — | x | 1700 | 0.6 | 2.00E−05 | 4.00E−07 | 0.2 | 0.2 |
| 2 | Sputter | 99 | CrN | 30 | $B_{0.45}C_{0.1}N_{0.45}$ | 0.2 | x | 1700 | 0.55 | 1.00E−05 | 4.00E−07 | 0.2 | 0.2 |
| 3 | Sputter | 98 | CrN | 30 | $B_{0.45}C_{0.1}N_{0.45}$ | 0.5 | o | 2450 | 0.24 | 2.50E−06 | 4.00E−07 | 0.31 | 0.25 |
| 4 | Sputter | 97 | CrN | 30 | $B_{0.45}C_{0.1}N_{0.45}$ | 1 | o | 2500 | 0.22 | 1.50E−06 | 4.00E−07 | 0.35 | 0.35 |
| 5 | Sputter | 86 | CrN | 30 | $B_{0.45}C_{0.1}N_{0.45}$ | 5 | o | 2700 | 0.2 | 1.00E−06 | 4.00E−07 | 0.4 | 0.45 |
| 6 | Sputter | 75 | CrN | 30 | $B_{0.45}C_{0.1}N_{0.45}$ | 10 | o | 2600 | 0.2 | 1.50E−06 | 4.50E−07 | 0.4 | 0.46 |
| 7 | Sputter | 38 | CrN | 30 | $B_{0.45}C_{0.1}N_{0.45}$ | 50 | o | 2300 | 0.19 | 1.50E−06 | 8.00E−07 | 0.45 | 0.55 |
| 8 | Arc + sputter | 1 | CrN | 3000 | — | — | x | 1750 | 0.54 | 1.80E−05 | 3.60E−07 | 0.22 | 0.22 |
| 9 | Arc + sputter | 99 | CrN | 30 | $B_{0.45}C_{0.1}N_{0.45}$ | 0.2 | x | 1800 | 0.495 | 9.00E−06 | 3.60E−07 | 0.22 | 0.22 |
| 10 | Arc + sputter | 98 | CrN | 30 | $B_{0.45}C_{0.1}N_{0.45}$ | 0.5 | o | 2500 | 0.216 | 2.25E−06 | 3.60E−07 | 0.341 | 0.275 |
| 11 | Arc + sputter | 97 | CrN | 30 | $B_{0.45}C_{0.1}N_{0.45}$ | 1 | o | 2600 | 0.198 | 1.35E−06 | 3.60E−07 | 0.385 | 0.385 |
| 12 | Arc + sputter | 86 | CrN | 30 | $B_{0.45}C_{0.1}N_{0.45}$ | 5 | o | 2800 | 0.18 | 9.00E−07 | 3.60E−07 | 0.44 | 0.495 |
| 13 | Arc + sputter | 75 | CrN | 30 | $B_{0.45}C_{0.1}N_{0.45}$ | 10 | o | 2700 | 0.18 | 1.35E−06 | 4.05E−07 | 0.44 | 0.506 |
| 14 | Arc + sputter | 38 | CrN | 30 | $B_{0.45}C_{0.1}N_{0.45}$ | 50 | o | 2400 | 0.171 | 1.35E−06 | 7.20E−07 | 0.495 | 0.605 |
| 15 | Arc + sputter | 1 | $Cr_2N$ | 3000 | — | — | x | 1650 | 0.567 | 1.89E−05 | 3.78E−07 | Not rock-salt cubic structure, so not measured | |
| 16 | Arc + sputter | 99 | $Cr_2N$ | 30 | $B_{0.45}C_{0.1}N_{0.45}$ | 0.2 | x | 1750 | 0.51975 | 9.45E−06 | 3.78E−07 | | |
| 17 | Arc + sputter | 98 | $Cr_2N$ | 30 | $B_{0.45}C_{0.1}N_{0.45}$ | 0.5 | o | 2400 | 0.2268 | 2.36E−06 | 3.78E−07 | | |
| 18 | Arc + sputter | 97 | $Cr_2N$ | 30 | $B_{0.45}C_{0.1}N_{0.45}$ | 1 | o | 2450 | 0.2079 | 1.42E−06 | 3.78E−07 | | |
| 19 | Arc + sputter | 86 | $Cr_2N$ | 30 | $B_{0.45}C_{0.1}N_{0.45}$ | 5 | o | 2550 | 0.189 | 9.45E−07 | 3.78E−07 | | |
| 20 | Arc + sputter | 75 | $Cr_2N$ | 30 | $B_{0.45}C_{0.1}N_{0.45}$ | 10 | o | 2500 | 0.188 | 1.42E−06 | 4.25E−07 | | |
| 21 | Arc + sputter | 38 | $Cr_2N$ | 30 | $B_{0.45}C_{0.1}N_{0.45}$ | 50 | o | 2400 | 0.17955 | 1.42E−06 | 7.56E−07 | | |

TABLE 8

| Test No. | Film-forming method | No. of layers (A + B) | Layer A Composition | Layer A Film thickness (nm) | Layer B Composition | Layer B Film thickness (nm) | Crystal fineness | Film hardness (HV, 25 gf) | Friction coefficient (-) | Ball wear rate (mm$^3$/(N·m)) | Film wear rate (mm$^3$/(N·m)) |
|---|---|---|---|---|---|---|---|---|---|---|---|
| 31 | Arc + sputter | 1000 | CrN | 1 | — | 2 | ○ | 2400 | 0.2 | 1.20E−06 | 8.00E−07 |
| 32 | Arc + sputter | 250 | CrN | 10 | $B_{0.45}C_{0.1}N_{0.45}$ | 2 | ○ | 2850 | 0.19 | 1.00E−06 | 5.00E−07 |
| 33 | Arc + sputter | 58 | CrN | 50 | $B_{0.45}C_{0.1}N_{0.45}$ | 2 | ○ | 2800 | 0.2 | 1.70E−06 | 4.00E−07 |
| 34 | Arc + sputter | 29 | CrN | 100 | $B_{0.45}C_{0.1}N_{0.45}$ | 2 | ○ | 2700 | 0.25 | 3.00E−06 | 4.00E−07 |
| 35 | Arc + sputter | 17 | CrN | 170 | $B_{0.45}C_{0.1}N_{0.45}$ | 2 | ○ | 2500 | 0.3 | 7.00E−06 | 4.00E−07 |
| 36 | Arc + sputter | 10 | CrN | 300 | $B_{0.45}C_{0.1}N_{0.45}$ | 2 | x | 2200 | 0.55 | 1.70E−05 | 4.50E−07 |

TABLE 9

| Test No. | Film-forming method | No. of layers (A + B) | Layer A Composition | Layer A Film thickness (nm) | Layer B Composition | Layer B Film thickness (nm) | Film hardness (HV, 25 gf) | Friction coefficient (-) | Ball wear rate (mm3/(N·m)) | Film wear rate (mm3/(N·m)) |
|---|---|---|---|---|---|---|---|---|---|---|
| 41 | Sputter | 94 | $Cr(B_{0.05}N_{0.95})$ | 30 | $B_{0.45}C_{0.1}N_{0.45}$ | 2 | 2850 | 0.2 | 1.20E−06 | 4.00E−07 |
| 42 | Sputter | 94 | $Cr(B_{0.1}N_{0.9})$ | 30 | $B_{0.45}C_{0.1}N_{0.45}$ | 2 | 2900 | 0.19 | 1.00E−06 | 3.00E−07 |
| 43 | Sputter | 94 | $Cr(B_{0.2}N_{0.8})$ | 30 | $B_{0.45}C_{0.1}N_{0.45}$ | 2 | 2400 | 0.2 | 1.70E−06 | 7.00E−07 |
| 44 | Sputter | 94 | $Cr(C_{0.1}N_{0.9})$ | 30 | $B_{0.45}C_{0.1}N_{0.45}$ | 2 | 2800 | 0.22 | 2.00E−06 | 4.00E−07 |
| 45 | Sputter | 94 | $Cr(C_{0.5}N_{0.75})$ | 30 | $B_{0.45}C_{0.1}N_{0.45}$ | 2 | 2750 | 0.21 | 4.00E−06 | 4.00E−07 |
| 46 | Sputter | 94 | $Cr(C_{0.4}N_{0.6})$ | 30 | $B_{0.45}C_{0.1}N_{0.45}$ | 2 | 2300 | 0.2 | 6.00E−06 | 8.00E−07 |
| 47 | Sputter | 94 | $Cr(N_{0.95}O_{0.05})$ | 30 | $B_{0.45}C_{0.1}N_{0.45}$ | 2 | 2700 | 0.22 | 2.00E−06 | 4.00E−07 |
| 48 | Sputter | 94 | $Cr(N_{0.85}O_{0.15})$ | 30 | $B_{0.45}C_{0.1}N_{0.45}$ | 2 | 2300 | 0.35 | 1.00E−05 | 9.00E−07 |
| 49 | Sputter | 94 | CrN | 30 | $B_{0.5}N_{0.5}$ | 2 | 2700 | 0.22 | 2.00E−06 | 4.00E−07 |
| 50 | Sputter | 94 | CrN | 30 | $B_{0.45}C_{0.1}N_{0.45}$ | 2 | 2850 | 0.21 | 1.00E−06 | 4.00E−07 |
| 51 | Sputter | 94 | CrN | 30 | $B_{0.35}C_{0.3}N_{0.35}$ | 2 | 2400 | 0.2 | 9.00E−06 | 8.00E−07 |
| 52 | Arc + sputter | 94 | CrN | 30 | $B_{0.6}C_{0.1}N_{0.3}$ | 2 | 2300 | 0.5 | 8.50E−06 | 7.00E−07 |
| 53 | Arc + sputter | 94 | CrN | 30 | $B_{0.5}C_{0.1}N_{0.4}$ | 2 | 2850 | 0.21 | 3.00E−06 | 4.00E−07 |
| 54 | Arc + sputter | 94 | CrN | 30 | $B_{0.45}C_{0.1}N_{0.45}$ | 2 | 2850 | 0.2 | 2.00E−06 | 4.00E−07 |

TABLE 10

| Test No. | Film-forming method | No. of layers (A + B) | Layer A Composition | Layer A Film thickness (nm) | Layer B Composition | Layer B Film thickness (-) | Film hardness (HV, 25 gf) | Friction coefficient (-) | Ball wear rate (mm$^3$/(N·m)) | Film wear rate (mm$^3$/(N·m)) |
|---|---|---|---|---|---|---|---|---|---|---|
| 61 | Arc + sputter | 94 | $(Cr_{0.3}Al_{0.7})N$ | 30 | $B_{0.45}C_{0.1}N_{0.45}$ | 2 | 2900 | 0.25 | 4.00E−06 | 4.00E−07 |
| 62 | Arc + sputter | 94 | $(Cr_{0.9}Si_{0.1})N$ | 30 | $B_{0.45}C_{0.1}N_{0.45}$ | 2 | 2900 | 0.23 | 4.00E−06 | 4.00E−07 |
| 63 | Arc + sputter | 94 | $(Cr_{0.5}W_{0.5})N$ | 30 | $B_{0.45}C_{0.1}N_{0.45}$ | 2 | 2850 | 0.21 | 3.00E−06 | 5.50E−07 |
| 64 | Arc + sputter | 94 | $(Cr_{0.5}T_{0.5})N$ | 30 | $B_{0.45}C_{0.1}N_{0.45}$ | 2 | 2900 | 0.26 | 4.50E−06 | 3.00E−07 |
| 65 | Arc + sputter | 94 | $(Cr_{0.2}Al_{0.7}Si_{0.1})N$ | 30 | $B_{0.45}C_{0.1}N_{0.45}$ | 2 | 2950 | 0.25 | 5.00E−06 | 2.50E−07 |
| 66 | Arc + sputter | 94 | $(Ti_{0.2}Cr_{0.1}Al_{0.70})N$ | 30 | $B_{0.45}C_{0.1}N_{0.45}$ | 2 | 3100 | 0.3 | 6.00E−06 | 2.00E−07 |
| 67 | Arc + sputter | 94 | $(Cr_{0.4}W_{0.5}Si_{0.1})N$ | 30 | $B_{0.45}C_{0.1}N_{0.45}$ | 2 | 2850 | 0.33 | 3.50E−06 | 4.00E−07 |
| 68 | Arc + sputter | 94 | $(Ti_{0.4}Cr_{0.4}Si_{0.2})N$ | 30 | $B_{0.45}C_{0.1}N_{0.45}$ | 2 | 3000 | 0.23 | 5.50E−05 | 2.50E−07 |
| 69 | Arc + sputter | 94 | CrN | 30 | $Si_{0.43}N_{0.57}$ | 2 | 2950 | 0.4 | 6.00E−06 | 1.00E−07 |
| 70 | Arc + sputter | 94 | CrN | 30 | $Si_{0.4}C_{0.05}N_{0.55}$ | 2 | 2900 | 0.35 | 5.00E−06 | 1.00E−07 |
| 71 | Arc + sputter | 94 | CrN | 30 | $Si_{0.36}C_{0.15}N_{0.49}$ | 2 | 2800 | 0.35 | 9.00E−06 | 1.00E−07 |
| 72 | Arc + sputter | 94 | CrN | 30 | $Si_{0.3}C_{0.3}N_{0.4}$ | 2 | 2300 | 0.33 | 8.50E−06 | 6.00E−07 |
| 73 | Sputter | 94 | CrN | 30 | C | 2 | 2800 | 0.21 | 1.00E−06 | 4.00E−07 |
| 74 | Sputter | 94 | CrN | 30 | $C_{0.95}N_{0.05}$ | 2 | 2750 | 0.2 | 2.00E−06 | 4.00E−07 |
| 75 | Sputter | 94 | CrN | 30 | $C_{0.7}N_{0.3}$ | 2 | 2700 | 0.19 | 2.50E−06 | 5.00E−07 |
| 76 | Sputter | 94 | CrN | 30 | $C_{0.3}N_{0.7}$ | 2 | 2300 | 0.19 | 6.00E−06 | 1.00E−06 |

TABLE 11

| | | | | Layer A | | Layer B | | |
| --- | --- | --- | --- | --- | --- | --- | --- | --- |
| No. | Classification | Film-forming method | No. of layers A + B | Composition | Film thickness (nm) | Composition | Film thickness (nm) | Film properties Hardness (Hv0.25) |
| 1 | Comp. Ex. | Arc | 1 | (Ti0.45, Al0.55)N | 3000 | — | — | 2700 |
| 2 | Comp. Ex. | Arc | 1 | (Ti0.5, Al0.45, Si0.05)N | 3000 | — | — | 2900 |
| 3 | Comp. Ex. | Arc | 1 | (Ti0.25, Al0.65, Cr0.1)N | 3000 | — | — | 3000 |
| 4 | Comp. Ex. | Arc | 1 | (Ti0.1, Al0.7, V0.2)N | 3000 | — | — | 3000 |
| 5 | Comp. Ex. | Arc | 1 | (Ti0.25, Al0.5, Nb0.25)N | 3000 | — | — | 2800 |
| 6 | Comp. Ex. | Sputter | 99 | (Ti0.45, Al0.55)N | 30 | B0.45, C0.1, N0.45 | 0.2 | 2800 |
| 7 | Example | Sputter | 94 | (Ti0.45, Al0.55)N | 30 | B0.45, C0.1, N0.45 | 2 | 3250 |
| 8 | Example | Sputter | 86 | (Ti0.45, Al0.55)N | 30 | B0.45, C0.1, N0.45 | 5 | 3300 |
| 9 | Example | Sputter | 75 | (Ti0.45, Al0.55)N | 30 | B0.45, C0.1, N0.45 | 10 | 3100 |
| 10 | Comp. Ex. | Sputter | 50 | (Ti0.45, Al0.55)N | 30 | B0.45, C0.1, N0.45 | 30 | 2600 |
| 11 | Comp. Ex. | Arc + sputter | 99 | (Ti0.25, Al0.65, Cr0.1)N | 30 | Si0.4, C0.05, N0.55 | 0.2 | 3000 |
| 12 | Example | Arc + sputter | 94 | (Ti0.25, Al0.65, Cr0.1)N | 30 | Si0.4, C0.05, N0.55 | 2 | 3300 |
| 13 | Example | Arc + sputter | 86 | (Ti0.25, Al0.65, Cr0.1)N | 30 | Si0.4, C0.05, N0.55 | 5 | 3400 |
| 14 | Example | Arc + sputter | 75 | (Ti0.25, Al0.65, Cr0.1)N | 30 | Si0.4, C0.05, N0.55 | 10 | 3250 |
| 15 | Comp. Ex. | Arc + sputter | 50 | (Ti0.25, Al0.65, Cr0.1)N | 30 | Si0.4, C0.05, N0.55 | 30 | 2900 |
| 16 | Comp. Ex. | Sputter | 750 | (Ti0.1, Al0.7, V0.2)N | 2 | C0.7, N0.3 | 2 | 2900 |
| 17 | Example | Sputter | 429 | (Ti0.1, Al0.7, V0.2)N | 5 | C0.7, N0.3 | 2 | 3300 |
| 18 | Example | Sputter | 94 | (Ti0.1, Al0.7, V0.2)N | 30 | C0.7, N0.3 | 2 | 3400 |
| 19 | Example | Sputter | 29 | (Ti0.1, Al0.7, V0.2)N | 100 | C0.7, N0.3 | 2 | 3250 |
| 20 | Comp. Ex. | Sputter | 12 | (Ti0.1, Al0.7, V0.2)N | 250 | C0.7, N0.3 | 2 | 3000 |
| 21 | Comp. Ex. | Arc + sputter | 750 | (Ti0.25, Al0.5, Nb0.25)N | 2 | Cu | 2 | 2800 |
| 22 | Example | Arc + sputter | 429 | (Ti0.25, Al0.5, Nb0.25)N | 5 | Cu | 2 | 3000 |
| 23 | Example | Arc + sputter | 94 | (Ti0.25, Al0.5, Nb0.25)N | 30 | Cu | 2 | 3100 |
| 24 | Example | Arc + sputter | 29 | (Ti0.25, Al0.5, Nb0.25)N | 100 | Cu | 2 | 2970 |
| 25 | Comp. Ex. | Arc + sputter | 12 | (Ti0.25, Al0.5, Nb0.25)N | 250 | Cu | 2 | 2950 |

TABLE 12

| | | | | Layer A | | Layer B | | |
| --- | --- | --- | --- | --- | --- | --- | --- | --- |
| No. | Classification | Film-forming method | No. of layers A + B | Composition | Film thickness (nm) | Composition | Film thickness (nm) | Film properties Hardness (Hv0.25) |
| 1 | Comp. Ex. | Arc | 1 | (Ti0.45, Al0.55)N | 3000 | — | — | 2700 |
| 2 | Comp. Ex. | Arc | 1 | (Ti0.5, Al0.45, Si0.05)N | 3000 | — | — | 2900 |
| 3 | Comp. Ex. | Arc | 1 | (Ti0.25, Al0.65, Cr0.1)N | 3000 | — | — | 3000 |
| 4 | Comp. Ex. | Arc | 1 | (Ti0.1, Al0.7, V0.2)N | 3000 | — | — | 3000 |
| 5 | Comp. Ex. | Arc | 1 | (Ti0.25, Al0.5, Nb0.25)N | 3000 | — | — | 2800 |
| 6 | Comp. Ex. | Arc | 91 | TiN | 3000 | — | — | 2300 |
| 7 | Comp. Ex. | Arc + sputter | 91 | TiN | | 30 | B0.45, C0.1, N0.45 | 3 | 2500 |
| 8 | Comp. Ex. | Arc + sputter | 91 | (Ti0.8, Al0.2)N | 30 | B0.45, C0.1, N0.45 | 3 | 2800 |
| 9 | Example | Arc + sputter | 91 | (Ti0.5, Al0.5)N | 30 | B0.45, C0.1, N0.45 | 3 | 3250 |
| 10 | Example | Arc + sputter | 91 | (Ti0.34, Al0.66)N | 30 | B0.45, C0.1, N0.45 | 3 | 3400 |
| 11 | Comp. Ex. | Arc + sputter | 91 | (Ti0.15, Al0.85)N | 30 | B0.45, C0.1, N0.45 | 3 | 2700 |
| 12 | Example | Arc + sputter | 91 | (Ti0.45, Al0.55)N | 30 | B0.45, C0.1, N0.45 | 3 | 3300 |
| 13 | Example | Arc + sputter | 91 | (Ti0.25, Al0.65, Cr0.1)N | 30 | Si0.4, C0.05, N0.55 | 3 | 3400 |
| 14 | Example | Arc + sputter | 91 | (Ti0.25, Al0.55, Cr0.3)N | 30 | Si0.4, C0.05, N0.55 | 3 | 3300 |
| 15 | Example | Arc + sputter | 91 | (Ti0.05, Al0.45, Cr0.5)N | 30 | Si0.4, C0.05, N0.55 | 3 | 3250 |
| 16 | Comp. Ex. | Arc + sputter | 91 | (Ti0.05, Al0.25, Cr0.7)N | 30 | Si0.4, C0.05, N0.55 | 3 | 2800 |
| 17 | Example | Arc + sputter | 91 | (Ti0.5, Al0.45, Si0.05)N | 30 | C0.7, N0.3 | 3 | 3200 |

TABLE 12-continued

| | | | Hard laminated film conditions | | | | |
|---|---|---|---|---|---|---|---|
| | | | Layer A | | Layer B | | |
| No. | Classification | Film-forming method | No. of layers A + B | Composition | Film thickness (nm) | Composition | Film thickness (nm) | Film properties Hardness (Hv0.25) |
| 18 | Example | Arc + sputter | 91 | (Ti0.35, Al0.6, Si0.15)N | 30 | C0.7, N0.3 | 3 | 3100 |
| 19 | Example | Arc + sputter | 91 | (Ti0.25, Al0.55, Zr0.3)N | 30 | Si0.4, C0.05, N0.55 | 3 | 3200 |
| 20 | Example | Arc + sputter | 91 | (Ti0.25, Al0.55, Nb0.3)N | 30 | Si0.4, C0.05, N0.55 | 3 | 3100 |
| 21 | Example | Arc + sputter | 91 | (Ti0.25, Al0.55, Ta0.3)N | 30 | Si0.4, C0.05, N0.55 | 3 | 3150 |
| 22 | Example | Arc + sputter | 91 | (Ti0.25, Al0.55, V0.3)N | 30 | Si0.4; C0.05, N0.55 | 3 | 3200 |
| 23 | Example | Arc + sputter | 91 | (Ti0.45, Al0.55) (B0.05, N0.95) | 30 | B0.45, C0.1, N0.45 | 3 | 3350 |
| 24 | Example | Arc + sputter | 91 | (Ti0.45, Al0.55) (B0.1, N0.9) | 30 | B0.45, C0.1, N0.45 | 3 | 3250 |
| 25 | Comp. Ex. | Arc + sputter | 91 | (Ti0.45, Al0.55) (B0.2, N0.8) | 30 | B0.45, C0.1, N0.45 | 3 | 2950 |
| 26 | Example | Arc + sputter | 91 | (Ti0.25, Al0.65, Cr0.1) (C0.1, N0.9) | 30 | B0.45, C0.1, N0.45 | 3 | 3350 |
| 27 | Example | Arc + sputter | 91 | (Ti0.25, Al0.65, Cr0.1) (C0.25, N0.75) | 30 | B0.45, C0.1, N0.45 | 3 | 3300 |
| 28 | Comp. Ex. | Arc + sputter | 91 | (Ti0.25, Al0.65, Cr0.1) (C0.4, N0.6) | 30 | B0.45, C0.1, N0.45 | 3 | 2950 |
| 29 | Example | Arc + sputter | 91 | (Ti0.1, Al0.7, V0.2) (N0.95, O0.05) | 30 | B0.45, C0.1, N0.45 | 3 | 3350 |
| 30 | Comp. Ex. | Arc + sputter | 91 | (Ti0.1, Al0.7, V0.2) (N0.85, O0.15) | 30 | B0.45, C0.1, 0.45 | 3 | 2900 |

TABLE 13

| | | | Hard laminated film conditions | | | | | | |
|---|---|---|---|---|---|---|---|---|---|
| | | | Layer A | | Layer B | | Film properties | | |
| No. | Classification | Film-forming method | No. of layers A + B | Composition | Film thickness (nm) | Composition | Film thickness (nm) | Hardness (Hv0.25) | Friction coefficient (μ) | Oxidation start temperature (° C.) |
| 1 | Comp. Ex. | Arc | 1 | (Ti0.45, Al0.55)N | 3000 | — | — | 2700 | 0.6 | 800 |
| 2 | Comp. Ex. | Arc | 1 | (Ti0.5, Al0.45, Si0.05)N | 3000 | — | — | 2900 | 0.65 | 850 |
| 3 | Comp. Ex. | Arc | 1 | (Ti0.25, Al0.65, Cr0.1)N | 3000 | — | — | 3000 | 0.55 | 950 |
| 4 | Comp. Ex. | Arc | 1 | (Ti0.1, Al0.7, V0.2)N | 3000 | — | — | 3000 | 0.55 | 700 |
| 5 | Comp. Ex. | Arc | 1 | (Ti0.25, Al0.5, Nb0.25)N | 3000 | — | — | 2800 | 0.6 | 850 |
| 6 | Comp. Ex. | Arc | 91 | TiN | 3000 | — | — | 2300 | 0.65 | 550 |
| 7 | Example | Arc + sputter | 91 | (Ti0.45, Al0.55)N | 30 | B0.5, N0.5 | 3 | 3150 | 0.2 | 820 |
| 8 | Example | Arc + sputter | 91 | (Ti0.45, Al0.55)N | 30 | B0.4, C0.05, N0.45 | 3 | 3100 | 0.2 | 820 |
| 9 | Example | Arc + sputter | 91 | (Ti0.45, Al0.55)N | 30 | B0.45, C0.05, N0.45 | 3 | 3300 | 0.2 | 820 |
| 10 | Example | Arc + sputter | 91 | (Ti0.45, Al0.55)N | 30 | B0.4, C0.2, N0.4 | 3 | 3250 | 0.25 | 820 |
| 11 | Comp. Ex. | Arc + sputter | 91 | (Ti0.45, Al0.55)N | 30 | B0.35, C0.3, N0.35 | 3 | 2900 | 0.3 | 800 |
| 12 | Example | Arc + sputter | 91 | (Ti0.25, Al0.65, Cr0.1)N | 30 | B0.45, C0.1, N0.45 | 3 | 3300 | 0.25 | 980 |
| 13 | Example | Arc + sputter | 91 | (Ti0.25, Al0.65, Cr0.1)N | 30 | B0.5, C0.1, N0.4 | 3 | 3250 | 0.25 | 980 |
| 14 | Comp. Ex. | Arc + sputter | 91 | (Ti0.25, Al0.65, Cr0.1)N | 30 | B0.55, C0.1, N0.35 | 3 | 3250 | 0.3 | 980 |
| 15 | Comp. Ex. | Arc + sputter | 91 | (Ti0.25, Al0.65, Cr0.1)N | 30 | B0.6, C0.1, N0.3 | 3 | 3200 | 0.45 | 980 |
| 16 | Example | Arc + sputter | 91 | (Ti0.25, Al0.65, Cr0.1)N | 30 | Si0.45, N0.55 | 3 | 3300 | 0.55 | 1100 |
| 17 | Example | Arc + sputter | 91 | (Ti0.25, Al0.65, Cr0.1)N | 30 | Si0.42, C0.05, N0.53 | 3 | 3350 | 0.53 | 1050 |
| 18 | Example | Arc + sputter | 91 | (Ti0.25, Al0.65, Cr0.1)N | 30 | Si0.4, C0.1, N0.5 | 3 | 3250 | 0.5 | 1000 |
| 19 | Example | Arc + sputter | 91 | (Ti0.25, Al0.65, Cr0.1)N | 30 | Si0.38, C0.2, N0.42 | 3 | 3250 | 0.45 | 1000 |
| 20 | Comp. Ex. | Arc + sputter | 91 | (Ti0.25, Al0.65, Cr0.1)N | 30 | Si0.33, C0.3, N0.47 | 3 | 2950 | 0.45 | 950 |

TABLE 14

Continued from Table 13)

| | | | Hard laminated film conditions | | | | | | |
|---|---|---|---|---|---|---|---|---|---|
| | | | Layer A | | Layer B | | Film properties | | |
| No. | Classification | Film-forming method | No. of layers A + B | Composition | Film thickness (nm) | Composition | Film thickness (nm) | Hardness (Hv0.25) | Friction coefficient (μ) | Oxidation start temperature (° C.) |
| 21 | Example | Arc + sputter | 91 | (Ti0.45, Al0.55)N | 30 | Si0.6, C0.1, N0.3 | 3 | 2900 | 0.5 | 900 |
| 22 | Example | Arc + sputter | 91 | (Ti0.45, Al0.55)N | 30 | Si0.5, C0.1, N0.4 | 3 | 3250 | 0.45 | 950 |
| 23 | Example | Arc + sputter | 91 | (Ti0.45, Al0.55)N | 30 | Si0.4, C0.1, N0.5 | 3 | 3300 | 0.5 | 950 |
| 24 | Comp. Ex. | Arc + sputter | 91 | (Ti0.45, Al0.55)N | 30 | Si0.25, C0.1, N0.65 | 3 | 2900 | 0.52 | 930 |
| 25 | Example | Arc + sputter | 91 | (Ti0.1, Al0.7, V0.2)N | 30 | Cu | 3 | 3200 | 0.55 | 750 |
| 26 | Example | Arc + sputter | 91 | (Ti0.1, Al0.7, V0.2)N | 30 | Cu0.8(C0.1, N0.9)0.2 | 3 | 3200 | 0.55 | 750 |

TABLE 14-continued (Continued from Table 13)

Hard laminated film conditions

| | | | Layer A | | Layer B | | Film properties | | |
|---|---|---|---|---|---|---|---|---|---|
| No. | Classification | Film-forming method | No. of layers A + B | Composition | Film thickness (nm) | Composition | Film thickness (nm) | Hardness (Hv0.25) | Friction coefficient (μ) | Oxidation start temperature (° C.) |
| 27 | Example | Arc + sputter | 91 | (Ti0.1, Al0.7, V0.2)N | 30 | Cu0.8(C0.25, N0.9)0.2 | 3 | 3150 | 0.55 | 700 |
| 28 | Example | Arc + sputter | 91 | (Ti0.1, Al0.7, V0.2)N | 30 | Cu0.65(C0.1, N0.9)0.35 | 3 | 3150 | 0.55 | 750 |
| 29 | Comp. Ex. | Arc + sputter | 91 | (Ti0.1, Al0.7, V0.2)N | 30 | Cu0.65(C0.1, N0.9)0.65 | 3 | 2950 | 0.55 | 700 |
| 30 | Example | Arc + sputter | 91 | (Ti0.45, Al0.55)N | 30 | C | 3 | 3150 | 0.23 | 800 |
| 31 | Example | Arc + sputter | 91 | (Ti0.45, Al0.55)N | 30 | C0.9, N0.1 | 3 | 3200 | 0.25 | 800 |
| 32 | Example | Arc + sputter | 91 | (Ti0.45, Al0.55)N | 30 | C0.65, N0.35 | 3 | 3100 | 0.27 | 800 |
| 33 | Example | Arc + sputter | 91 | (Ti0.45, Al0.55)N | 30 | C0.5, N0.5 | 3 | 3150 | 0.3 | 800 |
| 34 | Comp. Ex. | Arc + sputter | 91 | (Ti0.45, Al0.55)N | 30 | C0.35, N0.65 | 3 | 2900 | 0.5 | 750 |

TABLE 15

Hard laminated film conditions

| | | | Layer A | | Layer B | | Film properties |
|---|---|---|---|---|---|---|---|
| No. | Classification | Film-forming method | No. of layers A + B | Composition | Film thickness (nm) | Composition | Film thickness (nm) | Hardness (Hv0.25) |
| 1 | Comp. Ex. | Arc | 1 | (Ti0.45, Al0.55)N | 3000 | — | — | 2700 |
| 2 | Comp. Ex. | Arc | 1 | (Ti0.5, Al0.45, Si0.05)N | 3000 | — | — | 2900 |
| 3 | Comp. Ex. | Arc | 1 | (Ti0.25, Al0.65, Cr0.1)N | 3000 | — | — | 3000 |
| 4 | Comp. Ex. | Arc | 1 | (Ti0.1, Al0.7, V0.2)N | 3000 | — | — | 3000 |
| 5 | Comp. Ex. | Arc | 1 | (Ti0.25, Al0.5, Nb0.25)N | 3000 | — | — | 2800 |
| 6 | Comp. Ex. | Arc | 1 | CrN | 30 | — | — | 1800 |
| 7 | Comp. Ex. | Sputter | 99 | (Ti0.45, Al0.55)N | 30 | WN | 0.2 | 2700 |
| 8 | Example | Sputter | 94 | (Ti0.45, Al0.55)N | 30 | WN | 2 | 3200 |
| 9 | Example | Sputter | 86 | (Ti0.45, Al0.55)N | 30 | WN | 5 | 3150 |
| 10 | Example | Sputter | 75 | (Ti0.45, Al0.55)N | 30 | WN | 10 | 3000 |
| 11 | Comp. Ex. | Sputter | 50 | (Ti0.45, Al0.55)N | 30 | WN | 30 | 2600 |
| 12 | Comp. Ex. | Arc + sputter | 99 | (Ti0.25, Al0.65, Cr0.1)N | 30 | MoN | 0.2 | 3000 |
| 13 | Example | Arc + sputter | 94 | (Ti0.25, Al0.65, Cr0.1)N | 30 | MoN | 2 | 3250 |
| 14 | Example | Arc + sputter | 86 | (Ti0.25, Al0.65, Cr0.1)N | 30 | MoN | 5 | 3250 |
| 15 | Example | Arc + sputter | 75 | (Ti0.25, Al0.65, Cr0.1)N | 30 | MoN | 10 | 3100 |
| 16 | Comp. Ex. | Arc + sputter | 50 | (Ti0.25, Al0.65, Cr0.1)N | 30 | MoN | 30 | 2900 |
| 17 | Comp. Ex. | Sputter | 750 | (Ti0.1, Al0.7, V0.2)N | 2 | NbN | 2 | 2800 |
| 18 | Example | Sputter | 429 | (Ti0.1, Al0.7, V0.2)N | 5 | NbN | 2 | 3300 |
| 19 | Example | Sputter | 94 | (Ti0.1, Al0.7, V0.2)N | 30 | NbN | 2 | 3350 |
| 20 | Example | Sputter | 29 | (Ti0.1, Al0.7, V0.2)N | 100 | NbN | 2 | 3150 |
| 21 | Comp. Ex. | Sputter | 12 | (Ti0.1, Al0.7, V0.2)N | 250 | NbN | 2 | 3000 |
| 22 | Example | Arc + sputter | 750 | CrN | 2 | VN | 2 | 1850 |
| 23 | Example | Arc + sputter | 429 | CrN | 5 | VN | 2 | 2400 |
| 24 | Example | Arc + sputter | 94 | CrN | 30 | VN | 2 | 2500 |
| 25 | Example | Arc + sputter | 29 | CrN | 100 | VN | 2 | 2400 |
| 26 | Comp. Ex. | Arc + sputter | 12 | CrN | 250 | VN | 2 | 2000 |

TABLE 16

Hard laminated film conditions

| | | | Layer A | | Layer B | | Film properties |
|---|---|---|---|---|---|---|---|
| No. | Classification | Film-forming method | No. of layers A + B | Composition | Film thickness (nm) | Composition | Film thickness (nm) | Hardness (Hv0.25) |
| 1 | Comp. Ex. | Arc | 1 | (Ti0.45, Al0.55)N | 3000 | — | — | 2700 |
| 2 | Comp. Ex. | Arc | 1 | (Ti0.5, Al0.45, Si0.05)N | 3000 | — | — | 2900 |
| 3 | Comp. Ex. | Arc | 1 | (Ti0.25, Al0.65, Cr0.1)N | 3000 | — | — | 3000 |
| 4 | Comp. Ex. | Arc | 1 | (Ti0.1, Al0.7, V0.2)N | 3000 | — | — | 3000 |
| 5 | Comp. Ex. | Arc | 1 | (Ti0.25, Al0.5, Nb0.25)N | 3000 | — | — | 2800 |

TABLE 16-continued

Hard laminated film conditions

| No. | Classification | Film-forming method | No. of layers A + B | Layer A Composition | Layer A Film thickness (nm) | Layer B Composition | Layer B Film thickness (nm) | Film properties Hardness (Hv0.25) |
|---|---|---|---|---|---|---|---|---|
| 6 | Comp. Ex. | Arc | 1 | TiN | 3000 | — | — | 2300 |
| 7 | Comp. Ex. | Arc | 1 | CrN | 3000 | — | — | 1800 |
| 8 | Comp. Ex. | Arc + sputter | 94 | TiN | 30 | WN | 2 | 2550 |
| 9 | Comp. Ex. | Arc + sputter | 94 | (Ti0.8, Al0.2)N | 30 | WN | 2 | 2700 |
| 10 | Example | Arc + sputter | 94 | (Ti0.5, Al0.5)N | 30 | WN | 2 | 3150 |
| 11 | Example | Arc + sputter | 94 | (Ti0.45, Al0.55)N | 30 | WN | 2 | 3200 |
| 12 | Example | Arc + sputter | 94 | (Ti0.34, Al0.66)N | 30 | WN | 2 | 3250 |
| 13 | Comp. Ex. | Arc + sputter | 94 | (Ti0.15, Al0.85)N | 30 | WN | 2 | 2600 |
| 14 | Example | Arc + sputter | 94 | (Ti0.25, Al0.65, Cr0.1)N | 30 | NbN | 2 | 3250 |
| 15 | Example | Arc + sputter | 94 | (Ti0.05, Al0.55, Cr0.3)N | 30 | NbN | 2 | 3150 |
| 16 | Example | Arc + sputter | 94 | (Ti0.05, Al0.45, Cr0.5)N | 30 | NbN | 2 | 3150 |
| 17 | Comp. Ex. | Arc + sputter | 94 | (Ti0.05, Al0.25, Cr0.7)N | 30 | NbN | 2 | 2800 |
| 18 | Example | Arc + sputter | 94 | (Ti0.5, Al0.45, Si0.05)N | 30 | MoN | 2 | 3250 |
| 19 | Example | Arc + sputter | 94 | (Ti0.4, Al0.45, Si0.15)N | 30 | MoN | 2 | 3100 |
| 20 | Example | Arc + sputter | 94 | (Ti0.25, Al0.55, Zr0.3)N | 30 | MoN | 2 | 3200 |
| 21 | Example | Arc + sputter | 94 | (Ti0.25, Al0.55, Nb0.3)N | 30 | MoN | 2 | 3150 |
| 22 | Example | Arc + sputter | 94 | (Ti0.25, Al0.55, Ta0.3)N | 30 | MoN | 2 | 3100 |
| 23 | Example | Arc + sputter | 94 | (Ti0.25, Al0.55, V0.3)N | 30 | MoN | 2 | 3250 |

TABLE 17

(Continued from Table 16)

Hard laminated film conditions

| No. | Classification | Film-forming method | No. of layers A + B | Layer A Composition | Layer A Film thickness (nm) | Layer B Composition | Layer B Film thickness (nm) | Film properties Hardness (Hv0.25) |
|---|---|---|---|---|---|---|---|---|
| 24 | Example | Arc + sputter | 94 | (Ti0.45, Al0.55) (B0.05, N0.95) | 30 | Mo0.5Nb0.5N | 2 | 3250 |
| 25 | Example | Arc + sputter | 94 | (Ti0.45, Al0.55) (B0.1, N0.9) | 30 | Mo0.5Nb0.5N | 2 | 3100 |
| 26 | Comp. Ex. | Arc + sputter | 94 | (Ti0.45, Al0.55) (B0.2, N0.8) | 30 | Mo0.5Nb0.5N | 2 | 2950 |
| 27 | Example | Arc + sputter | 94 | (Ti0.25, Al0.65, Cr0.1) (C0.1, N0.9) | 30 | Mo0.5Nb0.5N | 2 | 3250 |
| 28 | Example | Arc + sputter | 94 | (Ti0.25, Al0.65, Cr0.1) (C0.25, N0.75) | 30 | Mo0.5Nb0.5N | 2 | 3150 |
| 29 | Comp. Ex. | Arc + sputter | 94 | (Ti0.25, Al0.65, Cr0.1) (C0.4, N0.6) | 30 | Mo0.5Nb0.5N | 2 | 2950 |
| 30 | Example | Arc + sputter | 94 | (Ti0.1, Al0.7, V0.2) (N0.95, O0.05) | 30 | Mo0.5Nb0.5N | 2 | 3200 |
| 31 | Comp. Ex. | Arc + sputter | 94 | (Ti0.1, Al0.7, V0.2) (N0.85, O0.15) | 30 | Mo0.5Nb0.5N | 2 | 2900 |
| 32 | Example | Arc + sputter | 94 | (Cr0.95, Si0.05)N | 30 | VN | 2 | 2560 |
| 33 | Example | Arc + sputter | 94 | (Cr0.7, Si0.3)N | 30 | VN | 2 | 2600 |
| 34 | Example | Arc + sputter | 94 | (Cr0.4, Al0.6)N | 30 | WN | 2 | 3050 |
| 35 | Example | Arc + sputter | 94 | (Cr0.15, Al0.85)N | 30 | WN | 2 | 2900 |
| 36 | Example | Arc + sputter | 94 | Cr(B0.1, Al0.9)N | 30 | VN | 2 | 2650 |
| 37 | Example | Arc + sputter | 94 | (Cr0.95, Si0.05) (B0.05, N0.95) | 30 | WN | 2 | 2700 |

TABLE 18

Hard laminated film conditions

| No. | Classification | Film-forming method | No. of layers A + B | Layer A Composition | Layer A Film thickness (nm) | Layer B Composition | Layer B Film thickness (nm) | Film properties Hardness (Hv0.25) | Friction coefficient (μ) | Oxidation start temperature (° C.) |
|---|---|---|---|---|---|---|---|---|---|---|
| 1 | Comp. Ex. | Arc | 1 | (Ti0.45, Al0.55)N | 3000 | — | — | 2700 | 0.6 | 800 |
| 2 | Comp. Ex. | Arc | 1 | (Ti0.5, Al0.45, Si0.05)N | 3000 | — | — | 2900 | 0.65 | 850 |
| 3 | Comp. Ex. | Arc | 1 | (Ti0.25, Al0.65, Cr0.1)N | 3000 | — | — | 3000 | 0.55 | 950 |

TABLE 18-continued

| | | | Layer A | | | Layer B | | | Film properties | |
|---|---|---|---|---|---|---|---|---|---|---|
| | | | | | Film | | Film | | Friction | Oxidation |
| | | No. of | | | thick- | | thick- | | coeffi- | start |
| | Classifi- | Film-forming | layers | | ness | | ness | Hardness | cient | temperature |
| No. | cation | method | A + B | Composition | (nm) | Composition | (nm) | (Hv0.25) | (μ) | (° C.) |
| 4 | Comp. Ex. | Arc | 1 | (Ti0.1, Al0.7, V0.2)N | 3000 | — | — | 3000 | 0.55 | 700 |
| 5 | Comp. Ex. | Arc | 1 | (Ti0.25, Al0.5, Nb0.25)N | 3000 | — | — | 2800 | 0.6 | 850 |
| 6 | Comp. Ex. | Arc | 1 | TiN | 3000 | — | — | 2300 | 0.65 | 550 |
| 7 | Comp. Ex. | Arc | 1 | CrN | 3000 | — | — | 1800 | 0.5 | 700 |
| 8 | Example | Arc + sputter | 91 | (Ti0.45, Al0.55)N | 30 | WN | 3 | 3250 | 0.35 | 850 |
| 9 | Example | Arc + sputter | 91 | (Ti0.45, Al0.55)N | 30 | W(C0.05, N0.95) | 3 | 3200 | 0.33 | 830 |
| 10 | Example | Arc + sputter | 91 | (Ti0.45, Al0.55)N | 30 | W(C0.2, N0.8) | 3 | 3250 | 0.35 | 800 |
| 11 | Comp. Ex. | Arc + sputter | 91 | (Ti0.45, Al0.55)N | 30 | W(C0.5, N0.5) | 3 | 2800 | 0.33 | 790 |
| 12 | Example | Arc + sputter | 91 | (Ti0.25, Al0.65, Cr0.1)N | 30 | VN | 3 | 3250 | 0.25 | 800 |
| 13 | Example | Arc + sputter | 91 | (Ti0.25, Al0.65, Cr0.1)N | 30 | V(N0.95, O0.05) | 3 | 3150 | 0.25 | 900 |
| 14 | Comp. Ex. | Arc + sputter | 91 | (Ti0.25, Al0.65, Cr0.1)N | 30 | V(N0.8, O0.2) | 3 | 2950 | 0.25 | 750 |
| 15 | Example | Arc + sputter | 91 | (Ti0.25, Al0.65, Cr0.1)N | 30 | NbN | 3 | 3150 | 0.55 | 980 |
| 16 | Example | Arc + sputter | 91 | (Ti0.25, Al0.65, Cr0.1)N | 30 | Nb(B0.05, N0.95) | 3 | 3200 | 0.4 | 1050 |
| 17 | Example | Arc + sputter | 91 | (Ti0.25, Al0.65, Cr0.1)N | 30 | Nb(B0.2, N0.9) | 3 | 3200 | 0.35 | 1050 |
| 18 | Comp. Ex. | Arc + sputter | 91 | (Ti0.25, Al0.65, Cr0.1)N | 30 | Nb(B0.2, N0.8) | 3 | 2950 | 0.35 | 1050 |
| 19 | Example | Arc + sputter | 91 | (Ti0.25, Al0.65, Cr0.1)N | 30 | (W0.5, V0.5)N | 3 | 3250 | 0.35 | 900 |
| 20 | Comp. Ex. | Arc + sputter | 91 | (Ti0.25, Al0.65, Cr0.1)N | 30 | (Mo0.5, Nb0.5) (C0.1, N0.9) | 3 | 3300 | 0.45 | 1000 |
| 21 | Example | Arc + sputter | 91 | (Ti0.25, Al0.65, Cr0.1)N | 30 | (W0.75, Al0.25)N | 3 | 3350 | 0.45 | 1050 |
| 22 | Example | Arc + sputter | 91 | (Ti0.45, Al0.55)N | 30 | (Mo0.9, Si0.1)N | 3 | 3300 | 0.5 | 1050 |
| 23 | Example | Arc + sputter | 91 | (Ti0.45, Al0.55)N | 30 | (Ti0.5, V0.5)N | 3 | 3200 | 0.4 | 900 |
| 24 | Example | Arc + sputter | 91 | CrN | 30 | W(B0.1, N0.9) | 3 | 2600 | 0.3 | 750 |
| 25 | Example | Arc + sputter | 91 | CrN | 30 | (W0.9, Si0.1) (C0.1, N0.9) | 3 | 2700 | 0.32 | 770 |
| 26 | Example | Arc + sputter | 91 | (Cr0.95, Si0.1)N | 30 | V(C0.1, N0.9) | 3 | 2650 | 0.25 | 700 |
| 27 | Example | Arc + sputter | 91 | (Cr0.95, Si0.1)N | 30 | Mo(B0.05, C0.1, N0.85) | 3 | 2700 | 0.4 | 750 |
| 28 | Example | Arc + sputter | 91 | (Cr0.95, Si0.1)N | 30 | W(C0.15, N0.85) | 3 | 2650 | 0.35 | 770 |

What is claimed is:

1. A hard laminated film comprising a layer A and a layer B of specific compositions deposited alternately, wherein the crystal structure of layer A differs from the crystal structure of layer B, the thickness of layer A per layer is two or more times that of layer B per layer, the thickness of layer B per layer is 0.5 nm or more, and the thickness of layer A per layer is 200 nm or less, wherein said layer A and said layer B have the compositions shown below:

Layer A: $(Cr_{1-\alpha}X_\alpha)(B_aC_bN_{1-a-b-c}O_c)_e$ wherein, X is one, two or more elements selected from the group consisting of Ti, Zr, Hf, V, Nb, Ta, Mo, W, Al and Si, and $0 \leq \alpha \leq 0.9$, $0 \leq a \leq 0.15$, $0 \leq b \leq 0.3$, $0 \leq c \leq 0.1$, $0.2 \leq e \leq 1.1$ (α is the atomic ratio of X, and a, b, c are respectively the atomic ratios of B, C, O,).

Layer B: $B_{1-s-t}C_sN_t$ wherein, $0 \leq s \leq 0.25$, $(1-s-t)/t \leq 1.5$ (s, t are respectively the atomic ratios of C and N,).

or, $Si_{1-x-y}C_xN_y$ wherein, $0 < x \leq 0.25$, $0.5 \leq (1-x-y)/y \leq 1.4$ (x, y are respectively the atomic ratios of C and N).

or, $C_{1-u}N_u$ wherein $0 \leq u \leq 0.6$ (u is the atomic ratio of N).

2. The hard laminated film according to claim 1, wherein α is 0.

3. The hard laminated film according to claim 1, wherein α is 0.05 or more.

4. The hard laminated film according to claim 1, wherein at least one of the half-value widths of the diffraction lines from the (111) plane and the (200) plane observed by an X-ray diffraction pattern obtained by the θ-2θ method using the CuKα line, is 0.30° or more.

5. A hard laminated film comprising a layer A and a layer B of specific compositions deposited alternately, wherein the crystal structure of layer A differs from the crystal structure of layer B, the thickness of layer A per layer is two or more times that of layer B per layer, the thickness of layer B per layer is 0.5 nm or more, and the thickness of layer A per layer is 200 nm or less wherein:

said layer A has the composition of Formula 1:

$(Ti_{1-x-y}Al_xM_y)(B_aC_bN_{1-a-b-c}O_c)$ [wherein x, y, a, b, c are respectively atomic ratios, $0.4 \leq x \leq 0.8$, $0 \leq y \leq 0.6$, $0 \leq a \leq 0.15$, $0 \leq b \leq 0.3$, $0 \leq c \leq 0.1$, and M is one or more metal elements selected from the group consisting of 4A, 5A, 6A and Si, and said layer B has a composition selected from the group consisting of:

Formula 2: $B_{1-x-y}C_xN_y$ [wherein x, y are respectively atomic ratios, $0 \leq x \leq 0.25$ and $B/N \leq 1.5$], Formula 3: $Si_{1-x-y}C_xN_y$ [wherein x, y are respectively atomic ratios $0 \leq x \leq 0.25$ and $0.5 \leq Si/N \leq 2.0$], Formula 4: $C_{1-x}N_x$ [wherein, x is an atomic ratio and $0 \leq x \leq 0.6$], Formula 5: $Cu_{1-y}(C_xN_{1-x})_y$ [wherein x, y are respectively atomic ratios $0 \leq x \leq 0.1$ and $0 \leq y \leq 0.5$].

6. The hard laminated film according to claim 5, wherein said layer A has the composition $(Ti_{1-x-y}Al_xM_y)(B_aC_bN_{1-a-b-c}O_c)$, [wherein, x, y, a, b, c are respectively atomic ratios, $0.5 \leq x \leq 0.8$, $0.05 \leq y \leq 0.6$, $0 \leq a \leq 0.15$, $0 \leq b \leq 0.3$, $0 \leq c \leq 0.1$, and M is one or more metal elements selected from the group consisting of Cr, V, and Si.

7. A hard laminated film comprising a layer A and a layer B of specific compositions deposited alternately, wherein the crystal structure of layer A differs from the crystal structure of layer B, the thickness of layer A per layer is two or more times that of layer B per layer, the thickness of layer B per layer is 0.5 nm or more, and the thickness of layer A per layer is 200 nm or less, wherein the layer A and layer B having specific compositions are deposited alternately so that the compositions of adjacent layers differ, wherein:

layer A has a composition corresponding to one of the following formulae:

Formula 1: $(Ti_{1-x-y}Al_xM_y)(B_aC_bN_{1-a-b-c}O_c)$
[wherein, x, y, a, b, c are respectively atomic ratios, $0.4 \leq x \leq 0.8$, $0 \leq y \leq 0.6$, $0 \leq a \leq 0.15$, $0 \leq b \leq 0.3$, $0 \leq c \leq 0.1$, and M is one or more metal elements selected from the group consisting of 4A, 5A, 6A and Si, Formula 2: $Cr_{1-\alpha}X_\alpha)(B_aC_bN_{1-a-b-c}O_c)_e$
[wherein, $\alpha$, a, b, c, e are respectively atomic ratios $0 \leq \alpha \leq 0.9$, $0 \leq a \leq 0.15$, $0 \leq b \leq 0.3$, $0 \leq c \leq 0.1$, $0.2 \leq e \leq 1.1$, and X is one or more metal elements selected from the group consisting of Ti, Zr, Hf, V, Nb, Ta, Mo W, Al and Si, and layer B has the composition of the following Formula 3:

Formula 3: $M_{1-d}M1_d(B_aC_bN_{1-a-b-c}O_c)$
[wherein, M is one or more metal elements selected from the group consisting of W, Mo, V and Nb; M1 is one or more metal elements selected from the group consisting of 4A, 5A, 6A, and Si excluding W, Mo, V, and Nb;

a, b, c, d are respectively atomic ratios, and $0 \leq a \leq 0.15$, $0 \leq b \leq 0.3$, $0 \leq c \leq 0.1$, $0 \leq d \leq 0.3$].

8. The hard laminated film according to claim 7, wherein:

said layer A is represented by $(Ti_{1-x-y}Al_xM_y)(B_aC_bN_{1-a-b-c}O_c)$
[wherein, x, y, a, b, c are respectively atomic ratios $0.5 \leq x \leq 0.8$, $0.05 \leq y \leq 0.6$, $0 \leq a \leq 0.15$, $0 \leq b \leq 0.3$, $0 \leq c \leq 0.1$, and M is one or more metal elements selected from the group consisting of Cr, V, and Si].

9. The hard laminated film according to claim 7, wherein, in said layer B, d=0.

10. The hard laminated film according to claim 7, wherein, in said layer B, M is V.

* * * * *

UNITED STATES PATENT AND TRADEMARK OFFICE
CERTIFICATE OF CORRECTION

PATENT NO. : 7,258,912 B2
APPLICATION NO. : 11/045137
DATED : August 21, 2007
INVENTOR(S) : Yamamoto et al.

It is certified that error appears in the above-identified patent and that said Letters Patent is hereby corrected as shown below:

On the title page, Item (73), the Assignee should read:

-- (73) Assignee: Kabushiki Kaisha Kobe Seiko Sho (Kobe Steel, Ltd.), Kobe-shi (JP) --

Signed and Sealed this

Sixth Day of November, 2007

JON W. DUDAS
*Director of the United States Patent and Trademark Office*